(12) United States Patent
Miyake

(10) Patent No.: US 12,068,335 B2
(45) Date of Patent: Aug. 20, 2024

(54) LIGHT-EMITTING DEVICE

(71) Applicant: Semiconductor Energy Laboratory Co., Ltd., Atsugi (JP)

(72) Inventor: Hiroyuki Miyake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/138,816

(22) Filed: Apr. 25, 2023

(65) Prior Publication Data

US 2023/0261010 A1    Aug. 17, 2023

Related U.S. Application Data

(63) Continuation of application No. 16/657,243, filed on Oct. 18, 2019, now Pat. No. 11,664,391, which is a
(Continued)

(30) Foreign Application Priority Data

Dec. 12, 2013   (JP) ................................. 2013-257337
Dec. 1, 2014    (JP) ................................. 2014-242835

(51) Int. Cl.
  *H01L 27/12*        (2006.01)
  *G09G 3/3233*       (2016.01)
  (Continued)

(52) U.S. Cl.
  CPC ....... *H01L 27/1255* (2013.01); *G09G 3/3233* (2013.01); *H01L 27/1225* (2013.01);
  (Continued)

(58) Field of Classification Search
  CPC ............. H01L 27/1255; H01L 27/1225; H01L 29/7869; H01L 29/78648; G09G 3/3233; H10K 59/123
  See application file for complete search history.

(56) References Cited

U.S. PATENT DOCUMENTS 7,199,768 B2   4/2007   Ono et al.
7,317,429 B2   1/2008   Shirasaki et al.
(Continued)

FOREIGN PATENT DOCUMENTS

CN   103280182 A   9/2013
EP     1517290 A   3/2005
(Continued)

OTHER PUBLICATIONS

Taiwanese Office Action (Application No. 103143067) dated Sep. 5, 2018.

*Primary Examiner* — Dao H Nguyen
(74) *Attorney, Agent, or Firm* — Fish & Richardson P.C.

(57) ABSTRACT

To provide a light-emitting device in which variation in luminance among pixels caused by variation in threshold voltage of transistors can be suppressed. The light-emitting device includes a transistor including a first gate and a second gate overlapping with each other with a semiconductor film therebetween, a first capacitor maintaining a potential difference between one of a source and a drain of the transistor and the first gate, a second capacitor maintaining a potential difference between one of the source and the drain of the transistor and the second gate, a switch controlling conduction between the second gate of the transistor and a wiring, and a light-emitting element to which drain current of the transistor is supplied.

9 Claims, 46 Drawing Sheets

Related U.S. Application Data continuation of application No. 15/838,476, filed on Dec. 12, 2017, now Pat. No. 10,453,873, which is a continuation of application No. 14/567,388, filed on Dec. 11, 2014, now Pat. No. 9,853,068.

(51) Int. Cl.
  *H01L 29/786* (2006.01)
  *H10K 59/123* (2023.01)

(52) U.S. Cl.
  CPC .... *H01L 29/7869* (2013.01); *H01L 29/78648* (2013.01); *H10K 59/123* (2023.02)

(56) References Cited

U.S. PATENT DOCUMENTS

| | | | |
|---|---|---|---|
| 7,674,650 B2 | 3/2010 | Akimoto et al. | |
| 8,067,775 B2 | 11/2011 | Miyairi et al. | |
| 8,106,400 B2 | 1/2012 | Miyairi et al. | |
| 8,395,157 B2 | 3/2013 | Park et al. | |
| 8,659,519 B2 | 2/2014 | Abe et al. | |
| 8,823,610 B2 | 9/2014 | Miyazawa | |
| 8,853,016 B2 | 10/2014 | Park et al. | |
| 8,884,852 B2 | 11/2014 | Yamamoto et al. | |
| 8,957,889 B2 | 2/2015 | Miyake | |
| 8,975,709 B2 | 3/2015 | Miyake | |
| 9,117,409 B2 | 8/2015 | Koyama | |
| 9,305,988 B2 | 4/2016 | Miyake | |
| 9,508,709 B2 | 11/2016 | Miyake | |
| 10,032,798 B2 | 7/2018 | Miyake | |
| 2005/0030265 A1 | 2/2005 | Miyagawa | |
| 2005/0083270 A1 | 4/2005 | Miyazawa | |
| 2006/0244689 A1* | 11/2006 | Osame | G09G 3/3258 345/76 |
| 2007/0126664 A1* | 6/2007 | Kimura | H10K 59/131 345/76 |
| 2008/0225061 A1 | 9/2008 | Kimura et al. | |
| 2010/0032679 A1 | 2/2010 | Kawae et al. | |
| 2010/0053041 A1 | 3/2010 | Abe et al. | |
| 2010/0096654 A1 | 4/2010 | Godo | |
| 2010/0117072 A1 | 5/2010 | Ofuji et al. | |
| 2011/0031496 A1 | 2/2011 | Yamazaki et al. | |
| 2011/0031499 A1 | 2/2011 | Kimura et al. | |
| 2011/0057187 A1 | 3/2011 | Sakakura et al. | |
| 2011/0062434 A1 | 3/2011 | Eguchi et al. | |
| 2011/0084281 A1* | 4/2011 | Koyama | G09G 3/3266 257/E27.12 |
| 2011/0108837 A1 | 5/2011 | Yamazaki et al. | |
| 2011/0133181 A1 | 6/2011 | Yamazaki | |
| 2011/0175862 A1* | 7/2011 | Umezaki | G09G 3/3233 345/204 |
| 2011/0210324 A1 | 9/2011 | Sakakura et al. | |
| 2011/0210355 A1 | 9/2011 | Yamazaki et al. | |
| 2012/0007084 A1 | 1/2012 | Park et al. | |
| 2012/0248435 A1* | 10/2012 | Koyama | H01L 27/1255 257/43 |
| 2013/0063413 A1 | 3/2013 | Miyake | |
| 2013/0069068 A1 | 3/2013 | Miyake | |
| 2014/0168194 A1 | 6/2014 | Kong et al. | |
| 2015/0187276 A1 | 7/2015 | Shim et al. | |
| 2017/0287941 A1* | 10/2017 | Toya | H10K 59/1213 |

FOREIGN PATENT DOCUMENTS

| | | |
|---|---|---|
| EP | 2161706 | 3/2010 |
| JP | 2003-195810 A | 7/2003 |
| JP | 2003-224437 A | 8/2003 |
| JP | 2005-099773 A | 4/2005 |
| JP | 2009-063607 A | 3/2009 |
| JP | 2009-069571 A | 4/2009 |
| JP | 2010-060816 A | 3/2010 |
| JP | 2010-266494 A | 11/2010 |
| JP | 2010-286502 A | 12/2010 |
| JP | 2013-076994 A | 4/2013 |
| JP | 2013-077814 A | 4/2013 |
| JP | 2013-218311 A | 10/2013 |
| TW | 201011719 | 3/2010 |
| TW | 201212239 | 3/2012 |

* cited by examiner

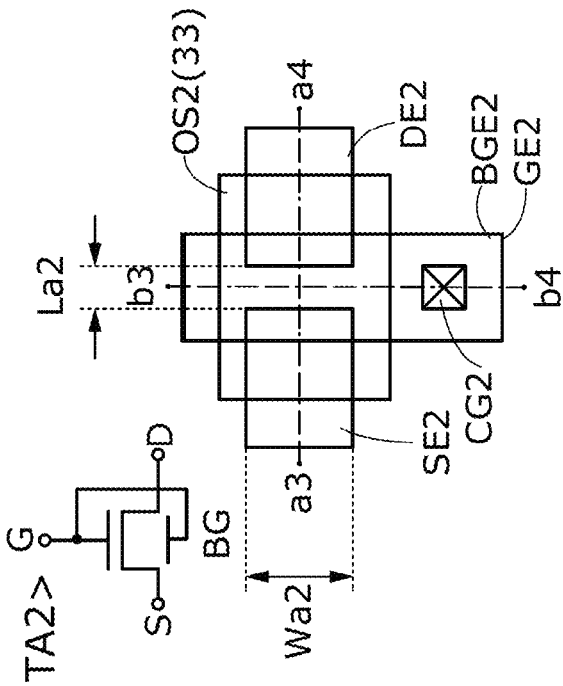
FIG. 27B <TA2>
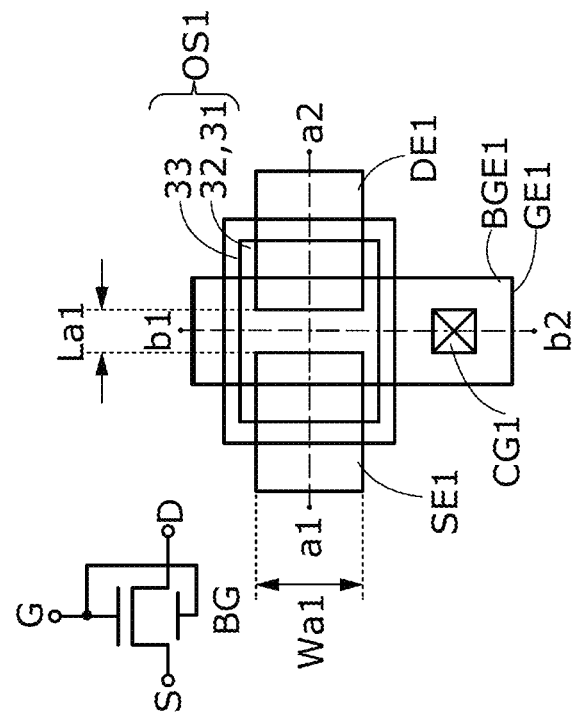
FIG. 27A <TA1>
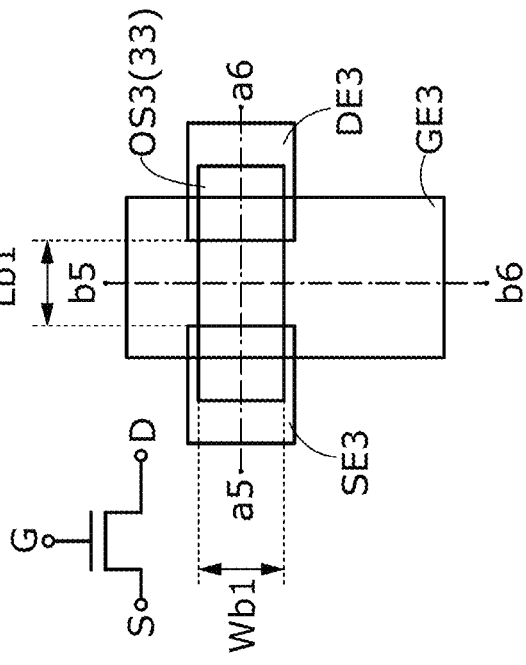
FIG. 27C <TB1>

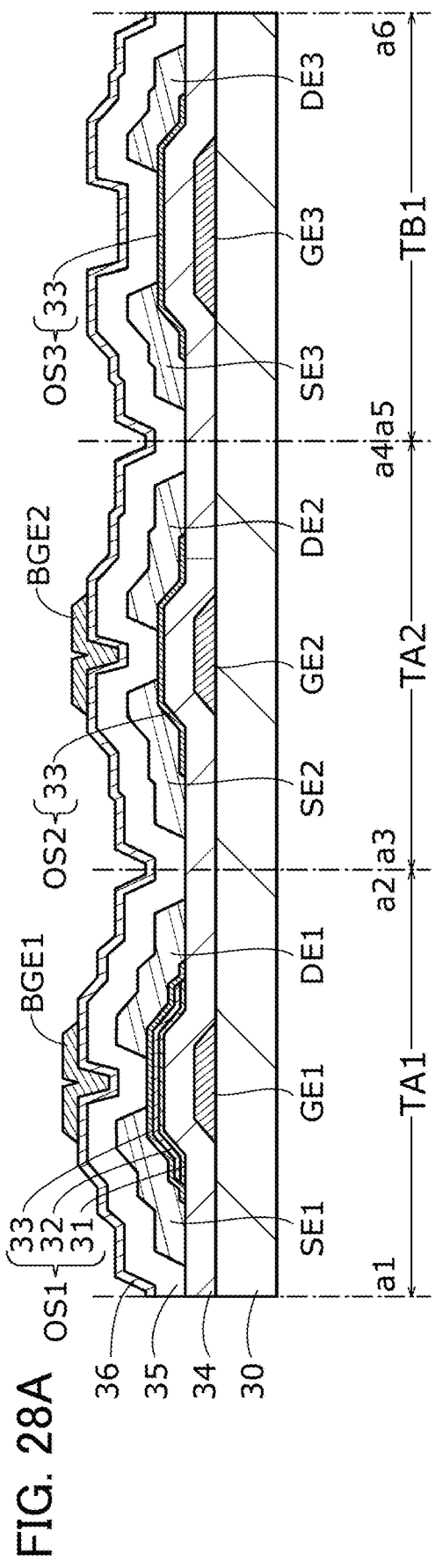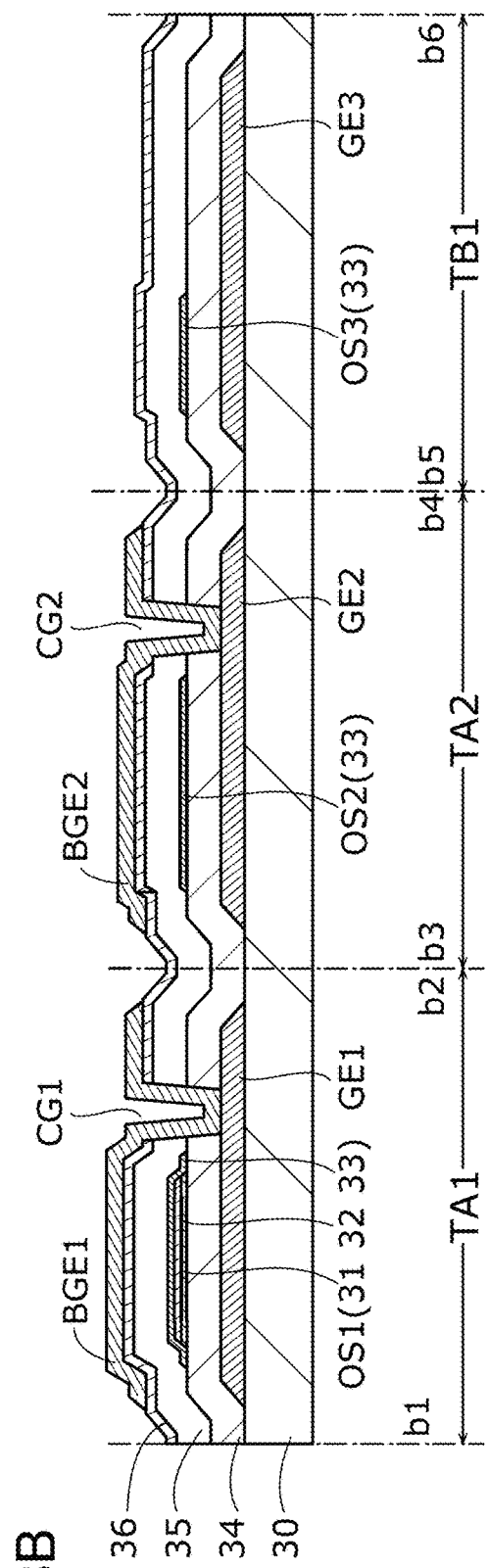

FIG. 31A <TC1>
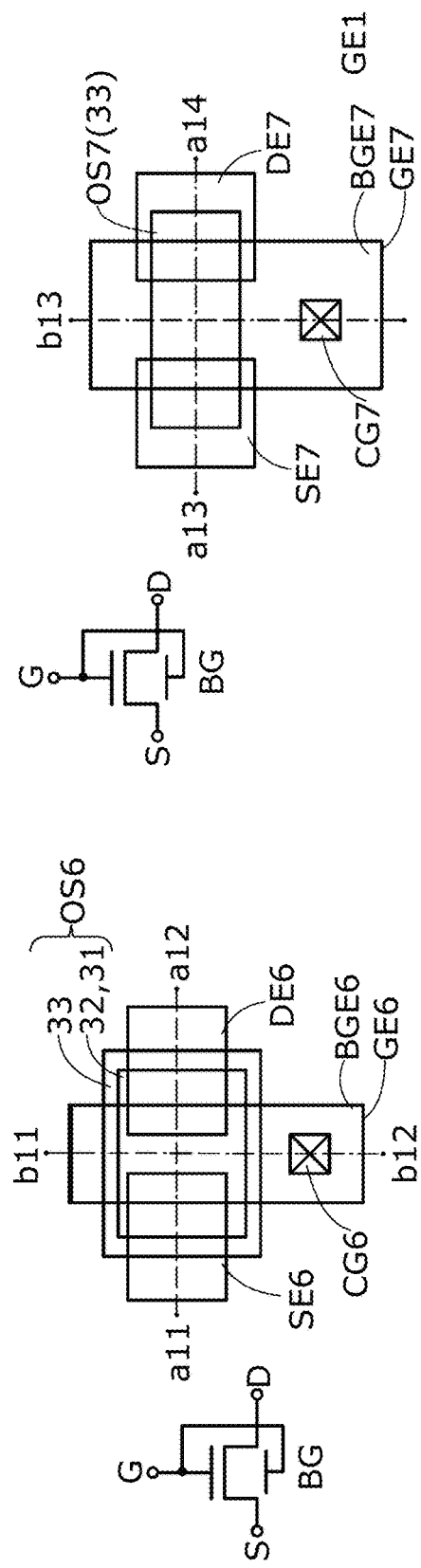
FIG. 31B <TB2>
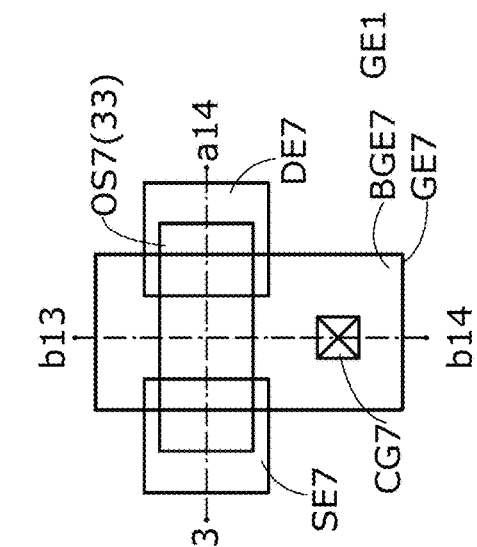
FIG. 31C <TD1>
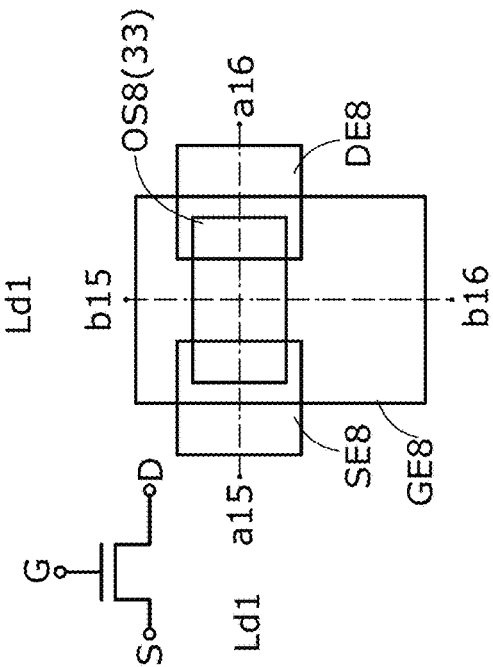

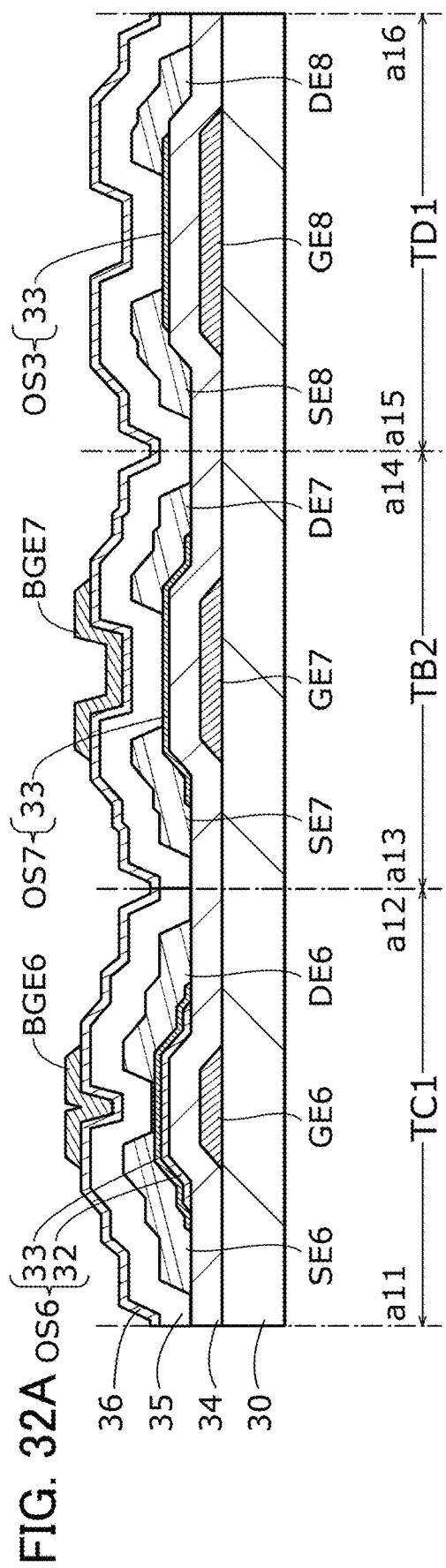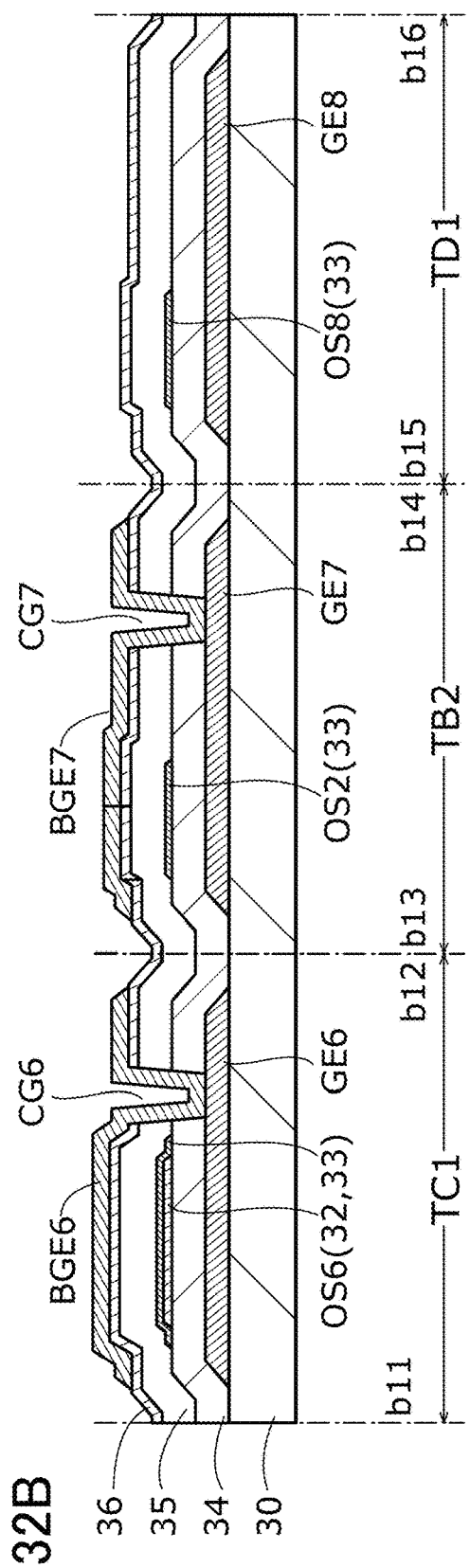

LIGHT-EMITTING DEVICE

CROSS-REFERENCE TO RELATED APPLICATIONS

This application is a continuation of U.S. application Ser. No. 16/657,243, filed Oct. 18, 2019, now allowed, which is a continuation of U.S. application Ser. No. 15/838,476, filed Dec. 12, 2017, now U.S. Pat. No. 10,453,873, which is a continuation of U.S. application Ser. No. 14/567,388, filed Dec. 11, 2014, now U.S. Pat. No. 9,853,068, which claims the benefit of foreign priority applications filed in Japan as Serial No. 2013-257337 on Dec. 12, 2013, and Serial No. 2014-242835 on Dec. 1, 2014, all of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a storage device, a data processing device, a driving method thereof, or a manufacturing method thereof. In particular, one embodiment of the present invention relates to a semiconductor device, a display device, a light-emitting device, a power storage device, a storage device, a driving method thereof, or a manufacturing method thereof.

2. Description of the Related Art

Suggested structures of active matrix display devices including light-emitting elements differ depending on manufacturers. In general, at least a light-emitting element, a transistor (a switching transistor) that controls input of video signals to pixels, and a transistor (a driving transistor) that controls the amount of current supplied to the light-emitting element are provided in each pixel.

When all the transistors in pixels have the same polarity, it is possible to omit some of steps for fabricating the transistors, for example, a step of adding an impurity element imparting one conductivity type to a semiconductor film. Patent Document 1 discloses a light-emitting element type display in which transistors included in pixels are all n-channel transistors.
[Patent Document]
[Patent Document 1] Japanese Published Patent Application No. 2003-195810

SUMMARY OF THE INVENTION

In a light-emitting device, drain current of a driving transistor is supplied to a light-emitting element; thus, when the threshold voltages of driving transistors vary among pixels, the luminances of light-emitting elements vary correspondingly. Therefore, in order to improve the image quality of a light-emitting device, it is an important object to propose a pixel structure in which a current value of a driving transistor can be corrected in anticipation of variation in threshold voltage.

In view of the foregoing technical background, an object of one embodiment of the present invention is to provide a light-emitting device in which variation in luminance of pixels caused by variation in threshold voltage of driving transistors is suppressed.

It is an object of one embodiment of the present invention to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a transistor including a first gate and a second gate overlapping with each other with a semiconductor film therebetween, a first capacitor maintaining a potential difference between one of a source and a drain of the transistor and the first gate, a second capacitor maintaining a potential difference between one of the source and the drain of the transistor and the second gate, a switch controlling conduction between the second gate of the transistor and a wiring, and a light-emitting element to which drain current of the transistor is supplied.

According to one embodiment of the present invention, a light-emitting device in which variation in luminance among pixels caused by variation in threshold voltage of transistors can be suppressed can be provided.

One embodiment of the present invention can provide a novel semiconductor device. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 27A to 27C are top views illustrating a transistor.

FIGS. 28A and 28B are cross-sectional views of a transistor.

FIGS. 31A to 31C are top views each illustrating the structure of a transistor.

FIGS. 32A and 32B are cross-sectional views of a transistor.

DETAILED DESCRIPTION OF THE INVENTION

Figure 1:
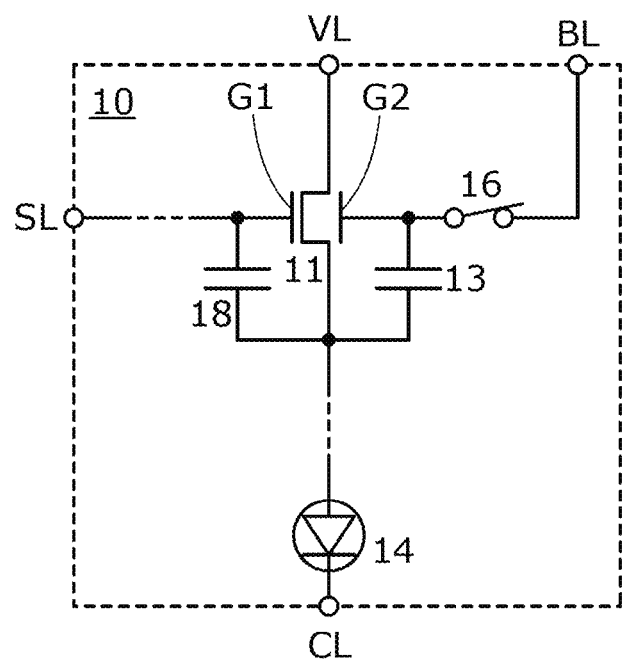
FIG. 1 illustrates a structure of a pixel.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that in this specification, a light-emitting device includes, in its category, a panel in which light-emitting elements are formed in respective pixels and a module in which an IC or the like including a driver circuit or a controller is mounted on the panel. Further, a light-emitting device according to one embodiment of the present invention includes, in its category, an element substrate corresponding to one mode before a light-emitting element is completed in a manufacturing process of the light-emitting device. In the element substrate, each of a plurality of pixels is provided with a transistor, and a pixel electrode to which voltage is applied through the transistor.

A "source" of a transistor means a source region that is part of a semiconductor film functioning as an active layer or a source electrode electrically connected to the semiconductor film. Similarly, a "drain" of a transistor means a drain region that is part of the semiconductor film or a drain electrode electrically connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

In this specification and the like, when it is explicitly described that X and Y are connected, the case where X and Y are electrically connected, the case where X and Y are functionally connected, and the case where X and Y are directly connected are included therein. Another element may thus be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

In the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. The switch also has a function of selecting and changing a current path. Note that the case where X and Y are electrically connected includes the case where X and Y are directly connected.

In the case where X and Y are functionally connected, for example, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

<Structure Example of Pixel>

FIG. 1 illustrates a structure example of a pixel 10 in a light-emitting device according to one embodiment of the present invention. The pixel 10 in FIG. 1 includes a transistor 11, a switch 16, a capacitor 13, a capacitor 18, and a light-emitting element 14.

Examples of the light-emitting element 14 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or plural layers provided between the anode and the cathode, at least one of which is a light-emitting layer containing a light-emitting substance. From the EL layer, electroluminescence is obtained by current supplied when a potential difference between the cathode and the anode is larger than or equal to the threshold voltage V the of the light-emitting element 14. As electroluminescence, there are luminescence (fluorescence) at the time of returning from a singlet-excited state to a ground state and luminescence (phosphorescence) at the time of returning from a triplet-excited state to a ground state.

One of the anode and the cathode of the light-emitting element 14 serves as a pixel electrode and the other serves as a common electrode. FIG. 1 illustrates a configuration of the pixel 10 in which the anode of the light-emitting element 14 is used as the pixel electrode and the cathode of the light-emitting element 14 is used as the common electrode.

The transistor 11 includes a normal gate (a first gate) and a second gate overlapping the first gate with a semiconductor film sandwiched therebetween. In FIG. 1, the first gate and the second gate are denoted by G1 and G2, respectively.

The potential of the first gate of the transistor 11 is controlled in accordance with an image signal supplied from a wiring SL. The switch 16 controls the supply of the potential of a wiring BL to the second gate of the transistor 11.

Note that the switch 16 includes one or more transistors. A capacitor may be included in addition to one or more transistors.

The capacitor 13 has a function of holding a potential difference between the second gate and one of a source and a drain of the transistor 11. The capacitor 18 has a function of holding a potential difference between the first gate and the one of the source and the drain of the transistor 11.

In FIG. 1, the transistor 11 is an n-channel transistor. One of a source and a drain of the transistor 11 is electrically connected to an anode of the light-emitting element 14, and the other of the source and the drain of the transistor 11 is electrically connected to a wiring VL. A cathode of the light-emitting element 14 is electrically connected to a wiring CL. The potential of the wiring VL is higher than the sum of the potential of the wiring CL, the threshold voltage V the of the light-emitting element 14, and the threshold voltage Vth of the transistor 11. Thus, when the value of the drain current of the transistor 11 is determined in response to an image signal, the drain current is supplied to the light-emitting element 14 and accordingly the light-emitting element 14 emits light.

Figure 35:
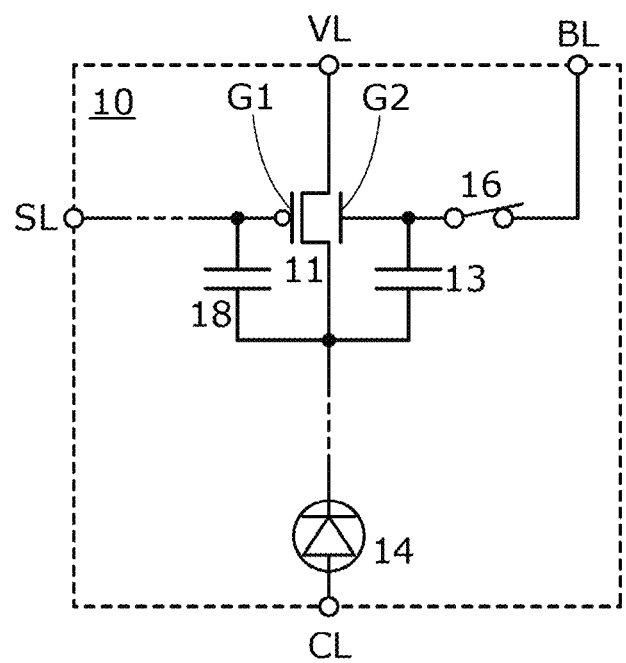
FIG. 35 illustrates a structure of a pixel.

In FIG. 35, the transistor 11 is a p-channel transistor. The one of the source and the drain of the transistor 11 is electrically connected to the cathode of the light-emitting element 14, and the other of the source and the drain of the transistor 11 is electrically connected to the wiring VL. The anode of the light-emitting element 14 is electrically connected to the wiring CL. The potential of the wiring CL is higher than the sum of the potential of the wiring VL, the threshold voltage V the of the light-emitting element 14, and the threshold voltage Vth of the transistor 11. As in the case where the transistor 11 is an n-channel transistor, when the value of the drain current of the p-channel transistor 11 is determined in response to an image signal, the drain current is supplied to the light-emitting element 14 and accordingly the light-emitting element 14 emits light.

In one embodiment of the present invention, before the value of the drain current of the transistor 11 is determined in accordance with an image signal, voltage Vbg between one of the source and the drain of the transistor 11 and the second gate is controlled to compensate the threshold voltage Vth of the transistor 11, whereby variation in threshold voltage Vth of the transistors 11 among the pixels 10 is suppressed.

Specifically, the potential of the wiring BL is supplied to the second gate of the transistor 11 via the switch 16, whereby the transistor 11 becomes normally-on. For example, in the case of the n-channel transistor 11, voltage Vbg is increased to shift threshold voltage Vth in a negative direction and thus the transistor 11 becomes normally-on. In the case of the p-channel transistor 11, voltage Vbg is decreased to shift threshold voltage Vth in a positive direction and thus the transistor 11 becomes normally-on.

Figure 9:
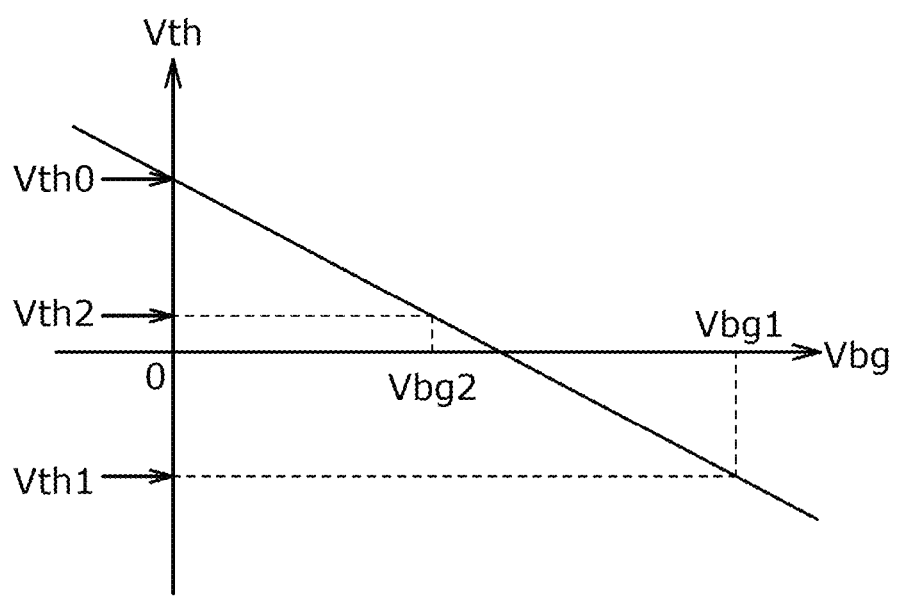
FIG. 9 shows the relationships between Vbg and Vth.

FIG. 9 shows relationships between voltage Vbg and threshold voltage Vth of the n-channel transistor 11. The threshold voltage Vth of the transistor 11 when voltage Vbg is zero is represented by Vth0. The voltage Vbg shifts in a positive direction from zero to be Vbg1, and the threshold voltage Vth accordingly shifts in a negative direction from Vth0 to be Vth1 (Vth1<0).

In a state where the transistor 11 is normally-on, gate voltage Vgs, which is the potential difference between the first gate and one of the source and the drain of the transistor 11, is maintained constant, and the drain current of the transistor 11 flows into the second gate of the transistor 11 and the capacitor 13.

With this structure, electric charge held in the second gate of the transistor 11 and the capacitor 13 is transferred and the potential of the one of the source and the drain of the transistor 11 shifts accordingly. Because voltage Vbg changes in accordance with the potential shift of the one of the source and the drain of the transistor 11, the threshold voltage of the transistor 11 shifts and becomes normally-off. The threshold voltage Vth of the n-channel transistor 11 shifts in a positive direction because voltage Vbg shifts in a negative direction, whereas the threshold voltage Vth of the p-channel transistor 11 shifts in a negative direction because voltage Vbg shifts in a positive direction.

When the threshold voltage Vth of the transistor 11 closely approaches gate voltage Vgs which is maintained constant, the drain current finally converges to zero and the transistor 11 is turned off. The threshold voltage Vth of the transistor 11 at this time is represented by Vth2. As in FIG. 9, when voltage Vbg becomes Vbg2, the drain current of the transistor 11 whose gate voltage Vgs is maintained constant converges to zero, so that the potential difference ΔV0 is maintained in the capacitor 13.

With the above structure in one embodiment of the present invention, variation in threshold voltage among transistors 11 in pixels 10 can be prevented from influencing the value of the drain current of the transistor 11. Variation in luminance among pixels can be thus suppressed.

The pixel 10 shown in FIG. 1 is configured to compensate the threshold voltage Vth of the transistor 11 by controlling voltage Vbg between one of the source and the drain and the second gate of the transistor 11. Note that the pixel may be configured to compensate the threshold voltage Vth of the transistor 11 by controlling voltage Vgs between one of the source and the drain of the transistor 11 and the first gate.

Figure 33:
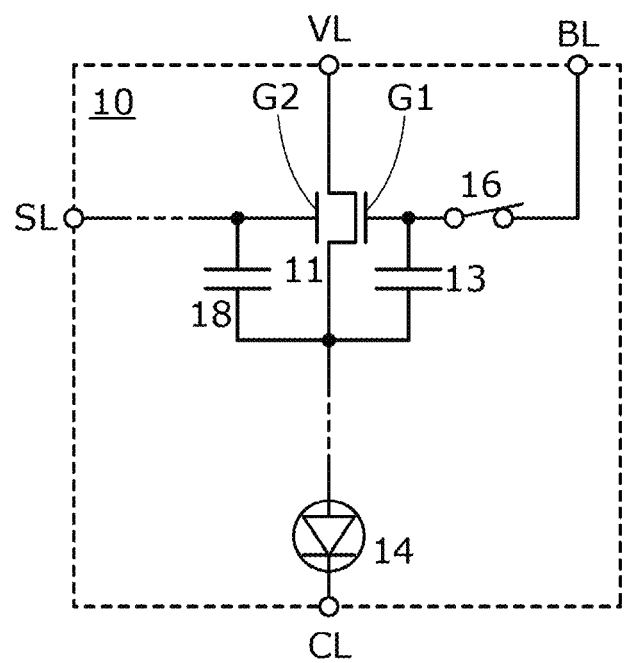
FIG. 33 shows a pixel structure.

FIG. 33 shows the pixel 10 configured to compensate the threshold voltage Vth of the transistor 11 by controlling voltage Vgs. In the pixel 10 in FIG. 33, the potential of the second gate of the transistor 11 is controlled by an image signal supplied from the wiring SL. The switch 16 controls the supply of the potential of a wiring BL to the first gate of the transistor 11. The capacitor 13 has a function of holding a potential difference between the first gate and the one of the source and the drain of the transistor 11. The capacitor 18 has a function of holding a potential difference between the second gate and the one of the source and the drain of the transistor 11. With the above structure in one embodiment of the present invention, before the value of the drain current of the transistor 11 is determined in accordance with an image signal, voltage Vgs between one of the source and the drain of the transistor 11 and the first gate is controlled to compensate the threshold voltage Vth of the transistor 11, whereby variation in threshold voltage Vth of the transistors 11 among the pixels 10 is suppressed.

<Structure Example 1 of Pixel>

Figure 2A:
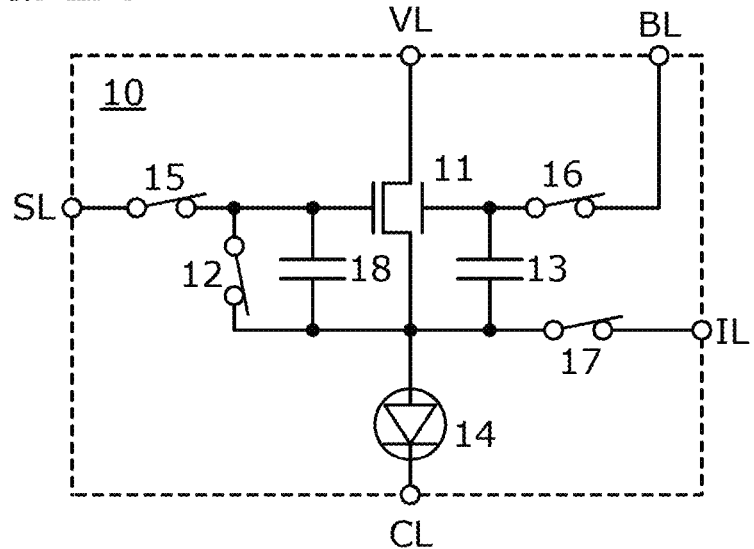
FIGS. 2A and 2B illustrate a structure of a pixel.

FIG. 2A is a structure example of the pixel 10 shown in FIG. 1.

The pixel 10 shown in FIG. 2A includes the transistor 11, the switch 12, the capacitor 13, the light-emitting element 14, the switches 15, 16, and 17, and the capacitor 18.

Specifically, in the pixel 10 shown in FIG. 2A, the wiring SL is electrically connected to the first gate of the transistor 11 via the switch 15. The wiring SL is electrically connected to a pixel electrode included in the light-emitting element 14 via the switches 15 and 12. One of the source and the drain of the transistor 11 is electrically connected to the pixel electrode of the light-emitting element 14, and the other of the source and the drain is electrically connected to the wiring VL. The second gate of the transistor 11 is electrically connected to the wiring BL through the switch 16. The pixel electrode of the light-emitting element 14 is electrically connected to a wiring IL via the switch 17. One of a pair of electrodes of the capacitor 13 is electrically connected to the second gate of the transistor 11, and the other electrode is electrically connected to the pixel electrode of the light-emitting element 14. One of a pair of electrodes of the capacitor 18 is electrically connected to the first gate of the transistor 11, and the other electrode is electrically connected to the pixel electrode of the light-emitting element 14. A common electrode of the light-emitting element 14 is electrically connected to the wiring CL.

Figure 2B:
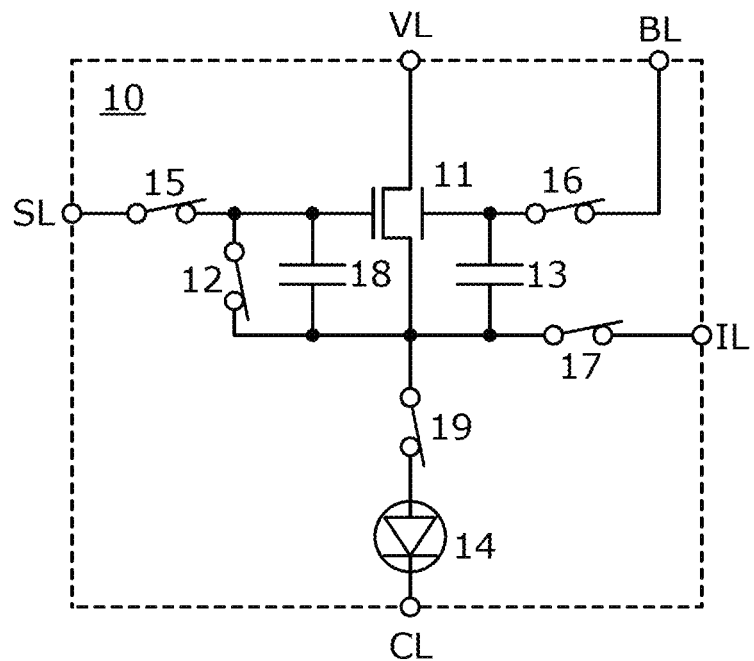

FIG. 2B is another structure example of the pixel 10 shown in FIG. 1.

The pixel 10 in FIG. 2B further includes a switch 19 unlike the pixel 10 in FIG. 2A.

Specifically, in the pixel 10 shown in FIG. 2B, the wiring SL is electrically connected to the first gate of the transistor 11 via the switch 15. The wiring SL is electrically connected to a pixel electrode included in the light-emitting element 14 via the switches 15, 12, and 19. One of the source and the drain of the transistor 11 is electrically connected to the pixel electrode of the light-emitting element 14 through the switch 19, and the other of the source and the drain is electrically connected to the wiring VL. The second gate of the transistor 11 is electrically connected to the wiring BL through the switch 16. The pixel electrode of the light-emitting element 14 is electrically connected to a wiring IL via the switch 17. One of a pair of electrodes of the capacitor 13 is electrically connected to the second gate of the transistor 11, and the other electrode is electrically connected to the pixel electrode of the light-emitting element 14 through the switch 19. One of a pair of electrodes of the capacitor 18 is electrically connected to the first gate of the transistor 11, and the other electrode is electrically connected to the pixel electrode of the light-emitting element 14 through the switch 19. A common electrode of the light-emitting element 14 is electrically connected to the wiring CL.

Figure 3A:
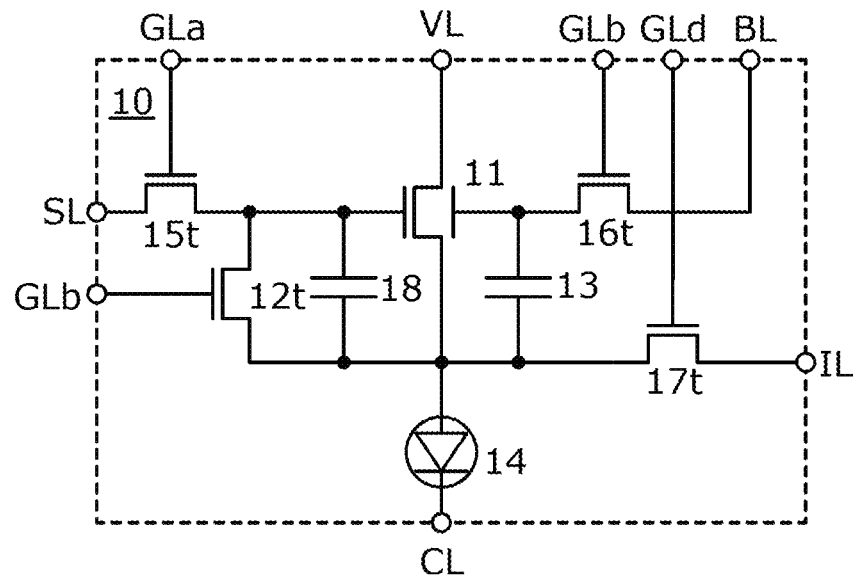
FIGS. 3A and 3B illustrate a structure of a pixel.

Next, a structure example of the pixel 10 in FIG. 2A using transistors as the switches is described. FIG. 3A shows a structure of the pixel 10 in FIG. 2A in which transistors are used as the switches 12, 15, 16, and 17.

The pixel 10 in FIG. 3A includes the transistor 11; a transistor 12t as the switch 12; transistors 15t, 16t, and 17t as the switches 15, 16, and 17, respectively; the capacitors 13 and 18; and the light-emitting element 14.

A gate of the transistor 15t is electrically connected to a wiring GLa, one of a source and a drain of the transistor 15t is electrically connected to the wiring SL, and the other of the source and the drain is electrically connected to the first gate of the transistor 11. A gate of the transistor 12t is electrically connected to a wiring GLb, one of a source and a drain of the transistor 12t is electrically connected to the light-emitting element 14, and the other of the source and the drain is electrically connected to the first gate of the transistor 11. One of the source and the drain of the transistor 11 is electrically connected the pixel electrode of the light-emitting element 14, and the other thereof is electrically connected to the wiring VL. A gate of the transistor 16t is electrically connected to a wiring GLb, one of a source and a drain of the transistor 16t is electrically connected to the wiring BL, and the other of the source and the drain is electrically connected to the second gate of the transistor 11. A gate of the transistor 17t is electrically connected to a wiring GLd, one of a source and a drain of the transistor 17t is electrically connected to the wiring IL, and the other of the source and the drain is electrically connected to the pixel electrode of the light-emitting element 14.

One of a pair of electrodes of the capacitor 13 is electrically connected to the second gate of the transistor 11, and the other electrode is electrically connected to the pixel electrode of the light-emitting element 14. One of a pair of electrodes of the capacitor 18 is electrically connected to the first gate of the transistor 11, and the other electrode is electrically connected to the pixel electrode of the light-emitting element 14. A common electrode of the light-emitting element 14 is electrically connected to the wiring CL.

Figure 3B:
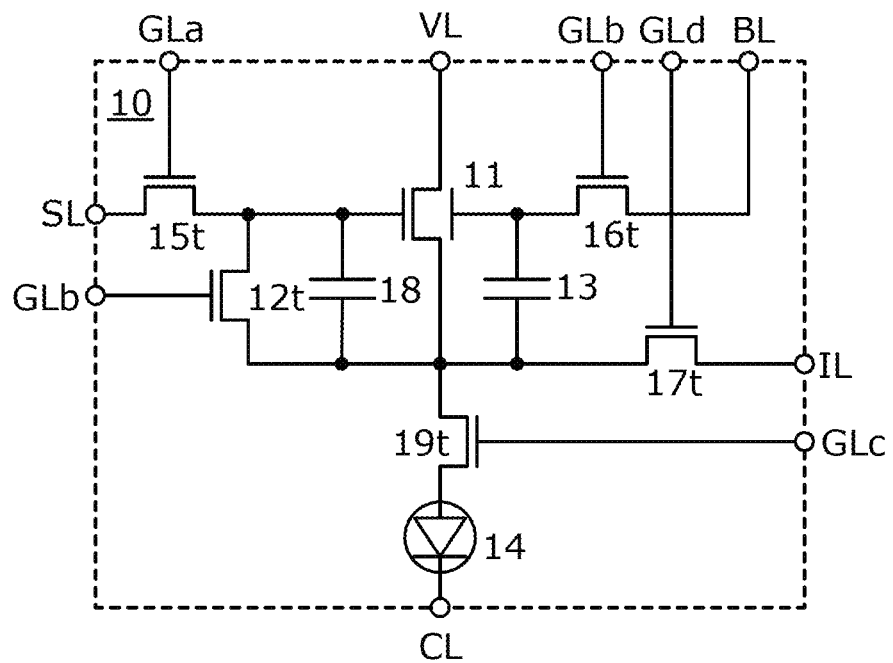

Next, a structure example of the pixel 10 in FIG. 2B using transistors as the switches is described. FIG. 3B shows a structure of the pixel 10 in which transistors are used as the switches 12, 15, 16, 17, and 19.

The pixel 10 in FIG. 3B includes the transistor 11; the transistor 12t as the switch 12; the transistors 15t, 16t, and 17t as the switches 15, 16, and 17, respectively; a transistor 19t serving as the switch 19; the capacitors 13 and 18; and the light-emitting element 14.

The gate of the transistor 15t is electrically connected to the wiring GLa, the one of the source and the drain of the transistor 15t is electrically connected to the wiring SL, and the other of the source and the drain is electrically connected to the first gate of the transistor 11. The gate of the transistor 12t is electrically connected to the wiring GLb, one of a source and a drain of the transistor 12t is electrically connected to one of a source and a drain of the transistor 19t, and the other of the source and the drain is electrically connected to the first gate of the transistor 11. The one of the source and the drain of the transistor 11 is electrically connected the other of the source and the drain of the transistor 19t, and the other thereof is electrically connected to the wiring VL. The gate of the transistor 16t is electrically connected to the wiring GLb, the one of the source and the drain of the transistor 16t is electrically connected to the wiring BL, and the other of the source and the drain is electrically connected to the second gate of the transistor 11. A gate of the transistor 17t is electrically connected to the wiring GLd, the one of the source and the drain of the transistor 17t is electrically connected to the wiring IL, and the other of the source and the drain is electrically connected to one of the source and the drain of the transistor 19t. A gate of the transistor 19t is electrically connected to a wiring GLc, and the other of the source and the drain is electrically connected to the pixel electrode of the light-emitting element 14.

The one of the pair of electrodes of the capacitor 13 is electrically connected to the second gate of the transistor 11, and the other electrode is electrically connected to the one of the source and the drain of the transistor 19t. The one of the pair of electrodes of the capacitor 18 is electrically connected to the first gate of the transistor 11, and the other electrode is electrically connected to the other of the source and the drain of the transistor 19t. The common electrode of the light-emitting element 14 is electrically connected to the wiring CL.

Figure 4A:
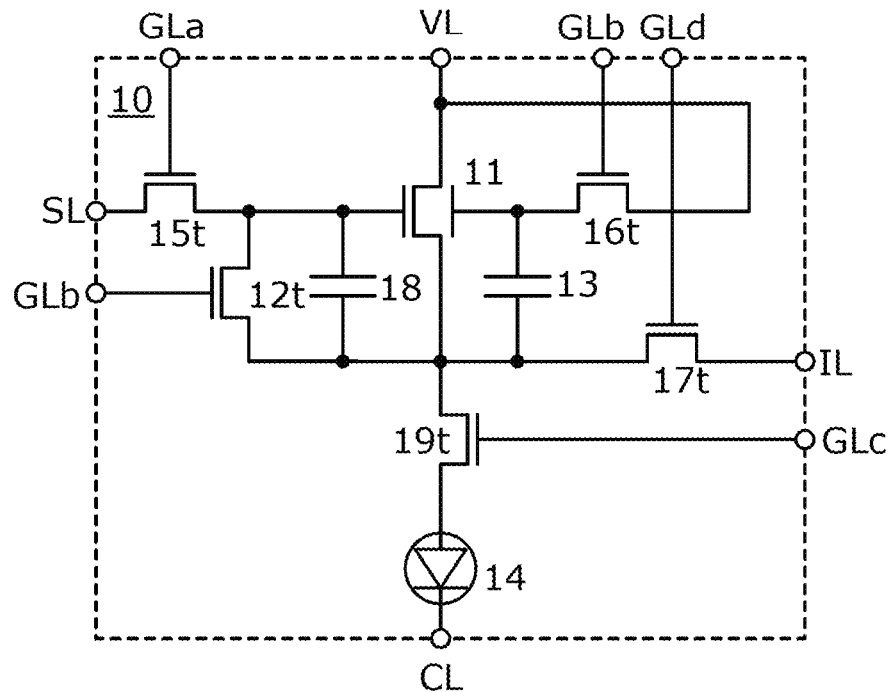
FIGS. 4A and 4B illustrate a structure of a pixel.

FIG. 4A shows another structure of the pixel 10 in FIG. 2B in which transistors are used as the switches 12, 15, 16, and 17.

The pixel 10 in FIG. 4A is different from the pixel 10 in FIG. 3B in that one of the source and the drain of the transistor 16t is electrically connected to not the wiring BL but the wiring VL.

Figure 4B:
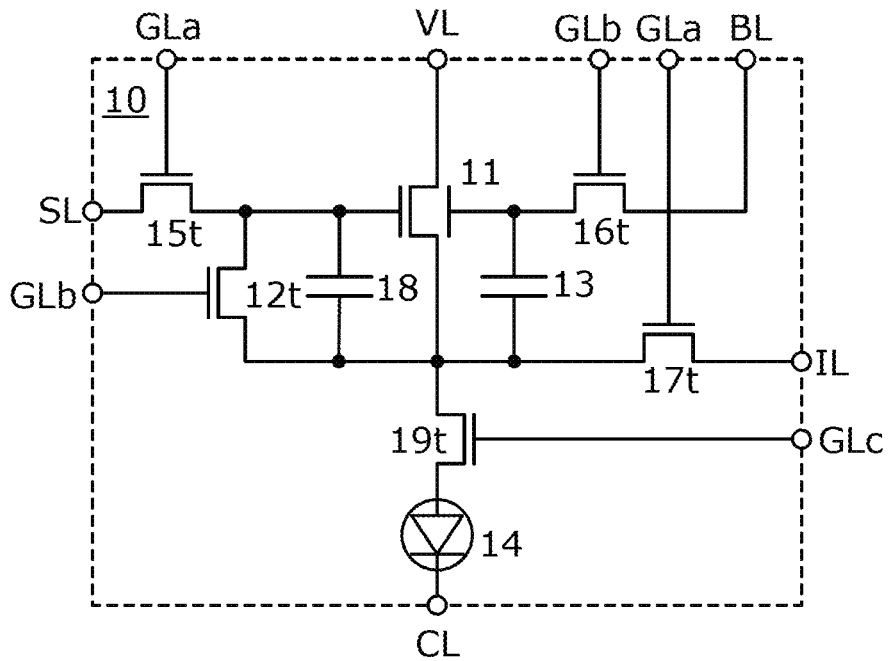

FIG. 4B shows another structure of the pixel 10 in FIG. 2B in which transistors are used as the switches 12, 15, 16, 17, and 19.

The pixel 10 in FIG. 4B is different from the pixel 10 in FIG. 3B in that one of the gate of the transistor 17t is electrically connected to not the wiring GLd but the wiring GLa.

<Specific Example 1 of Pixel Operation>

Next, an operation example of a pixel in the light-emitting device of one embodiment of the present invention is described using the pixel 10 in FIG. 3B.

Figure 5:
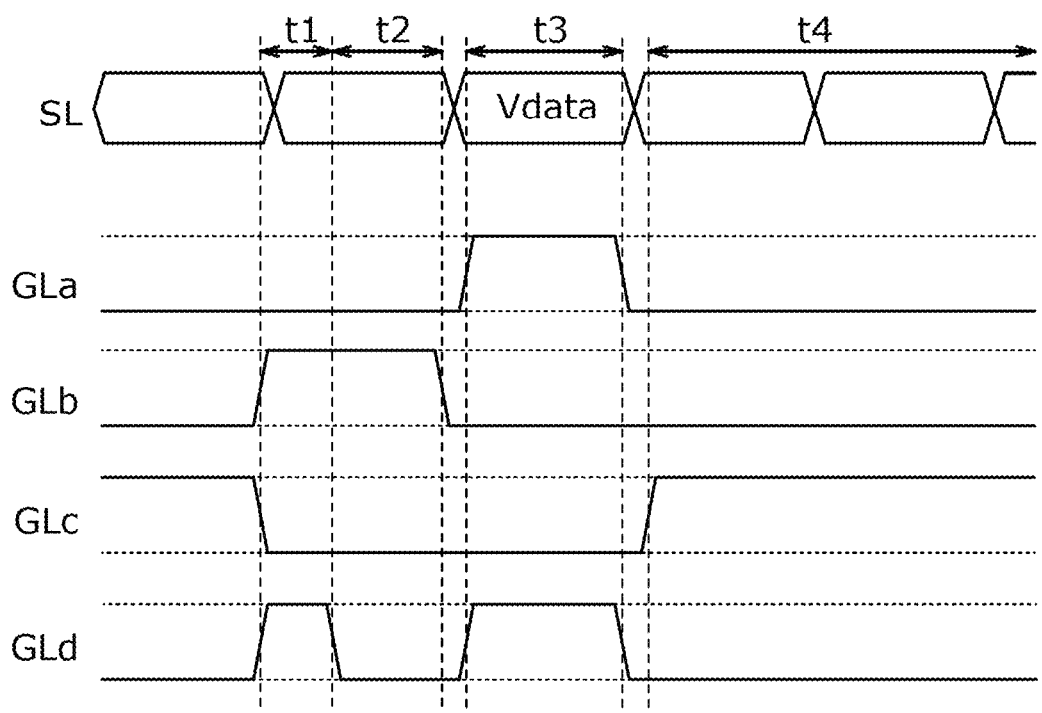
FIG. 5 is a timing chart illustrating the operation of the pixel.

FIG. 5 is a timing chart of potentials input to the wirings GLa to GLd and a potential of image signal Vdata input to the wiring SL. Note that the timing chart of FIG. 5 is an example in which all the transistors included in the pixel 10 shown in FIG. 3B are n-channel transistors. FIGS. 6A and 6B and FIGS. 7A and 7B schematically illustrate the operation of the pixel 10 in periods. Note that to simplify the operation of the pixel 10, transistors other than the transistor 11 is illustrated as switches in FIGS. 6A and 6B and FIGS. 7A and 7B.

Figure 6A:
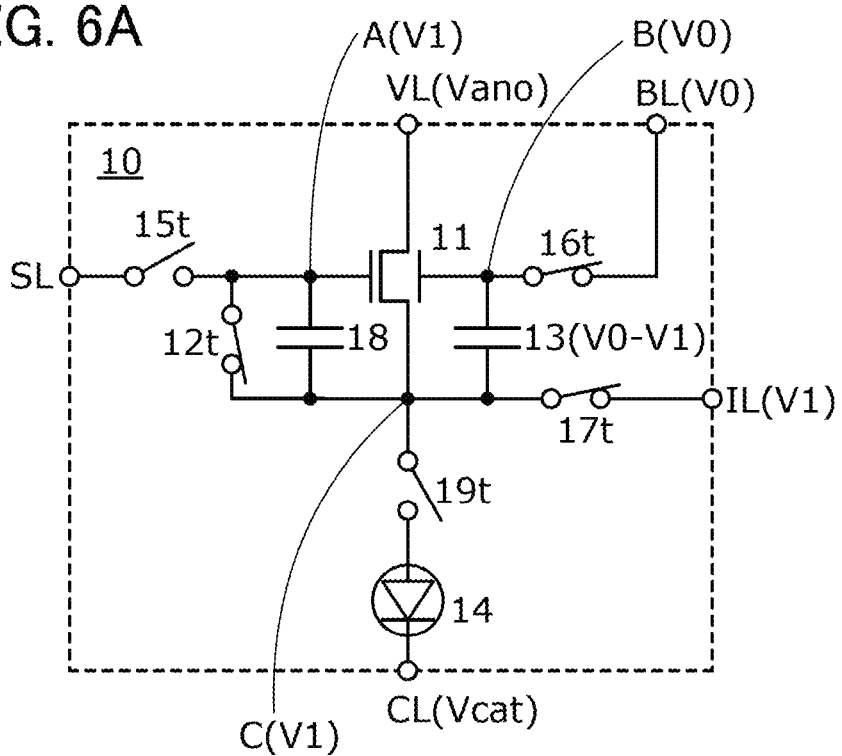
FIGS. 6A and 6B illustrate the operation of a pixel.

First, in a period t1, a low-level potential is applied to the wiring GLa, a high-level potential is applied to the wiring GLb, a low-level potential is applied to the wiring GLc, and a high-level potential is applied to the wiring GLd. Consequently, the transistors 12t, 16t, and 17t are turned on and the transistors 15t and 19t are turned off as shown in FIG. 6A.

The potentials Vano, V0, V1, and Vcat are applied respectively to the wirings VL, BL, IL, and the wiring CL electrically connected to the common electrode of the light-emitting element 14. The potentials V1, V0, and V1 are thus applied to the first gate (i.e., node A), the second gate (i.e., node B), and one of the source and the drain (i.e., node C) of the transistor 11, respectively.

The potential Vano is preferably higher than the sum of the potential Vcat, the threshold voltage Vthe of the light-emitting element 14, and the threshold voltage Vth of the transistor 11. The potential V0 is preferably much higher than the node C so that the threshold voltage of the transistor 11 can shift in the negative direction. Specifically, as shown in FIG. 9, the threshold voltage of the transistor 11 when voltage Vbg is zero is represented by Vth0 and voltage Vbg corresponding to the potential difference between the node B and the node C is represented by Vbg1. Thus, the threshold voltage Vth of the transistor 11 becomes Vth1 in the period t1. With the above structure, since the transistor 11 becomes normally on, the transistor 11 remains on even when the potential difference between the node A and the node C, i.e., the gate voltage of the transistor 11, is zero.

Note that when the transistor 11 is a p-channel transistor, the potential V0 is preferably much lower than the node C so that the threshold voltage of the transistor 11 can shift in the positive direction. With the above structure, since the transistor 11 becomes normally on, the transistor 11 remains on even when the potential difference between the node A and the node C, i.e., the gate voltage of the transistor 11, is zero.

Figure 6B:
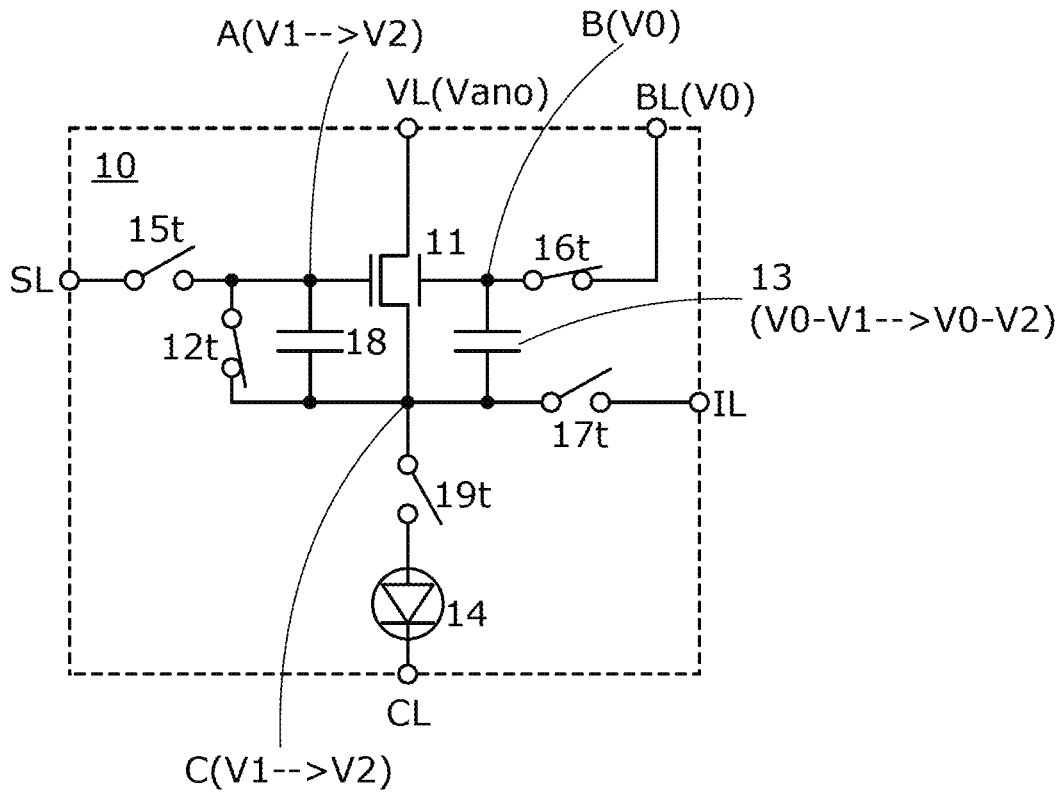

Next, in a period t2, a low-level potential is applied to the wiring GLa, the high-level potential is applied to the wiring GLb, the low-level potential is applied to the wiring GLc, and a low-level potential is applied to the wiring GLd. Consequently, the transistors 12t and 16t are turned on and the transistors 15t, 17t, and 19t are turned off as shown in FIG. 6B.

The potential Vano and the potential V0 are applied to the wiring VL and the wiring BL, respectively. The potential V0 thus keeps being applied to the node B, and the threshold voltage Vth of the transistor 11 remains in a state of being shifted in the negative direction, i.e. Vth1, at the start of the period t2; therefore, the transistor 11 is on. In the period t2, the current path between the wirings VL and IL is cut by the switch 17, and the potentials of the node A and the node C start to increase due to the drain current of the transistor 11. The potential of the node C is increased, and the potential Vbg corresponding to the potential difference between the nodes B and C is then lowered, so that the threshold voltage Vth of the transistor 11 shifts in the positive direction. As the threshold voltage Vth of the transistor 11 closely approaches zero, the transistor 11 is turned off. The potential difference between the node B and the node C when the threshold voltage Vth of the transistor 11 is 0 is V0−V2.

That is, when the potential difference between the nodes B and C is V0−V2, the threshold voltage Vth of the transistor 11 is corrected to zero so that the drain current converges to zero with respect to the gate voltage of 0, so that the potential difference between the nodes B and C V0−V2 is applied to the capacitor 13.

Figure 7A:
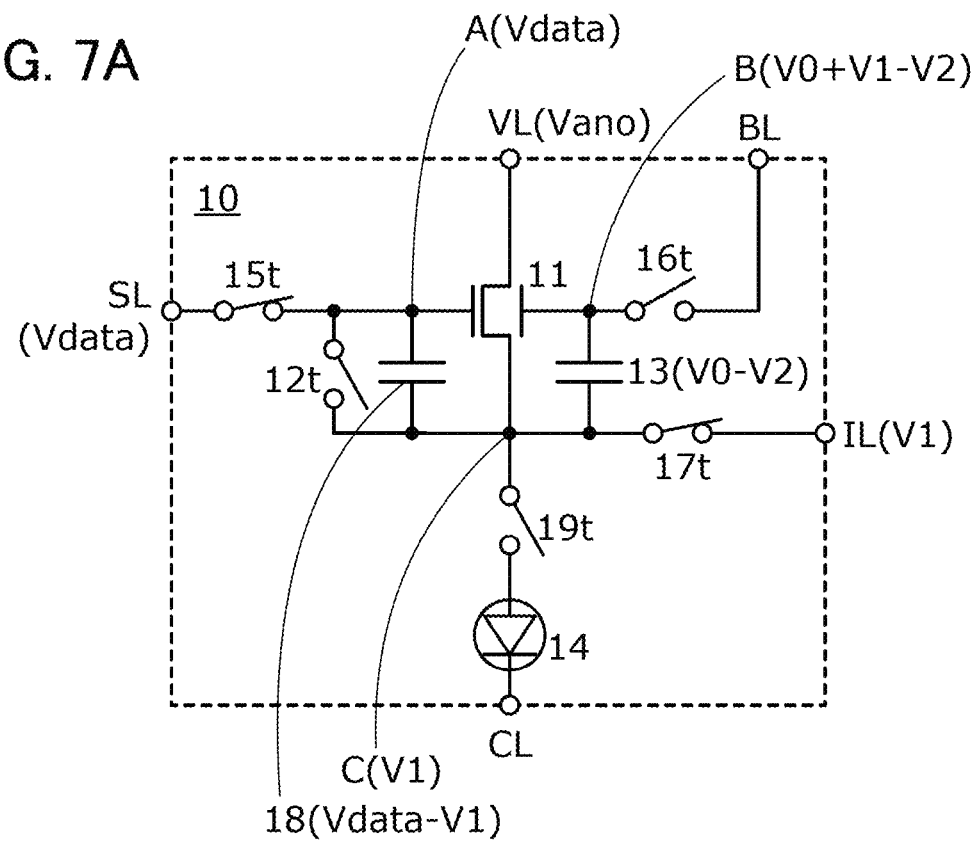
FIGS. 7A and 7B illustrate the operation of a pixel.

Next, in a period t3, a high-level potential is applied to the wiring GLa, a high-level potential is applied to the wiring GLb, a low-level potential is applied to the wiring GLc, and a high-level potential is applied to the wiring GLd. As a result, as illustrated in FIG. 7A, the transistors 15t and 17t are turned on and the transistors 12t, 16t, and 19t are turned off.

The potential Vano, the potential Vdata containing image data, and the potential V1 are applied to the wiring VL, the wiring SL, and the wiring IL, respectively. The node B is in a floating state. Thus, when the potential of the node C is changed from V2 to V1, the potential of the node B is changed from V0 to V0+V1−V2 by the capacitor 13. Because the capacitor 13 holds the potential difference V0−V2, the threshold voltage Vth of the transistor 11 is maintained at zero. The potential Vdata is applied to the node A, and the gate voltage of the transistor 11 is thus Vdata−V1.

Figure 7B:
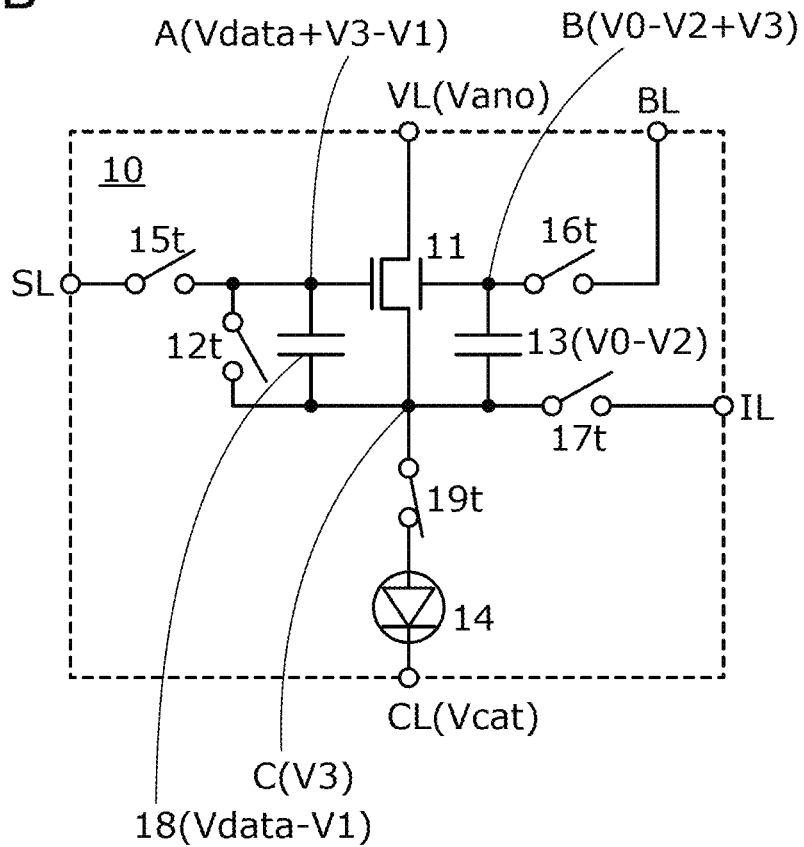

In a period t4, a low-level potential is applied to the wiring GLa, a low-level potential is applied to the wiring GLb, a high-level potential is applied to the wiring GLc, and a high-level potential is applied to the wiring GLd. As a result, as illustrated in FIG. 7B, the transistor 19t is turned on and the transistors 12t, 15t, 16t, and 17t are turned off.

The potentials Vano and Vcat are applied respectively to the wirings VL and CL electrically connected to the common electrode of the light-emitting element 14. In the period t4, the potential of the node C is changed by turning on the transistor 19t. When the potential of the node C is changed to V3, the potentials of the node A and the node B become Vdata+V3−V1 and V0−V2+V3, respectively. Even when the potentials of the nodes A, B, and C are changed, the capacitor 13 and the capacitor 18 hold the potential difference V0−V2 and the potential difference Vdata−V1, respectively. The drain current having a value corresponding to the gate voltage of the transistor 11 flows between the wirings VL and CL. The luminance of the light-emitting element 14 depends on the value of the drain current.

Note that, in the light-emitting device including the pixel 10 illustrated in FIG. 3B, because the other of the source and the drain of the transistor 11 is electrically isolated from the second gate of the transistor 11, their potentials can be individually controlled. When the transistor 11 is normally-on, that is, when the initial threshold voltage Vth0 of the transistor 11 is negative, charge can be accumulated in the capacitor 13 until the potential of the one of the source and the drain of the transistor 11 becomes higher than the potential V0 of the second gate of the transistor 11 in the period t2. As a result, in the light-emitting device of one embodiment of the present invention, even when the transistor 11 is normally-on, the threshold voltage Vth can be corrected to zero so that the drain current converges to zero with respect to a gate voltage of zero in the period t2.

By using an oxide semiconductor for a semiconductor film of the transistor 11, for example, the light-emitting device including the pixel 10 shown in FIGS. 3A and 3B and FIG. 4B in which the other of the source and the drain of the transistor 11 is electrically isolated from the second gate of the transistor 11 can reduce display unevenness and display high-quality images even when the transistor 11 is normally-on.

Figure 36A:
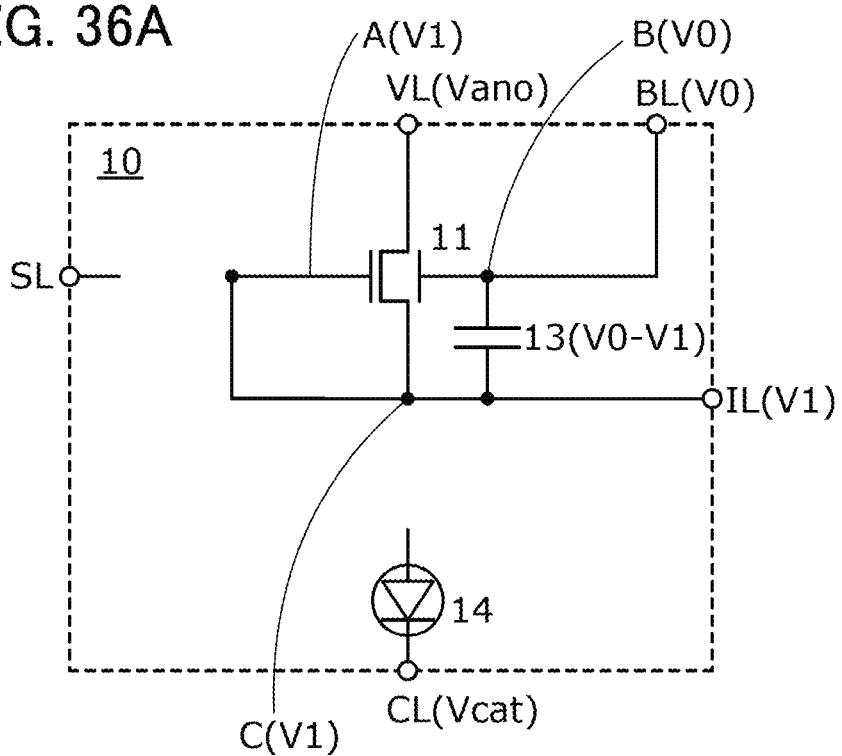
FIGS. 36A and 36B illustrate a structure of a pixel.
Figure 36B:
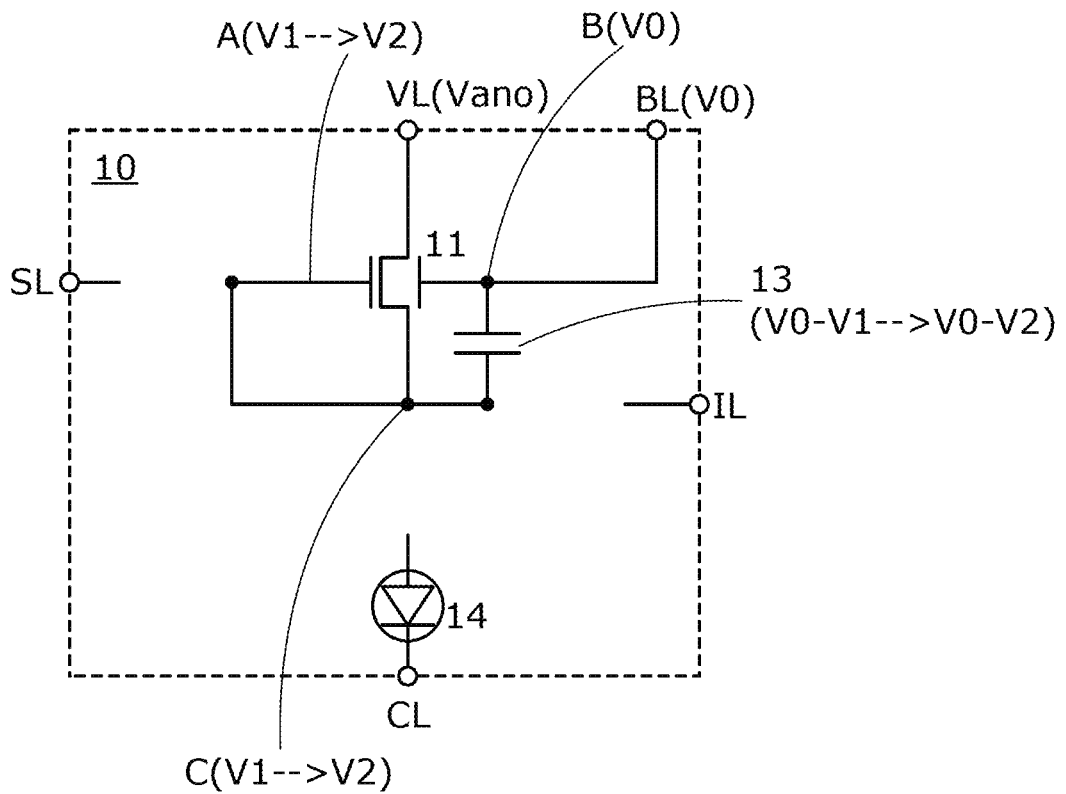
Figure 37A:
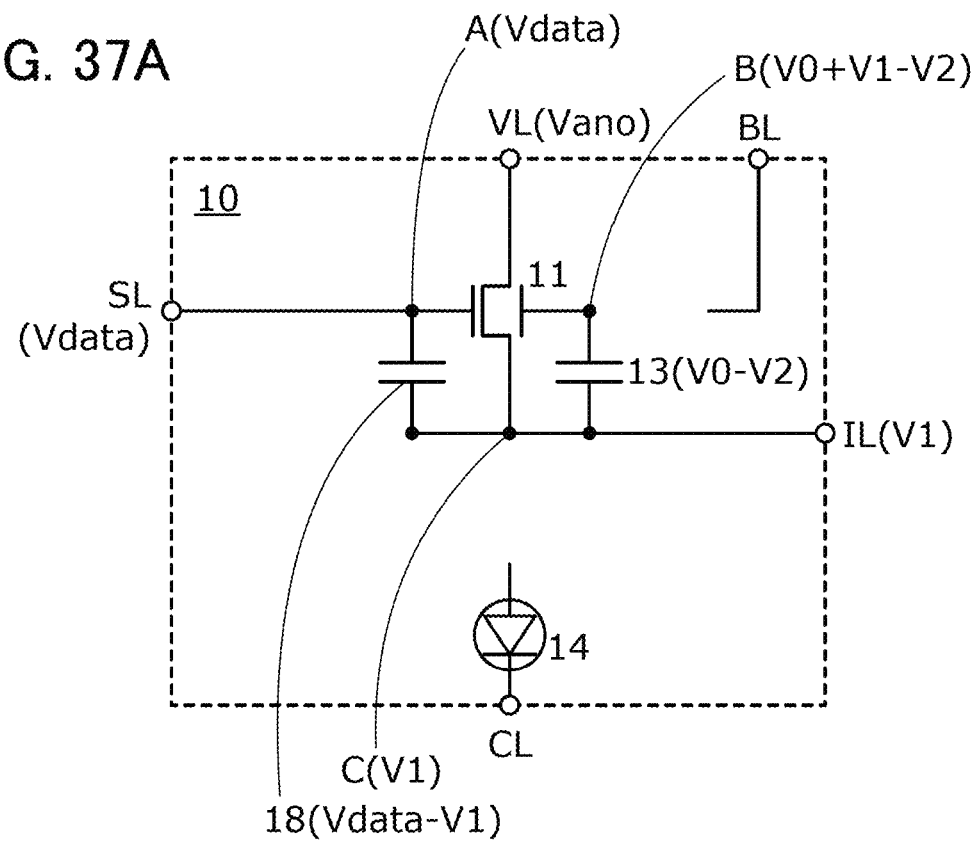
FIGS. 37A and 37B illustrate a structure of a pixel.
Figure 37B:
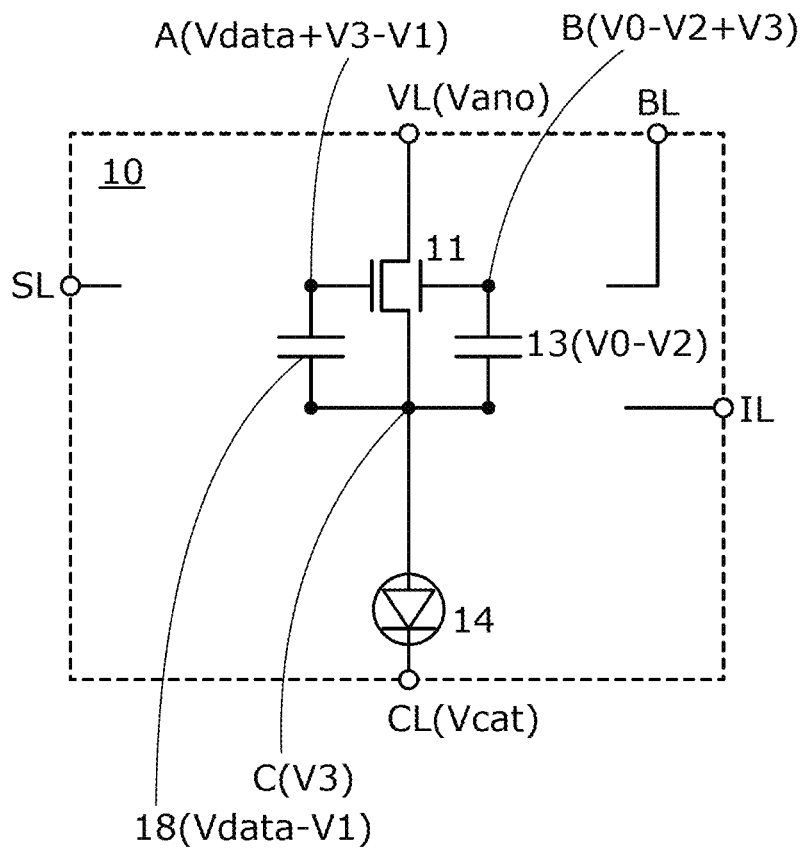

Note that one embodiment of the present invention is not limited to the circuit configuration shown in FIGS. 2A and 2B, and the like, and switches can be arranged in a variety of positions. For example, a circuit configuration shown in FIG. 36A can be employed for FIG. 6A, FIG. 36B can be employed for FIG. 6B, FIG. 37A can be employed for FIG. 7A, and FIG. 37B can be employed for FIG. 7B. Switches are arranged in appropriate positions in the examples.

The above is the operation example of the pixel 10 including threshold voltage correction (hereinafter referred to as internal correction) in the pixel 10. Described below is an operation of the pixel 10 in the case where variation in luminance among the pixels 10 due to variation in threshold voltages is suppressed by correcting an image signal (hereinafter referred to as external correction) in addition to the internal correction.

Figure 8:
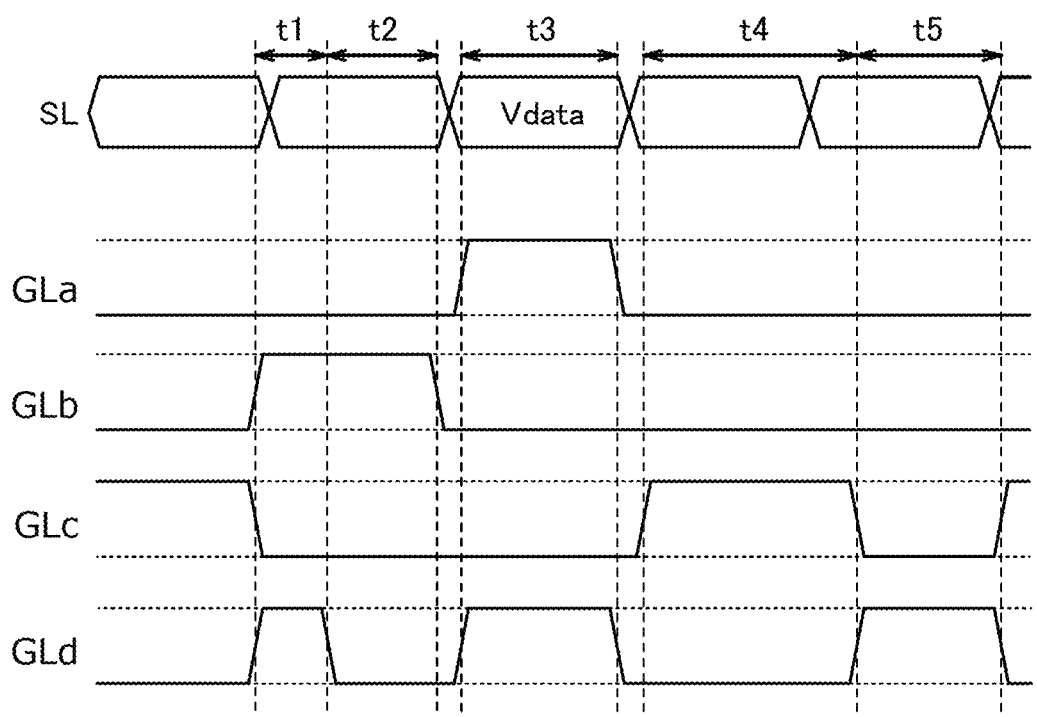
FIG. 8 is a timing chart illustrating the operation of a pixel.

Using the pixel 10 shown in FIG. 3B as an example, a timing chart of potentials input to the wirings GLa to GLd when both the internal correction and the external correction are performed, and a potential of the image signal Vdata input to the wiring SL is shown in FIG. 8. Note that the timing chart of FIG. 8 is an example in which all the transistors included in the pixel 10 shown in FIG. 3B are n-channel transistors.

The pixel 10 operates from a period t1 to a period t4 according to the timing chart shown in FIG. 5 and the above description.

In a period t5, a low-level potential is applied to the wiring GLa, a low-level potential is applied to the wiring GLb, a low-level potential is applied to the wiring GLc, and a high-level potential is applied to the wiring GLd. As a result, the transistor 17t is turned on and the transistors 12t, 15t, 16t, and 19t are turned off.

The potential Vano and the potential V1 are applied to the wiring VL and the wiring IL. The wiring IL is electrically connected to a monitor circuit.

By the above operation, drain current of the transistor 11 is supplied to the monitor circuit through the transistor 17t and the wiring IL. The monitor circuit generates a signal including information about the value of the drain current by using the drain current flowing through the wiring IL. Thus, using the above signal, the light-emitting device according to one embodiment of the present invention can correct the value of the potential Vdata of the image signal Sig supplied to the pixel 10.

Note that external correction in the period t5 is not necessarily performed after the period t4. For example, in the light-emitting device, the operation in the period t5 may be performed after the operations in the periods t1 to t4 are repeated several times. Alternatively, after the operation in the period t5 is performed on pixels 10 in one row, the light-emitting elements 14 may be brought into a non-light-emitting state by writing image signals corresponding to the lowest grayscale level 0 to the pixels 10 in the row which have been subjected to the above operation. Then, the operation in the period t5 may be performed on pixels 10 in the next row.

Note that even when only external correction is performed and internal correction is performed, not only variation in threshold voltage of the transistors 11 between the pixels 10 but also variation in other electrical characteristics, such as mobility, of the transistors 11 can be corrected. In the case where internal correction is performed in addition to external correction, a negative shift or a positive shift of the threshold voltage is corrected by internal correction. Thus, external correction may be performed to correct variation in electrical characteristics other than threshold voltage, such as mobility, of the transistor 11. In the case where internal correction is performed in addition to external correction, the potential amplitude of a corrected image signal can be made smaller than in the case where only external correction is performed. This can prevent a situation where the potential amplitude of the image signal is so large that there are large differences in potential of the image signal between different grayscale levels and it is difficult to express minute gradations of an image with luminance differences, and a decrease in image quality can be prevented.

The pixel 10 shown in FIG. 3A can also be driven in accordance with the timing chart of FIG. 5 or FIG. 8 on potentials applied to the wirings GLa, GLb, GLd, and SL. Note that in the case of the pixel 10 in FIG. 3A, the potential V0 is preferably set lower than the sum of the potential Vcat, the threshold voltage Vthe of the light-emitting element 14, and the threshold voltage Vth of the transistor 15t.

The pixel 10 shown in FIG. 4A can also be driven in accordance with the timing chart of FIG. 5 or FIG. 8 on potentials applied to the wirings GLa, GLb, GLc, GLd, and SL.

The pixel 10 shown in FIG. 4B can also be driven in accordance with the timing chart of FIG. 5 or FIG. 8 on potentials applied to the wirings GLa, GLb, GLc, and SL.

Figure 38A:
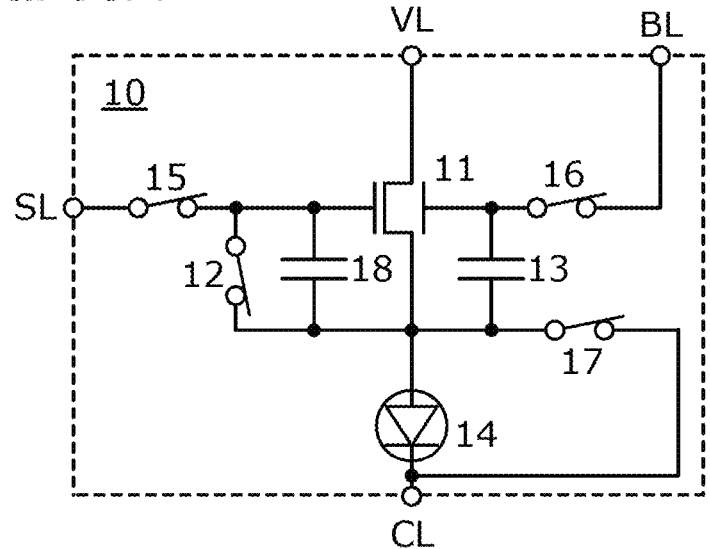
FIGS. 38A and 38B illustrate a structure of a pixel.
Figure 38B:
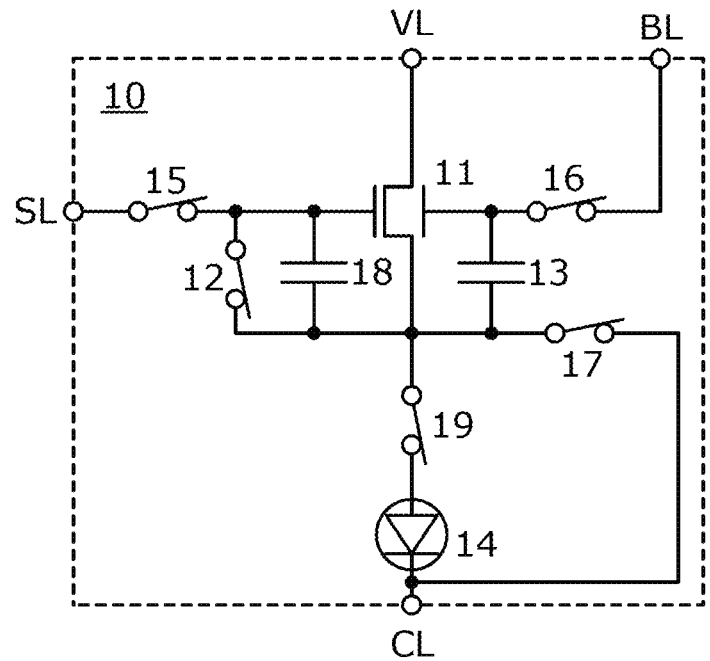

Note that when external correction is not performed, for example, the wiring IL may be connected to the wiring CL or may be omitted by unifying the wiring IL and the wiring CL, so that the number or wirings can be reduced. FIGS. 38A and 38B are examples where the wiring IL is omitted in FIGS. 2A and 2B, respectively. The same can be applied to other figures.

<Structure Examples of Pixel Portion and Selection Circuit>

Figure 10:
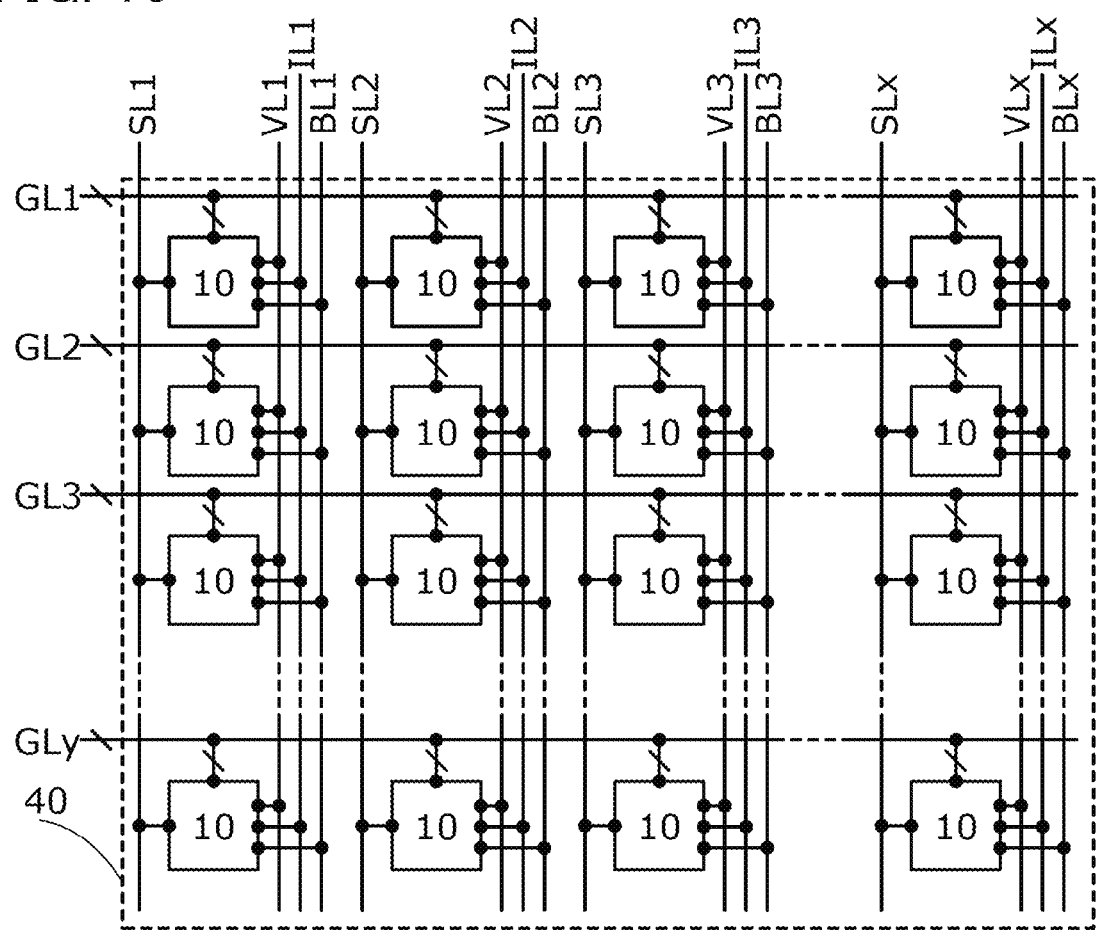
FIG. 10 illustrates a structure of a pixel portion.

A structure example of a pixel portion in a light-emitting device according to one embodiment of the present invention will be described with reference to FIG. 10. In FIG. 10, a pixel portion 40 includes a plurality of pixels 10 arranged in a matrix. The pixel portion 40 includes at least wirings GL, SL, VL, BL, IL, and CL (CL is not shown). Each of the pixels 10 is electrically connected to at least one of the wirings GL, at least one of the wirings SL, at least one of the wirings VL, at least one of the wirings BL, at least one of the wiring IL, and the wiring CL.

Note that the kinds and number of the lines can be determined by the structure, number, and position of the pixels 10. Specifically, the pixel portion 40 in FIG. 10 includes the pixels 10 arranged in a matrix of x columns×y rows, a plurality of wirings GL (wirings GL1 to GLy), a plurality of wirings SL (wirings SL1 to SLx), a plurality of wirings VL (wirings VL1 to VLx), a plurality of wirings BL (wirings BL1 to BLx), a plurality of wirings IL (wirings IL1 to ILx), and the wiring CL.

Each wiring GL in FIG. 10 includes all or some of the wirings GLa, GLb, GLc, and GLd.

Note that when the pixels 10 are connected in a matrix as FIG. 10, the operation shown in FIG. 6A, 6B, 7B, or the like can be performed in one line, whereas the operation shown in FIG. 7A can be performed in the other line. The operations shown in FIGS. 6A and 6B and the like can be thus performed for a sufficiently long period, so that accurate correction is achieved.

Figure 39A:
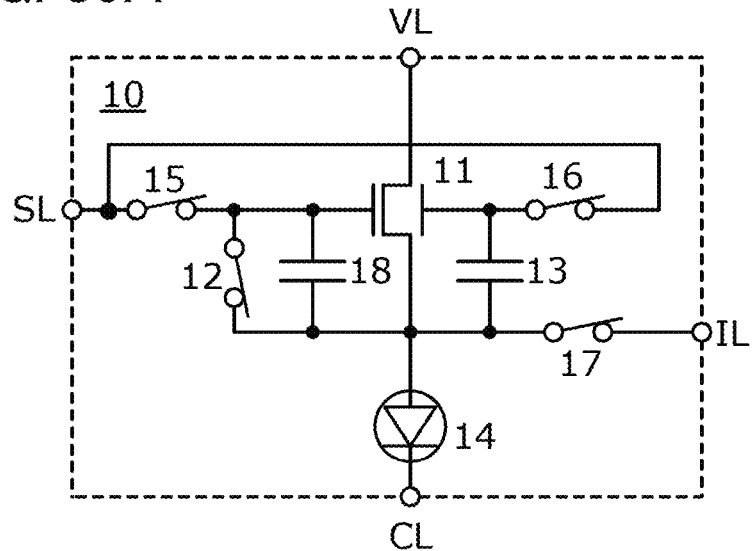
FIGS. 39A and 39B illustrate a structure of a pixel.
Figure 39B:
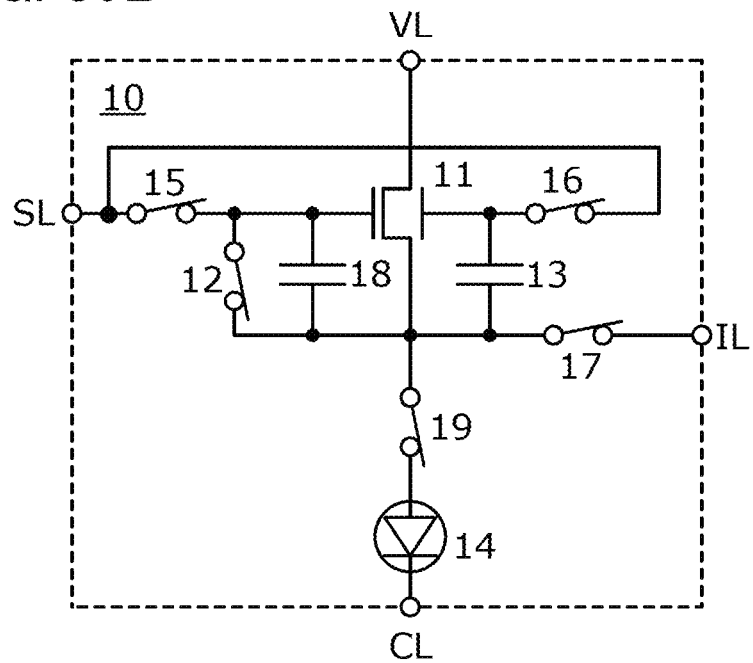

Note that when the operation in FIG. 6A, 6B, or the like is not performed at the same time as the operation in FIG. 7A or the like in different wirings, the wiring BL may be connected to the wiring SL or omitted by unifying the wirings BL and SL, so that the number of wirings can be reduced. FIGS. 39A and 39B are examples where the wiring BL is omitted in FIGS. 2A and 2B, respectively. The same can be applied to other figures.

Figure 40:
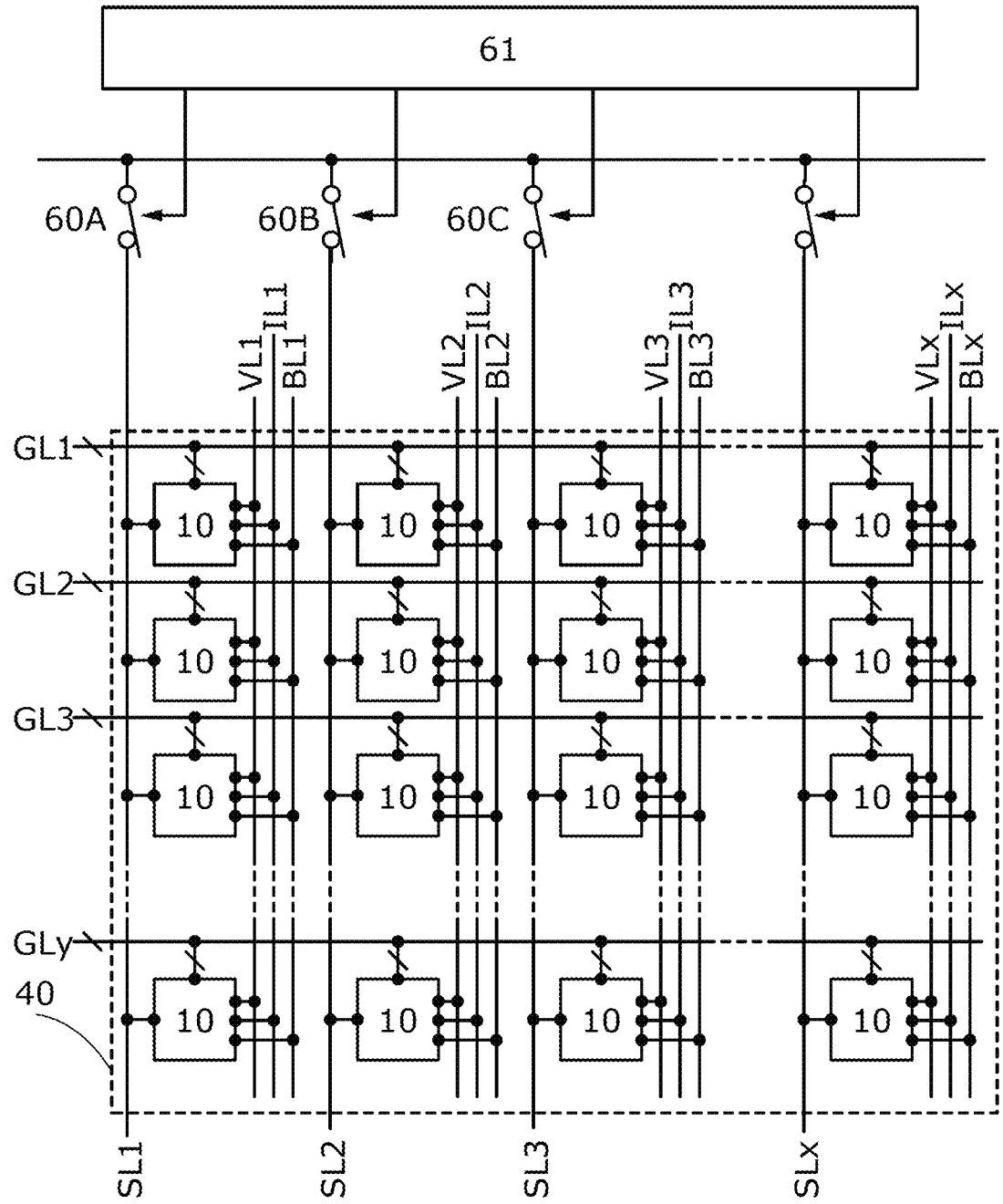
FIG. 40 is a diagram showing a structure of a pixel portion.

In a period for inputting the potential Vdata of an image signal (e.g., the period shown in FIG. 7A or the like), the operation for applying the potential difference between the nodes B and C to the capacitor 13, which is shown in FIG. 6B, is not performed; thus, the potential Vdata of the image signal can be input with dot sequential driving in FIG. 7A, or the like. An example of this case is illustrated in FIG. 40.

Switches 60A, 60B, and 60C, and the like are sequentially turned on by the circuit 61, so that dot sequential driving is performed. Here, the circuit 61 is capable of outputting waveforms shifted one by one, like a shift register. It can be thus said that the switches 60A, 60B, and 60C and the circuit 61 have a function of a source line driver circuit.

Figure 41:
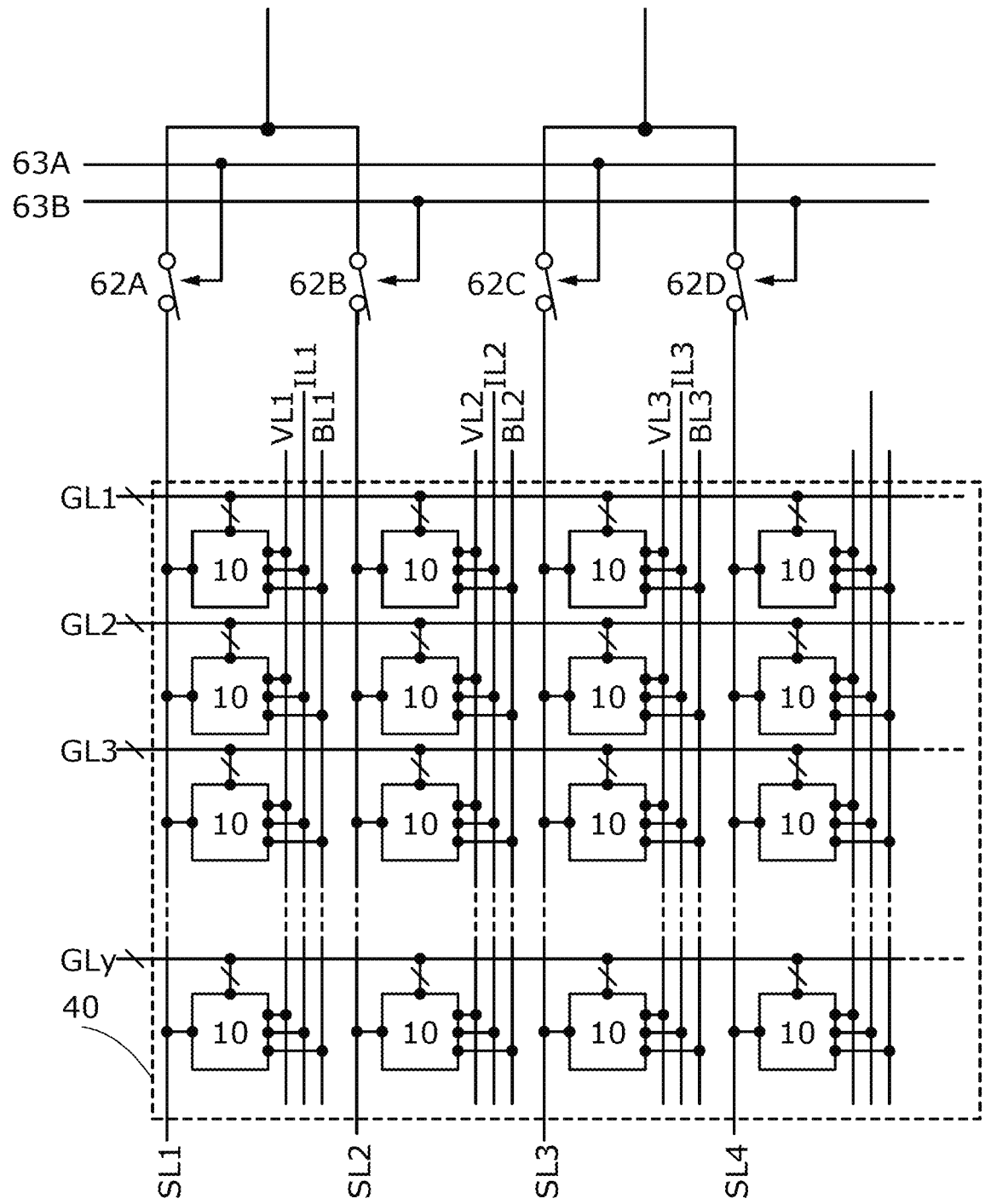
FIG. 41 illustrates a structure of a pixel portion.

As another example, any one of the wirings is selected from the wirings among a plurality of wirings SL (SL1 to SLx) to input the potential Vdata of an image signal. FIG. 41 is an example in which the wirings SL1 and SL2 are selected by the switches 62A and 62B, and the wirings SL3 and SL4 are selected by the switches 62C and 62D. In FIG. 41, the wiring 63A is selected and the switches 62A and 62C are accordingly turned on, and the wiring 63B is selected and the switches 62B and 62D are accordingly turned on. One wiring SL is selected from two wirings SL in this example, but one embodiment of the present invention is not limited to this. One wiring SL may be selected from more wirings SL.

Figure 11:
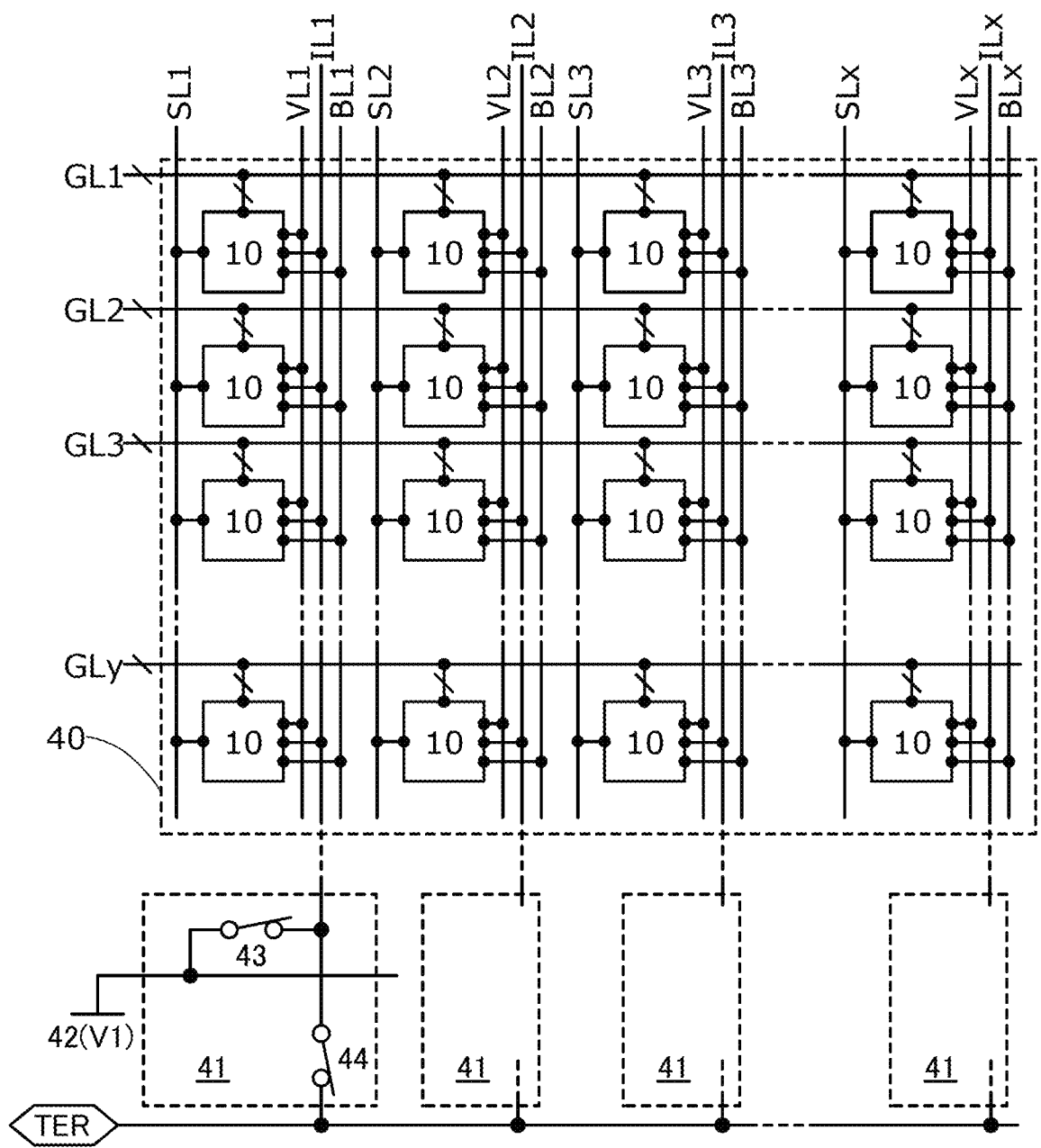
FIG. 11 illustrates configurations of a pixel portion and a selection circuit.

FIG. 11 shows an example of connecting the pixel portion 40 and the selection circuits 41 of a light-emitting device configured to perform external correction. The selection circuit 41 is configured to select either a wiring 42 to which the potential V1 is applied or a connection terminal TER connected to a monitor circuit. Either one of the wiring 42 and the connection terminal TER can be conducted to the wiring IL.

Specifically, the selection circuit 41 in FIG. 11 includes a switch 43 for controlling supply of the potential V1 of the wiring 42 to one wiring IL and a switch 44 for controlling conduction between the wiring IL and the connection terminal TER.

<Configuration Example of Monitor Circuit>

Figure 12:
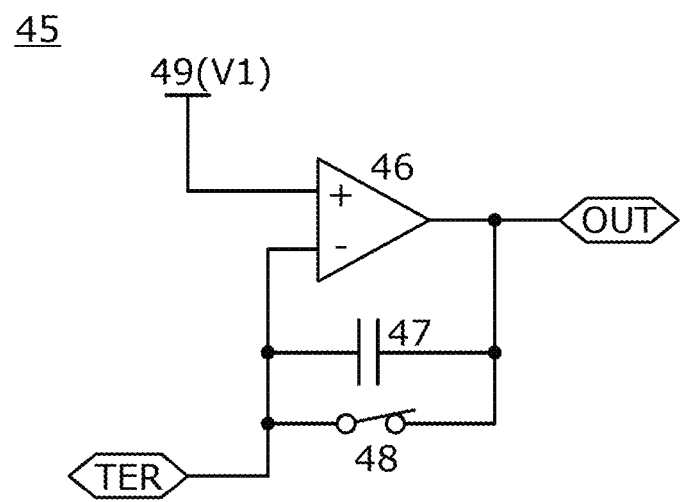
FIG. 12 is a circuit diagram of a monitor circuit.

Next, a configuration example of the monitor circuit 45 is illustrated in FIG. 12. The monitor circuit 45 illustrated in FIG. 12 includes an operational amplifier 46, a capacitor 47, and a switch 48.

One of a pair of electrodes of the capacitor 47 is connected to an inverting input terminal(−) of the operational amplifier 46, and the other of the pair of electrodes of the capacitor 47 is connected to an output terminal of the operation amplifier 46. The switch 48 has a function of releasing charge accumulated in the capacitor 47, and specifically has a function of controlling electrical connection between the pair of electrodes of the capacitor 47. A non-inverting input terminal(+) of the operational amplifier 46 is connected to a wiring 49, and the potential Vano or the potential V1 is applied to the wiring 49.

In one embodiment of the present invention, the monitor circuit 45 functions as a voltage follower when the potential Vano or the potential V1 is applied to the wiring IL of the pixel 10 in order to perform internal correction. Specifically, the potential V1 supplied to the wiring 49 can be supplied to the wiring IL via the monitor circuit 45 by turning on the switch 48.

When current is extracted from the pixel 10 through the wiring IL in order to perform external correction, the monitor circuit 45 functions as a voltage follower, thereby applying the potential V1 to the wiring IL, and then functions as an integrator circuit, thereby converting the current extracted from the pixel 10 into voltage. Specifically, by turning on the switch 48, the potential V1 applied to the wiring 49 is applied to the wiring V1 through the monitor circuit 45, and then, the switch 48 is turned off. When the switch 48 is in an off state and the drain current is extracted to the wiring TER from the pixel 10, charge is accumulated in the capacitor 47, so that a voltage is generated between the pair of electrodes of the capacitor 47. The voltage is proportional to the total amount of the drain current supplied to the wiring TER, and a potential corresponding to the total amount of drain current in a predetermined period is applied to the wiring OUT connected to the output terminal of the operation amplifier 46.

<Specific Example 2 of Pixel Structure>

Figure 13A:
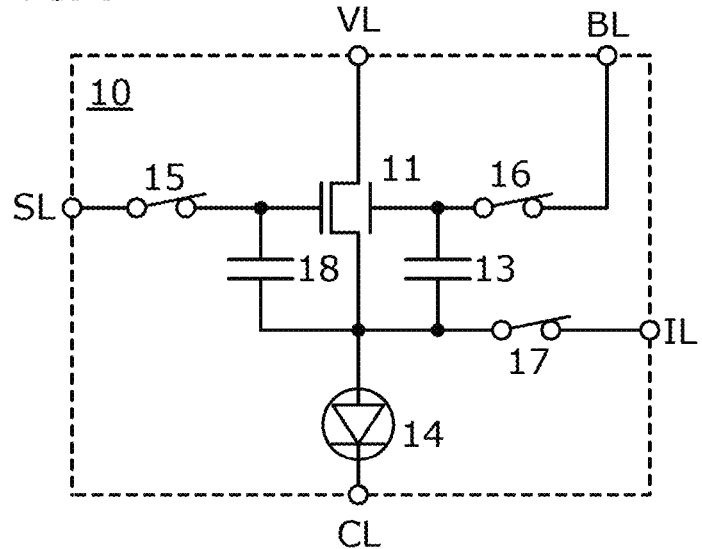
FIGS. 13A and 13B illustrate a structure of a pixel.

FIG. 13A is a structure example of the pixel 10 shown in FIG. 1.

The pixel 10 shown in FIG. 13A includes the transistor 11, the capacitor 13, the light-emitting element 14, the switches 15, 16, and 17, and the capacitor 18.

Specifically, in the pixel 10 shown in FIG. 13A, the wiring SL is electrically connected to the first gate of the transistor 11 via the switch 15. The one of the source and the drain of the transistor 11 is electrically connected to the pixel electrode of the light-emitting element 14, and the other of the source and the drain is electrically connected to the wiring VL. The second gate of the transistor 11 is electrically connected to the wiring BL through the switch 16. The pixel electrode of the light-emitting element 14 is electrically connected to the wiring IL via the switch 17. The one of the pair of electrodes of the capacitor 13 is electrically connected to the second gate of the transistor 11, and the other electrode is electrically connected to the pixel electrode of the light-emitting element 14. The one of the pair of electrodes of the capacitor 18 is electrically connected to the first gate of the transistor 11, and the other electrode is electrically connected to the pixel electrode of the light-emitting element 14. The common electrode of the light-emitting element 14 is electrically connected to the wiring CL.

Figure 13B:
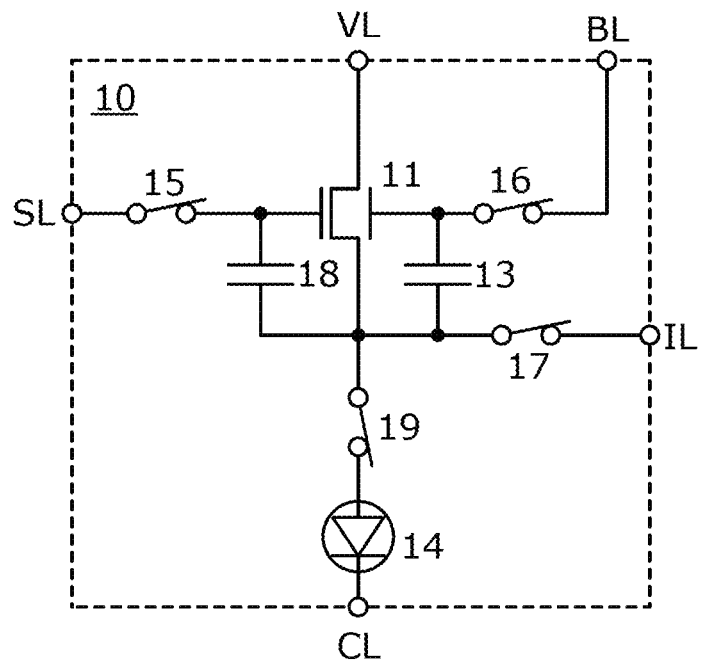

FIG. 13B is another structure example of the pixel 10 shown in FIG. 1.

The pixel 10 in FIG. 13B further includes the switch 19 unlike the pixel 10 in FIG. 13A.

Specifically, in the pixel 10 shown in FIG. 13B, the wiring SL is electrically connected to the first gate of the transistor 11 via the switch 15. The one of the source and the drain of the transistor 11 is electrically connected to the pixel electrode of the light-emitting element 14 through the switch 19, and the other of the source and the drain is electrically connected to the wiring VL. The second gate of the transistor 11 is electrically connected to the wiring BL through the switch 16. The pixel electrode of the light-emitting element 14 is electrically connected to the wiring IL via the switch 17. The one of the pair of electrodes of the capacitor 13 is electrically connected to the second gate of the transistor 11, and the other electrode is electrically connected to the pixel electrode of the light-emitting element 14 through the switch 19. The one of the pair of electrodes of the capacitor 18 is electrically connected to the first gate of the transistor 11, and the other electrode is electrically connected to the pixel electrode of the light-emitting element 14 through the switch 19. The common electrode of the light-emitting element 14 is electrically connected to the wiring CL.

Figure 14A:
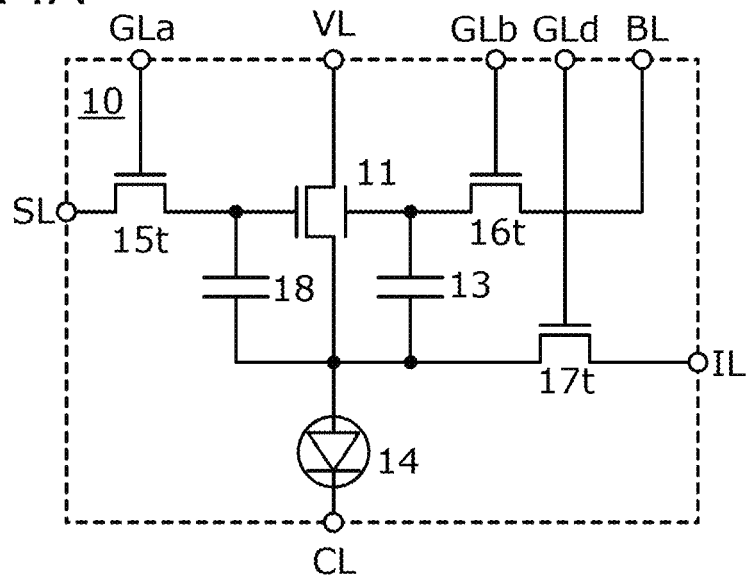
FIGS. 14A and 14B are diagrams each showing a pixel configuration.

Next, a structure example of the pixel 10 in FIG. 13A using transistors as the switches is described. FIG. 14A shows a structure of the pixel 10 in FIG. 13A in which transistors are used as the switches 12, 15, 16, and 17.

The pixel 10 in FIG. 14A includes the transistor 11; the transistors 15$t$, 16$t$, and 17$t$ as the switches 15, 16, and 17, respectively; the capacitors 13 and 18; and the light-emitting element 14.

The gate of the transistor 15$t$ is electrically connected to the wiring GLa, the one of the source and the drain of the transistor 15$t$ is electrically connected to the wiring SL, and the other of the source and the drain is electrically connected to the first gate of the transistor 11. The one of the source and the drain of the transistor 11 is electrically connected the pixel electrode of the light-emitting element 14, and the other thereof is electrically connected to the wiring VL. The gate of the transistor 16$t$ is electrically connected to the wiring GLb, the one of the source and the drain of the transistor 16$t$ is electrically connected to the wiring BL, and the other of the source and the drain is electrically connected to the second gate of the transistor 11. The gate of the transistor 17$t$ is electrically connected to the wiring GLd, the one of the source and the drain of the transistor 17$t$ is electrically connected to the wiring IL, and the other of the source and the drain is electrically connected to the pixel electrode of the light-emitting element 14.

The one of the pair of electrodes of the capacitor 13 is electrically connected to the second gate of the transistor 11, and the other electrode is electrically connected to the pixel electrode of the light-emitting element 14. The one of the pair of electrodes of the capacitor 18 is electrically connected to the first gate of the transistor 11, and the other electrode is electrically connected to the pixel electrode of the light-emitting element 14. The common electrode of the light-emitting element 14 is electrically connected to the wiring CL.

Figure 14B:
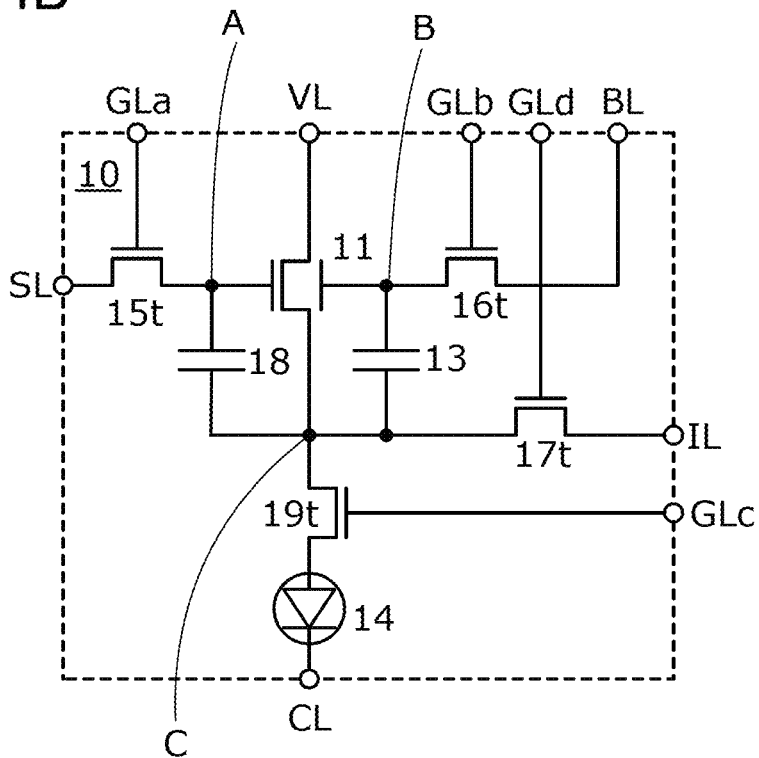

Next, a structure example of the pixel 10 in FIG. 13B using transistors as the switches is described. FIG. 14B shows a structure of the pixel 10 in which transistors are used as the switches 15, 16, 17, and 19.

The pixel 10 in FIG. 14B includes the transistor 11; the transistors 15$t$, 16$t$, and 17$t$ as the switches 15, 16, and 17, respectively; a transistor 19$t$ serving as the switch 19; the capacitors 13 and 18; and the light-emitting element 14.

The gate of the transistor 15$t$ is electrically connected to the wiring GLa, the one of the source and the drain of the transistor 15$t$ is electrically connected to the wiring SL, and the other of the source and the drain is electrically connected to the first gate of the transistor 11. The one of the source and the drain of the transistor 11 is electrically connected the other of the source and the drain of the transistor 19$t$, and the other thereof is electrically connected to the wiring VL. The gate of the transistor 16$t$ is electrically connected to the wiring GLb, the one of the source and the drain of the transistor 16$t$ is electrically connected to the wiring BL, and the other of the source and the drain is electrically connected to the second gate of the transistor 11. The gate of the transistor 17$t$ is electrically connected to the wiring GLd, the one of the source and the drain of the transistor 17$t$ is electrically connected to the wiring IL, and the other of the source and the drain is electrically connected to the one of the source and the drain of the transistor 19$t$. A gate of the transistor 19$t$ is electrically connected to the wiring GLc, and the other of the source and the drain is electrically connected to the pixel electrode of the light-emitting element 14.

The one of the pair of electrodes of the capacitor 13 is electrically connected to the second gate of the transistor 11, and the other electrode is electrically connected to the one of the source and the drain of the transistor 19$t$. The one of the pair of electrodes of the capacitor 18 is electrically connected to the first gate of the transistor 11, and the other electrode is electrically connected to the other of the source and the drain of the transistor 19$t$. The common electrode of the light-emitting element 14 is electrically connected to the wiring CL.

Figure 15A:
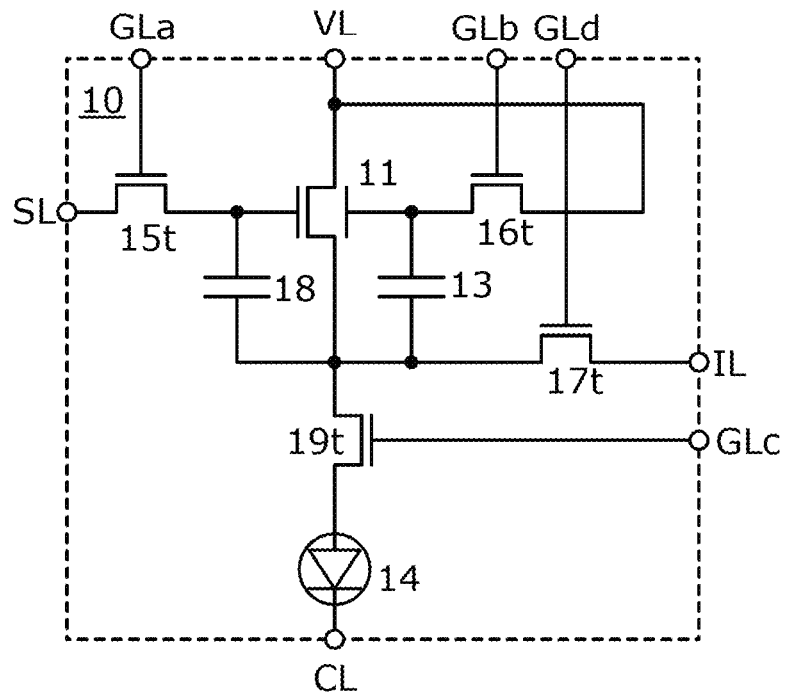
FIGS. 15A and 15B illustrate a configuration of a pixel.

FIG. 15A shows another structure of the pixel 10 in FIG. 13B in which transistors are used as the switches 15, 16, and 17.

The pixel 10 in FIG. 15A is different from the pixel 10 in FIG. 14B in that one of the source and the drain of the transistor 16t is electrically connected to not the wiring BL but the wiring VL.

Figure 15B:
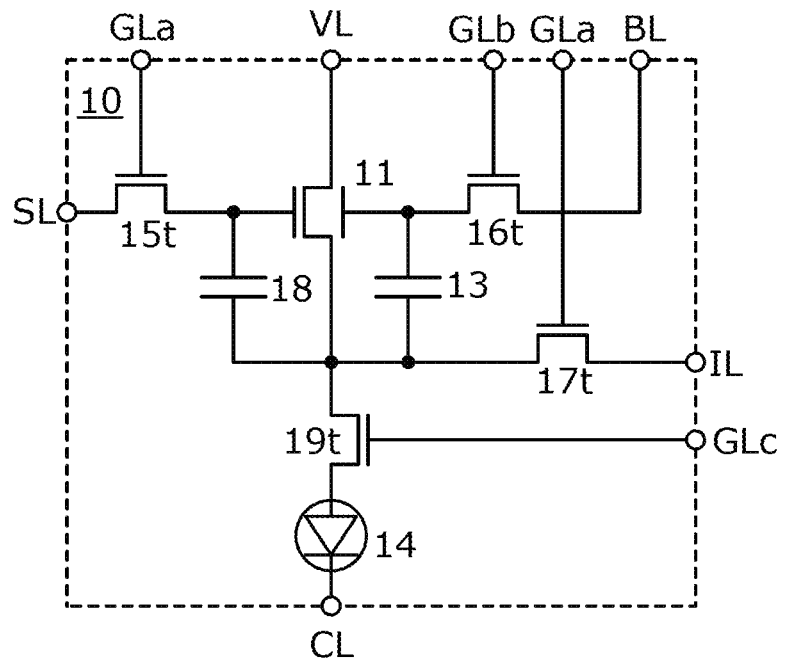

FIG. 15B shows another structure of the pixel 10 in FIG. 13B in which transistors are used as the switches 15, 16, 17, and 19.

The pixel 10 in FIG. 15B is different from the pixel 10 in FIG. 14B in that one of the gate of the transistor 17t is electrically connected to not the wiring GLd but the wiring GLa.

<Specific Example 2 of Pixel Operation>

Next, an operation example of a pixel in the light-emitting device of one embodiment of the present invention is described using the pixel 10 in FIG. 14B.

Figure 16:
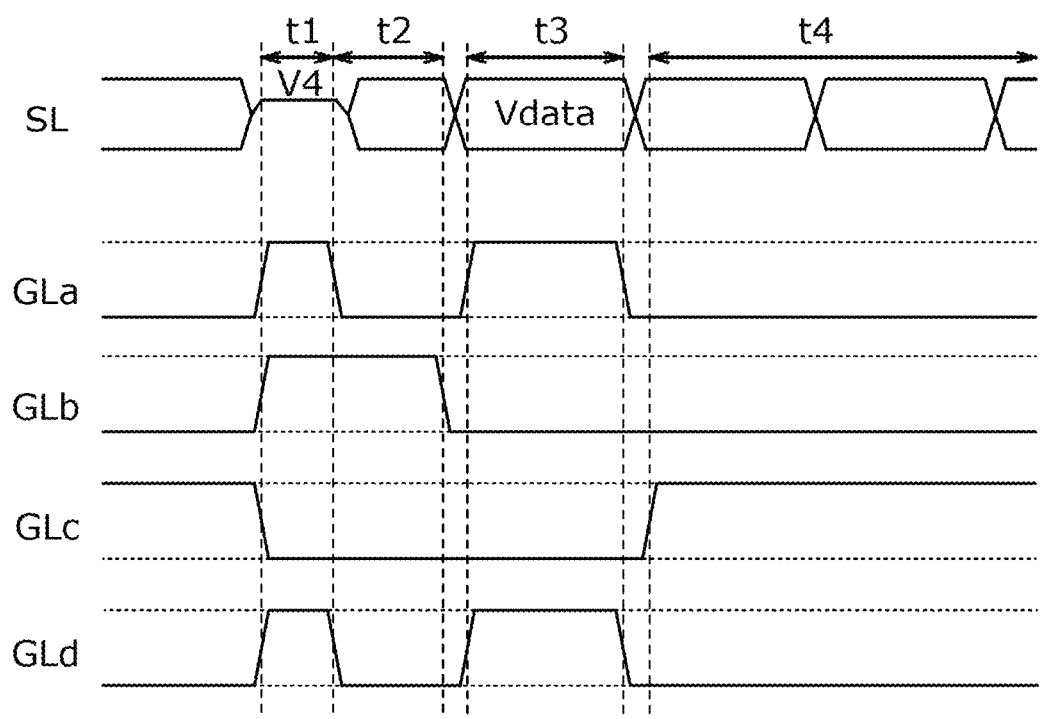
FIG. 16 is a timing chart illustrating the operation of a pixel.

FIG. 16 is a timing chart of potentials input to the wirings GLa to GLd and a potential of image signal Vdata input to the wiring SL. Note that the timing chart of FIG. 16 is an example in which all the transistors included in the pixel 10 shown in FIG. 14B are n-channel transistors.

First, in a period t1, a high-level potential is applied to the wiring GLa, a high-level potential is applied to the wiring GLb, a low-level potential is applied to the wiring GLc, and a high-level potential is applied to the wiring GLd. Consequently, the transistors 15t, 16t, and 17t are turned on and the transistor 19t is turned off.

The potentials V4, Vano, V0, V1, and Vcat are applied respectively to the wirings SL, VL, BL, IL, and the wiring CL electrically connected to the common electrode of the light-emitting element 14. The potentials V4, V0, and V1 are thus applied to the first gate (i.e., node A), the second gate (i.e., node B), and one of the source and the drain (i.e., node C) of the transistor 11, respectively.

The potential Vano is preferably higher than the sum of the potential Vcat, the threshold voltage Vthe of the light-emitting element 14, and the threshold voltage Vth of the transistor 11. The potential V0 is preferably much higher than the node C so that the threshold voltage of the transistor 11 can shift in the negative direction. Specifically, as shown in FIG. 9, let the threshold voltage of the transistor 11 when voltage Vbg is 0 be Vth0 and let voltage Vbg corresponding to the potential difference between the node B and the node C be Vbg1. Thus, the threshold voltage Vth of the transistor 11 becomes Vth1 in the period t1. With the above structure, since the transistor 11 becomes normally on, the transistor 11 remains on even when the potential difference between the node A and the node C, i.e., the gate voltage of the transistor 11, is V4−V1.

Note that when the transistor 11 is a p-channel transistor, the potential V0 is preferably much lower than the node C so that the threshold voltage of the transistor 11 can shift in the positive direction. With the above structure, since the transistor 11 becomes normally on, the transistor 11 remains on even when the potential difference between the node A and the node C, i.e., the gate voltage of the transistor 11, is V4−V1.

Next, in a period t2, a low-level potential is applied to the wiring GLa, the high-level potential is applied to the wiring GLb, the low-level potential is applied to the wiring GLc, and a low-level potential is applied to the wiring GLd. Consequently, the transistor 16t is turned on and the transistors 15t, 17t, and 19t are turned off.

The potential Vano and the potential V0 are applied to the wiring VL and the wiring BL, respectively. The potential V0 thus keeps being applied to the node B, and the threshold voltage Vth of the transistor 11 remains negative at the start of the period t2; therefore, the transistor 11 is on. In the period t2, the current path between the wirings VL and IL is cut by the switch 17, and the potentials of the node A and the node C start to increase due to the drain current of the transistor 11. The potential of the node C is increased, and the potential Vbg corresponding to the potential difference between the nodes B and C is then lowered, so that the threshold voltage Vth of the transistor 11 shifts in the positive direction. As the threshold voltage Vth of the transistor 11 closely approaches the gate voltage of the transistor 11, i.e., V4−V1, the transistor 11 is turned off. The potential difference between the node B and the node C when the threshold voltage Vth of the transistor 11 is V4−V1 is V0−V2.

That is, when the potential difference between the nodes B and C is V0−V2, the threshold voltage Vth of the transistor 11 is corrected to V4−V1 so that the drain current converges to 0 with respect to the gate voltage of V4−V1, so that the potential difference between the nodes B and V0−V2 is applied to the capacitor 13.

Next, in a period t3, a high-level potential is applied to the wiring GLa, a high-level potential is applied to the wiring GLb, a low-level potential is applied to the wiring GLc, and a high-level potential is applied to the wiring GLd. As a result, the transistors 15t and 17t are turned on and the transistors 16t and 19t are turned off.

The potential Vano, the potential Vdata containing image data, and the potential V1 are applied to the wiring VL, the wiring SL, and the wiring IL, respectively. The node B is in a floating state. Thus, when the potential of the node C is changed from V2 to V1, the potential of the node B is changed from V0 to V0+V1−V2 by the capacitor 13. Because the capacitor 13 holds the potential difference V0−V2, the threshold voltage Vth of the transistor 11 is maintained at V4−V1. The potential Vdata is applied to the node A, and the gate voltage of the transistor 11 is thus Vdata−V1.

In a period t4, a low-level potential is applied to the wiring GLa, a low-level potential is applied to the wiring GLb, a high-level potential is applied to the wiring GLc, and a high-level potential is applied to the wiring GLd. As a result, the transistor 19t is turned on and the transistors 15t, 16t, and 17t are turned off.

The potentials Vano and Vcat are applied respectively to the wirings VL and CL electrically connected to the common electrode of the light-emitting element 14. In the period t4, the potential of the node C is changed by turning on the transistor 19t. When the potential of the node C is changed to V3, the potentials of the node A and the node B become Vdata+V3−V1 and V0−V2+V3, respectively. Even when the potentials of the nodes A, B, and C are changed, the capacitor 13 and the capacitor 18 hold the potential difference V0−V2 and the potential difference Vdata−V1, respectively. The drain current having a value corresponding to the gate voltage of the transistor 11 flows between the wirings VL and CL. The luminance of the light-emitting element 14 depends on the value of the drain current.

Note that, in the light-emitting device including the pixel 10 illustrated in FIG. 14B, because the other of the source and the drain of the transistor 11 is electrically isolated from the second gate of the transistor 11, their potentials can be individually controlled. When the transistor 11 is normally-on, that is, when the initial threshold voltage Vth0 of the transistor 11 is negative, charge can be accumulated in the capacitor 13 until the potential of the one of the source and the drain of the transistor 11 becomes higher than the potential V0 of the second gate of the transistor 11 in the period t2. As a result, in the light-emitting device of one embodiment of the present invention, even when the transistor 11 is normally-on, the threshold voltage Vth can be corrected to V4−V1 so that the drain current converges to 0 with respect to a gate voltage of V4−V1 in the period t2.

By using an oxide semiconductor for a semiconductor film of the transistor 11, for example, the light-emitting device including the pixel 10 shown in FIGS. 14A and 14B and FIG. 15B in which the other of the source and the drain of the transistor 11 is electrically isolated from the second gate of the transistor 11 can reduce display unevenness and display high-quality images even when the transistor 11 is normally-on.

The above is the operation example of the pixel 10 including internal correction. Described below is an operation of the pixel 10 in the case where variation in luminance among the pixels 10 due to variation in threshold voltages is suppressed by external correction in addition to the internal correction.

The pixel 10 shown in FIG. 14B, in which external correction is performed in addition to internal correction, operates from the period t1 to the period t4 according to the timing chart shown in FIG. 16 and the above description.

In a period t5 which is after the period t4, a low-level potential is applied to the wiring GLa, a low-level potential is applied to the wiring GLb, a low-level potential is applied to the wiring GLc, and a high-level potential is applied to the wiring GLd. As a result, the transistor 17$t$ is turned on and the transistors 15$t$, 16$t$, and 19$t$ are turned off.

The potential Vano and the potential V1 are applied to the wiring VL and the wiring IL. The wiring IL is electrically connected to a monitor circuit.

By the above operation, drain current of the transistor 11 is supplied to the monitor circuit through the transistor 17$t$ and the wiring IL. The monitor circuit generates a signal including information about the value of the drain current by using the drain current flowing through the wiring IL. Thus, using the above signal, the light-emitting device according to one embodiment of the present invention can correct the value of the potential Vdata of the image signal Sig supplied to the pixel 10.

Note that external correction in the period t5 is not necessarily performed after the period t4. For example, in the light-emitting device, the operation in the period t5 may be performed after the operations in the periods t1 to t4 are repeated several times. Alternatively, after the operation in the period t5 is performed on pixels 10 in one row, the light-emitting elements 14 may be brought into a non-light-emitting state by writing image signals corresponding to the lowest grayscale level 0 to the pixels 10 in the row which have been subjected to the above operation. Then, the operation in the period t5 may be performed on pixels 10 in the next row.

The pixel 10 shown in FIG. 14A can also be driven in accordance with the timing chart of FIG. 16 on potentials applied to the wirings GLa, GLb, GLd, and SL. The external correction can also be performed as the pixel in FIG. 14B. Note that in the case of the pixel 10 in FIG. 14A, the potential V0 is preferably set lower than the sum of the potential Vcat, the threshold voltage Vthe of the light-emitting element 14, and the threshold voltage Vth of the transistor 15$t$.

The pixel 10 shown in FIG. 15A can also be driven in accordance with the timing chart of FIG. 16 on potentials applied to the wirings GLa, GLb, GLc, GLd, and SL. The external correction can also be performed as the pixel in FIG. 14B.

The pixel 10 shown in FIG. 15B can also be driven in accordance with the timing chart of FIG. 16 on potentials applied to the wirings GLa, GLb, GLc, and SL. The external correction can also be performed as the pixel in FIG. 14B.

<Structure Example 1 of Transistor>

Next, a transistor in which an oxide semiconductor film is used for a channel formation region, i.e., OS transistor is described.

FIGS. 27A, 27B, and 27C respectively show top views (layouts) and circuit symbols of transistors TA1, TA2, and TB1 with different device structures. FIGS. 28A and 28B are cross-sectional views of the transistors TA1 along line a1-a2 and b1-b2, TA2 along line a3-a4 and b3-b4, and TB1 along line a5-a6 and b5-b6. FIGS. 28A and 28B show cross-sectional structures of the transistors in the channel length direction and the channel width direction, respectively.

As shown in FIGS. 28A and 28B, the transistors TA1, TA2, and TB1 are formed over the same insulating surface and can be formed in the same process. Note that for clarity of the device structures, a wiring for supplying a potential or power to a gate (G), a source (S), and a drain (D) of each transistor is not shown.

The transistor TA in FIG. 27A and the transistor TA2 in FIG. 27B each include a gate (G) and a backgate (BG). One of the gate and the backgate corresponds to a first gate and the other corresponds to a second gate. The backgate of each of the transistors TA1 and TA2 is connected to the gate. In contrast, the transistor TB1 in FIG. 27C does not include a backgate. As shown in FIGS. 28A and 28B, these transistors TA1, TA2, and TB1 are formed over a substrate 30. The structures of the transistors will be described with reference to FIGS. 27A to 27C and FIGS. 28A and 28B.

(Transistor TA1)

The transistor TA1 includes a gate electrode GE1, a source electrode SE1, a drain electrode DE1, a backgate electrode BGE1, and an oxide semiconductor film OS1.

In the description below, elements and components of the elements may be abbreviated; for example, the transistor TA1 is referred to as TA1, the backgate is BG, the oxide semiconductor film OS1 is OS1 or a film OS1. Potentials, signals, circuits, and the like may also be similarly abbreviated.

The channel length of an OS transistor corresponds to the distance between a source electrode and a drain electrode in this embodiment. The channel width of the OS transistor corresponds to the length of the source electrode or the drain electrode in a region where an oxide semiconductor film and a gate electrode overlap with each other. The channel length and the channel width of the transistor TA1 are represented by La1 and Wa1, respectively.

A film OS1 overlaps an electrode GE1 with an insulating film 34 provided therebetween. A pair of electrodes (SE1 and DE1) is formed in contact with the upper surface and the side surfaces of the film OS1. As shown in FIG. 27A, the film OS1 includes a region overlapping with neither the electrode GE1 nor the pair of electrodes (SE1 and DE1). The length in the channel length direction of the film OS1 is longer than the channel length La1 and the length in the channel width direction is longer than the channel width Wa1.

An insulating film 35 is formed to cover the film OS1, the electrodes GE1, SE1, and DE1. The electrode BGE1 is formed over the insulating film 35. The electrode BGE1 overlaps the film OS1 and the electrode GE1. Here, the electrode BGE1 has the same shape as the electrode GE1 and is located in the same position as the electrode GE1. The electrode BGE1 is in contact with the electrode GE1 through an opening CG1 in the insulating films 34, 35 and 36. With this structure, the gate is electrically connected to the backgate of the transistor TA1.

The backgate electrode BGE1 is connected to the gate electrode GE1, so that the on-state current of the transistor TA1 can be increased. The strength of the transistor TA1 can be increased with the backgate BGE1. When the substrate 30 is deformed like bending, the electrode BGE1 serves as a reinforcement member to prevent the transistor TA1 from being broken.

The film OS1 including a channel formation region has a multilayer structure; here, three oxide semiconductor films 31, 32, and 33 are stacked as an example. The oxide semiconductor films forming the film OS1 are preferably metal oxide films containing at least one metal element that is the same, more preferably containing In. As metal oxide containing In which can be used as the semiconductor film of the transistor, an In—Ga oxide film and an In-M-Zn oxide film (M is Al, Ga, Y, Zr, La, Ce, or Nd) are typical examples. Another element or material may be added to these metal oxide films.

The film "32" includes a channel formation region of the transistor TA1. The film "33" also includes a channel formation region of the transistor TA2 and TB1, which are described later. An oxide semiconductor film with an appropriate composition may be used depending on electrical characteristics (e.g., field-effect mobility and threshold voltage) required of the transistors TA2 and TB1. For example, the composition of metal elements contained as main components in the oxide semiconductor films 31 and 32 is preferably adjusted so that a channel is formed in "33".

Since a channel is formed in "32" of the transistor TA1, the channel formation region is not in contact with the insulating films 34 and 35. When the oxide semiconductor films 31 and 32 are metal oxide films containing at least one common metal element, interface scattering is unlikely to occur at the interface between "32" and "31" and the interface between "32" and "33". The field-effect mobility of the transistor TA1 can be thus higher than those of the transistor TA2 and TBT, and in addition, the drain current in an on-state (on-state current) can be increased.

(Transistor TA2)

The transistor TA2 includes a gate electrode GE2, a source electrode SE2, a drain electrode DE2, a backgate electrode BGE2, and an oxide semiconductor film OS2. The electrode BGE2 is in contact with the electrode GE2 through an opening CG2 formed in the insulating films 34 to 36. The transistor TA2 is a modification example of the transistor TA1; unlike in the transistor TA1, the film OS2 of the transistor TA2 is a single layer of the oxide semiconductor film 33, and other points are the same. A channel length La2 and a channel width Wa2 of the transistor TA2 are equal to the channel length La1 and the channel width Wa1 of the transistor TA1, respectively.

(Transistor TB1)

The transistor TB1 includes a gate electrode GE3, a source electrode SE3, a drain electrode DE3, and an oxide semiconductor film OS3. The transistor TB1 is a modification example of the transistor TA2. Like in the transistor TA2, a film OS3 of the transistor TB1 is formed with a single-layer structure of the oxide semiconductor film 33. Unlike the transistor TA2, the transistor TB1 does not include a backgate electrode. In addition, the layout of the film OS3 and the electrodes GE3, SE3, and DE3 is different. As shown in FIG. 27C, regions of the film OS3 not overlapping with the electrode GE3 overlap with the electrode SE3 or DE3. A channel width Wb1 of the transistor TB1 is thus determined by the width of the film OS3. A channel length Lb1 is determined by the distance between the electrodes SE3 and DE3 like in the transistor TA2, and is longer than the channel length La2 of the transistor TA2.

[Insulating Film]

The insulating films 34, 35, and 36 are formed over the entire regions over the substrate 30 where the transistors TA1, TA2, and TB1 are formed. Each of the insulating films 34, 35, and 36 is a single film or multilayer film. The insulating film 34 serves as a gate insulating film of the transistors TA1, TA2, and TB1. The insulating films 35 and 36 each serve as a gate insulating film on the backchannel side of the transistors TA1, TA2, and TB1. The insulating film 36, which is the uppermost film, is preferably formed using a material that allows it to serve as a protective film of a transistor over the substrate 30. The insulating film 36 is provided if necessary. In order to insulate the electrode BGE1 in the third layer from the electrodes SE1 and DE1 in the second layer, at least one insulating film is formed therebetween.

The insulating films 34 to 36 can be formed with a single layer of insulating film or a multilayer of two or more insulating films. Examples of the insulating film used for the insulating films 34 to 36 include an aluminum oxide film, a magnesium oxide film, a silicon oxide film, a silicon oxynitride film, a silicon nitride oxide film, a silicon nitride film, a gallium oxide film, a germanium oxide film, a yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method.

[Oxide Semiconductor Film]

In this embodiment, an oxide semiconductor film used for a semiconductor film of an OS transistor is described. In the case where the semiconductor film is multilayer like the film OS1, the oxide semiconductor films forming the multilayer semiconductor film are preferably metal oxide films containing at least one metal element that is the same, more preferably containing In.

When "31" is an In—Ga oxide film, for example, the atomic proportion of In is set smaller than that of Ga. When "31" is an In-M-Zn oxide film (M is Al, Ga, Y, Zr, La, Ce, or Nd), the atomic proportion of In is set smaller than the atomic proportion of M, and the atomic proportion of Zn can be the largest among the three.

When "32" is an In—Ga oxide film, for example, the atomic proportion of In is set larger than the atomic proportion of Ga. When "32" is an In-M-Zn oxide film, the atomic proportion of In is set larger than the atomic proportion of M. In the case of an In-M-Zn oxide film, the atomic proportion of In is preferably larger than the atomic proportions of M and Zn.

When "33" is an In—Ga oxide film, for example, the atomic proportion of In is set equal to or smaller than the atomic proportion of Ga. When "33" is an In-M-Zn oxide film, the atomic proportion of In is set equal to the atomic proportion of M, and the atomic proportion of Zn can be larger than those of In and M. Here, "33" is also a film including channel formation regions of the transistors TA2 and TB1 described later.

When the oxide semiconductor films 31 to 33 are formed by sputtering, the atomic proportions of the films can be adjusted by adjusting the atomic proportions or the like of the target compositions. When the oxide semiconductor films 31 to 33 are formed by CVD, the atomic proportions of the films can be adjusted by adjusting the flow rates of source gases or the like. A deposition target for forming In-M-Zn oxide films by sputtering as the oxide semiconductor films 31 to 33 will be described below as an example. In order to form these films, an In-M-Zn oxide target is used.

When the atomic proportion of metal elements of a target for "31" is In:M:Zn=$x_1$:$y_1$:$z_1$, $x_1/y_1$ is preferably greater than or equal to ⅙ and less than 1; $z_1/y_1$ is greater than or equal to ⅓ and less than or equal to 6, preferably greater than or equal to 1 and less than or equal to 6.

Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, In:M:Zn=1:6:8, and the like.

When the atomic proportion of metal elements of a target for "32" is In:M:Zn=$x_2$:$y_2$:$z_2$, $x_2/y_2$ is preferably greater than 1 and less than or equal to 6; $z_2/y_2$ is greater than 1 and less than or equal to 6. Typical examples of the atomic ratio of the metal elements of the target are In:M:Zn=2:1:1.5, 2:1:2.3, 2:1:3, 3:1:2, 3:1:3, 3:1:4, or the like.

When the atomic proportion of metal elements of a target for "33" is In:M:Zn=$x_3$:$y_3$:$z_3$, $x_3/y_3$ is preferably greater than or equal to ⅙ and less than or equal to 1; $z_3/y_3$ is greater than or equal to ⅓ and less than or equal to 6, more preferably greater than or equal to 1 and less than or equal to 6. Typical examples of the atomic ratio of the metal elements of the target are In:M:Zn=1:1:1, 1:1:1.2, 1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, 1:6:8, or the like.

When the atomic ratio of metal elements of an In-M-Zn oxide deposition target is In:M:Zn=x:y:z, $1 \leq z/y \leq 6$ is preferably satisfied because a CAAC-OS film is easily formed as an In-M-Zn oxide film. Note that the CAAC-OS film is described later.

Oxide semiconductor films with low carrier density are used as the oxide semiconductor films 31 to 33. For example, an oxide semiconductor film whose carrier density is $1\times10^{17}/cm^3$ or lower, preferably $1\times10^{15}/cm^3$ or lower, more preferably $1\times10^{13}/cm^3$ or lower, particularly preferably lower than $8\times10^{11}/cm^3$, still further preferably lower than $1\times10^{11}/cm^3$, yet further preferably lower than $1\times10^{10}/cm^3$, and is $1\times10^{-9}/cm^3$ or higher is used as the oxide semiconductor films 31 to 33.

Note that it is preferable to use, as the oxide semiconductor films 31 to 33, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. As examples of the impurities, hydrogen, nitrogen, alkali metal, alkaline earth metal, and the like are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated. In some cases, bonding of part of hydrogen to oxygen bonded to a metal element causes generation of an electron serving as a carrier. Thus, a transistor including a hydrogen-containing oxide semiconductor is likely to be normally on.

It is thus preferable that hydrogen be reduced as much as possible as well as the oxygen vacancies in the oxide semiconductor films 31 to 33. Specifically, in the oxide semiconductor films 31 to 33, the concentration of hydrogen which is measured by secondary ion mass spectrometry (SIMS) is set to lower than or equal to $5\times10^{19}$ atoms/cm³, preferably lower than or equal to $1\times10^{19}$ atoms/cm³, preferably lower than $5\times10^{18}$ atoms/cm³, preferably $1\times10^{18}$ atoms/cm³ or lower, more preferably $5\times10^{17}$ atoms/cm³ or lower, still more preferably $1\times10^{16}$ atoms/cm³ or lower.

When the oxide semiconductor films 31 to 33 contain silicon or carbon, which is an element belonging to Group 14, oxygen vacancies in the films are increased, so that the films have n-type conductivity. For this reason, the concentration of silicon or carbon (the concentration is measured by SIMS) of each of the oxide semiconductor films 31 to 33 is set lower than or equal to $2\times10^{18}$ atoms/cm³, preferably lower than or equal to $2\times10^{17}$ atoms/cm³.

The concentration of alkali metal or alkaline earth metal in the oxide semiconductor films 31 to 33, which is measured by SIMS, is set to be lower than or equal to $1\times10^{18}$ atoms/cm³, preferably lower than or equal to $2\times10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 31 to 33.

When containing nitrogen, the oxide semiconductor films 31 to 33 easily have an n-type region by generation of electrons serving as carriers and an increase of carrier density. Thus, a transistor including an oxide semiconductor which contains nitrogen is likely to be normally on, and the content of nitrogen in the oxide semiconductor films 31 to 33 is preferably reduced as much as possible. For example, the nitrogen concentration which is measured by SIMS is preferably set, for example, lower than or equal to $5\times10^{18}$ atoms/cm³.

Without limitation to the oxide semiconductor films 31 to 33 described above, other oxide semiconductor films with appropriate compositions can be used depending on required semiconductor characteristics and electrical characteristics (e.g., field-effect mobility and threshold voltage) of transistors. To obtain the required semiconductor characteristics and electrical characteristics of the transistor, it is preferable that the carrier density, the impurity concentration, the defect density, the atomic ratio of metal elements and oxygen, the interatomic distance, the density, and the like of the oxide semiconductor films 31 to 33 be set to appropriate values.

The field-effect mobility of the transistor TA1 can be increased because a channel is formed in the oxide semiconductor film 32 in which the atomic proportion of In is larger than the atomic proportion of Ga or M (M is Al, Ga, Y, Zr, La, Ce, or Nd). For example, the field-effect mobility is higher than 10 cm$^2$/Vs and lower than 60 cm$^2$/Vs, preferably 15 cm$^2$/Vs or higher and lower than 50 cm$^2$/Vs. The transistor TA1 is thus preferably used in a driver circuit which needs to operate at high speed in an active matrix display device.

The transistor TA1 is preferably provided in a shielded region. Furthermore, the driving frequency of a driver circuit including the transistor TA1 with high field-effect mobility can be increased, so that a display device with higher definition is achieved.

The field-effect mobility of the transistors TA2 and TB1 in which a channel formation region is formed in the oxide semiconductor film 33 is approximately 3 cm$^2$/Vs or higher and 10 cm$^2$/Vs or lower, which is lower than that of the transistor TA1. Because the transistors TA2 and TB1 do not include the oxide semiconductor film 32, they are less degraded by light than the transistor TA1 and thus the amount of off-state current increased by light irradiation is small. For this reason, the transistors TA2 and TB1 in which a channel formation region is formed in the oxide semiconductor film 33 are preferably used for a pixel portion, which is irradiated with light.

The amount of off-state current increased by light irradiation is likely to be large in the transistor TA1 as compared to the transistor TA2 not including the oxide semiconductor film 32. This is a reason why the transistor TA1 is suitable for a peripheral driver circuit, which is less influenced by light than a pixel portion, which cannot be sufficiently shielded from light. Needless to say, a transistor like the transistors TA2 and TB1 can be provided in a driver circuit.

The structures of transistors and oxide semiconductor films are not limited to those of the transistors TA1, TA2, and TB1 and the oxide semiconductor films 31 to 33 described above, and the structure of the transistor can be changed depending on the required semiconductor characteristics and electrical characteristics of the transistor. For example, the presence or absence of a backgate electrode, a stacked-layer structure of an oxide semiconductor film, the shapes and positions of an oxide semiconductor film, a gate electrode, and source and drain electrodes, and the like can be appropriately changed.

(Structure of Oxide Semiconductor)

A structure of an oxide semiconductor is described below.

In this specification, the term "parallel" indicates that the angle formed between two straight lines is greater than or equal to −10° and less than or equal to 10°, and thus also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into, for example, a non-single-crystal oxide semiconductor film and a single crystal oxide semiconductor film or into a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

From the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged to be parallel to the formation surface or the top surface of the CAAC-OS film.

On the other hand, from the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. When the CAAC-OS film including an InGaZnO$_4$ crystal is analyzed by an out-of-plane method, for example, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. In the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The OS transistor can achieve extremely favorable off-state current characteristics.

[Substrate 30]

The type of the substrate 30 is not limited to a certain type, and any of a variety of substrates can be used as the substrate 30. Examples of the substrate 30 include a semiconductor substrate (e.g., a single crystal substrate or a silicon substrate), an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, a bonding film, paper containing a fibrous material, and a base film. As an example of a glass substrate, a barium borosilicate glass substrate, an aluminoborosilicate glass substrate, a soda lime glass substrate, or the like can be given. Examples of a flexible substrate, a flexible substrate, an attachment film, a base film, or the like are as follows: a plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

A base insulating film may be formed over the substrate 30 before the gate electrodes GE1, GE2, and GE3 are formed. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as a base insulating film, it is possible to suppress diffusion of impurities (typically, an alkali metal, water, hydrogen, and the like) into the oxide semiconductor films OS1 to OS3 from the substrate 30.

[Gate Electrode GE1, GE2, and GE3]

The gate electrodes GE1, GE2, and GE3 are a single-layer conductive film or multilayer conductive film. The conductive film of the gate electrodes GE1, GE2, and GE3 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. Alternatively, an alloy film or a nitride film in which aluminum and one or more elements selected from titanium, tantalum, tungsten, molybdenum, chromium, neodymium, and scandium are combined may be used. The conductive film can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide.

An aluminum film containing silicon can be formed as the gate electrodes GE1, GE2, and GE3, for example. For the gate electrodes GE1, GE2, and GE3, for example, a two-layer structure where a titanium film is formed over an aluminum film, a titanium film is formed over a titanium nitride film, a tungsten film is formed over a titanium nitride film, or a tungsten film is formed over a tantalum nitride film or a tungsten nitride film can be used. Alternatively, a three-layer structure where an aluminum film is sandwiched between titanium films may be employed for the gate electrodes GE1, GE2, and GE3.

The gate electrodes GE1, GE2, and GE3 are formed by a sputtering method, a vacuum evaporation method, a pulsed laser deposition (PLD) method, a thermal CVD method, or the like.

Note that a tungsten film can be formed with a deposition apparatus utilizing an ALD method. In that case, a WF$_6$ gas and a B$_2$H$_6$ gas are sequentially introduced more than once to form an initial tungsten film, and then a WF$_6$ gas and an H$_2$ gas are introduced at a time, so that a tungsten film is formed. Note that an SiH$_4$ gas may be used instead of a B$_2$H$_6$ gas.

Note that the gate electrodes GE1 to GE3 can be formed by an electrolytic plating method, a printing method, an ink-jet method, or the like instead of the above formation method.

[Insulating Film 34 (Gate Insulating Film)]

The insulating film 34 is formed to cover the gate electrodes GE1 to GE3. The insulating film 34 is a single layer or a multilayer (two or more layers). An oxide insulating film, a nitride insulating film, an oxynitride insulating film, a nitride oxide insulating film, or the like can be used as the insulating film 34. In this specification, oxynitride refers to a substance which includes more oxygen than nitrogen, and nitride oxide refers to a substance which includes more nitrogen than oxygen.

As the insulating film 34, an insulating film including silicon oxide, silicon oxynitride, silicon nitride oxide, silicon nitride, aluminum oxide, hafnium oxide, gallium oxide, a Ga—Zn-based metal oxide, or the like can be used. A film including a high-k material such as hafnium silicate (Hf-SiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide may be used as the insulating film, in which case gate leakage current of the transistor can be reduced.

Since the insulating film 34 is included in a gate insulating film, regions of the insulating film 34 that are in contact with the oxide semiconductor films OS1, OS2, and OS3 are preferably formed using an oxide insulating film or an oxynitride insulating film in order to improve the interface characteristics between the oxide semiconductor films OS1, OS2, and OS3 and the gate insulating film. For example, the uppermost film of the insulating film 34 is a silicon oxide film or a silicon oxynitride film.

The thickness of the insulating film 34 is, for example, 5 nm to 400 nm, inclusive, preferably 10 nm to 300 nm, inclusive, further preferably 50 nm to 250 nm, inclusive.

In the case where the oxide semiconductor films OS1 to OS3 is formed by sputtering, a power source for generating plasma can be an RF power source, an AC power source, a DC power source, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen to a rare gas is preferably increased.

A target may be appropriately selected in accordance with the composition of the oxide semiconductor films OS1 to OS3.

For example, in the case where the oxide semiconductor films OS1 to OS3 are formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the amount of hydrogen, water, or the like entering the oxide semiconductor film can be reduced and the oxide semiconductor films 31 and 32 can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

It is also preferable that the proportion of oxygen in the deposition gas be increased and the power be optimized in order to reduce plasma damage at the deposition. The proportion of oxygen in the deposition gas is 30 vol % or higher, preferably 100 vol %.

By forming the oxide semiconductor film while it is heated or performing heat treatment after the formation of the oxide semiconductor film, the hydrogen concentration of the oxide semiconductor film can be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than $5\times10^{18}$ atoms/cm$^3$, further preferably lower than or equal to $1\times10^{18}$ atoms/cm$^3$, yet preferably lower than or equal to $5\times10^{17}$ atoms/cm$^3$, furthermore preferably lower than or equal to $1\times10^{16}$ atoms/cm$^3$.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

For example, in the case where an oxide semiconductor film, e.g., an InGaZnO$_X$ (X>0) film is formed using a deposition apparatus employing ALD, an In(CH$_3$)$_3$ gas and an O$_3$ gas) are sequentially introduced plural times to form an InO$_2$ layer, a Ga(CH$_3$)$_3$ gas and an O$_3$ gas) are introduced at a time to form a GaO layer, and then a Zn(CH$_3$)$_2$ gas and an O$_3$ gas) are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas), it is preferable to use an O$_3$ gas), which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. A Zn(CH$_3$)$_2$ gas may be used.

Example 1

The oxide semiconductor films 32 and 33 are each a film where a channel of a transistor is formed and the thickness of each film can be 3 nm to 200 nm, inclusive, preferably 3 nm to 100 nm, inclusive, more preferably 30 nm to 50 nm, inclusive. The thickness of the oxide semiconductor film 31 is, for example, 3 nm to 100 nm, inclusive, preferably 3 nm to 30 nm, inclusive, more preferably 3 nm to 15 nm, inclusive. The thickness of the oxide semiconductor film 31 is preferably smaller than those of the oxide semiconductor films 32 and 33.

Here, In—Ga—Zn films are deposited by sputtering as the oxide semiconductor films 31, 32, and 33. The atomic ratio of metal elements (In:Ga:Zn) of a target for depositing the films is, for example, 1:3:6 for the oxide semiconductor film 31, 3:1:2 for the oxide semiconductor film 32, and 1:1:1.2 or 1:1:1 for the oxide semiconductor film 33. The thicknesses of the oxide semiconductor films 31, 32, and 33 are 5 nm, 35 nm, and 35 nm, respectively.

[Source Electrode and Drain Electrode]

The electrodes SE1, DE1, SE2, DE2, SE3, and DE3 can be formed in a manner similar to those of the gate electrodes GE1, GE2, and GE3.

For example, a 50-nm-thick copper-manganese alloy film, a 400-nm-thick copper film, and a 100-nm-thick copper-manganese alloy film are stacked in this order by sputtering, and three-layer electrodes SE1, DE1, SE2, DE2, SE3, and DE3 can be formed.

The channel length of a transistor operated at high speed, such as a transistor used in a driver circuit or the like in a light-emitting device, is preferably short like in the transistors TA1 and TA2 or the transistors TA3, TA4, and TC1. The channel length of such a transistor is preferably smaller than 2.5 μm, for example, smaller than or equal to 2.2 μm. The channel length of the transistor in this embodiment depends on the distance between a source electrode and a drain electrode, and the minimum value of the channel length is limited by processing accuracy of a conductive film to be the electrodes SE1, DE1, SE2, DE2, SE3, and DE3. The channel length the transistor in this embodiment can thus be 0.5 μm or more, or 1.0 μm or more, for example.

[Insulating Films 35, 36]

A two-layer insulating film can be formed as "35", for example. Here, the first film of "35" is referred to as an insulating film 35a and the second film is referred to as an insulating film 35b.

As the insulating film 35a, an oxide insulating film including silicon oxide or the like, or an oxide insulating film containing nitrogen and fewer defects can be formed. Typical examples of the oxide insulating film containing nitrogen and fewer defects include a silicon oxynitride film and an aluminum oxynitride film.

In an ESR spectrum at 100 K or lower of the oxide insulating film with a small number of defects, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 correspond to signals attributed to nitrogen oxide (NO$_x$; x is greater than or equal to 0 and smaller than or equal to 2, preferably greater than or equal to 1 and smaller than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

When the insulating film 35a contains a small amount of nitrogen oxide, the carrier trap at the interface between the insulating film 35a and the layers OS1, OS2, and OS3 can be reduced. As a result, a shift in the threshold voltage of the transistor can be reduced, which leads to a reduced change in the electrical characteristics of the transistor.

In order to improve the reliability of the transistor, the insulating film 35a preferably has a nitrogen concentration measured by secondary ion mass spectrometry (SIMS) of lower than or equal to $6\times10^{20}$ atoms/cm$^3$. This is because nitrogen oxide is unlikely to be generated in the insulating film 35a through the manufacturing process of the transistor.

A silicon oxynitride film, which is an example of an oxide insulating film containing nitrogen and few defects, can be formed by CVD as the insulating film 35a. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

An oxide insulating film containing nitrogen and having a small number of defects can be formed as the insulating film 35a by CVD under the conditions that the ratio of an oxidizing gas to a deposition gas is higher than 20 times and lower than 100 times, preferably higher than or equal to 40 times and lower than or equal to 80 times and pressure in a treatment chamber is lower than 100 Pa, preferably lower than or equal to 50 Pa.

The insulating film 35b can be formed using an oxide insulating film whose oxygen content is in excess of that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 35b. When the insulating film 35b is formed using an oxide insulating film which contains oxygen at a higher proportion than that in the stoichiometric composition, a silicon oxynitride film is formed as the oxide insulating film by CVD.

The conditions for depositing a silicon oxide film or a silicon oxynitride film as the insulating film 35b will be described. The substrate placed in a treatment chamber of the plasma CVD apparatus, which is vacuum-evacuated, is held at a temperature higher than or equal to 180° C. and lower than or equal to 280° C., preferably higher than or equal to 200° C. and lower than or equal to 240° C., the pressure is set greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm², preferably higher than or equal to 0.25 W/cm² and lower than or equal to 0.35 W/cm² is supplied to an electrode provided in the treatment chamber.

As the insulating film 36, a film having an effect of blocking at least hydrogen and oxygen is used. Preferably, the insulating film 36 has an effect of blocking oxygen, hydrogen, water, an alkali metal, an alkaline earth metal, or the like. Typically, a nitride insulating film such as a silicon nitride film, a silicon nitride oxide film, an aluminum nitride film, or an aluminum nitride oxide film can be used.

The insulating film 36 may include an oxide insulating film having a blocking effect against oxygen, hydrogen, water, and the like, i.e., an insulating film including aluminum oxide, aluminum oxynitride, gallium oxide, gallium oxynitride, yttrium oxide, yttrium oxynitride, hafnium oxide, or hafnium oxynitride.

The thickness of the insulating film 36 may be greater than or equal to 50 nm and less than or equal to 300 nm, preferably greater than or equal to 100 nm and less than or equal to 200 nm. The insulating film 36 that has an effect of blocking oxygen, hydrogen, water, and the like can prevent oxygen diffusion from the oxide semiconductor films 31 to 33 to the outside, and entry of hydrogen, water, and the like from the outside to the oxide semiconductor films 31 to 33.

In the case where a silicon nitride film is formed by the plasma CVD method as the insulating film 36, a deposition gas containing silicon, nitrogen, and ammonia are preferably used as a source gas. These source gases are used, and ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, more preferably greater than or equal to 10 and less than or equal to 50.

Heat treatment may be performed after the insulating film 35 is formed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, oxygen contained in the oxide insulating film which is the second layer of the insulating film 35 can move to the oxide semiconductor films 31 to 33, so that the amount of oxygen vacancies contained in these oxide semiconductor films can be reduced. The heat treatment is performed at 350° C. in a mixed atmosphere containing nitrogen and oxygen for one hour.

Heat treatment to release hydrogen or the like from the oxide semiconductor films 31 to 33 may be performed after the insulating film 36 is formed. The heat treatment may be performed at 350° C. in a mixed atmosphere containing nitrogen and oxygen for one hour.

[Backgate Electrode]

The backgate electrodes BGE1 and BGE2 can be formed in a manner similar to those of the gate electrodes GE1, GE2, and GE3.

In this embodiment, other structure examples of transistors will be described.

(Transistors TA3 and TA4)

Figure 29A:
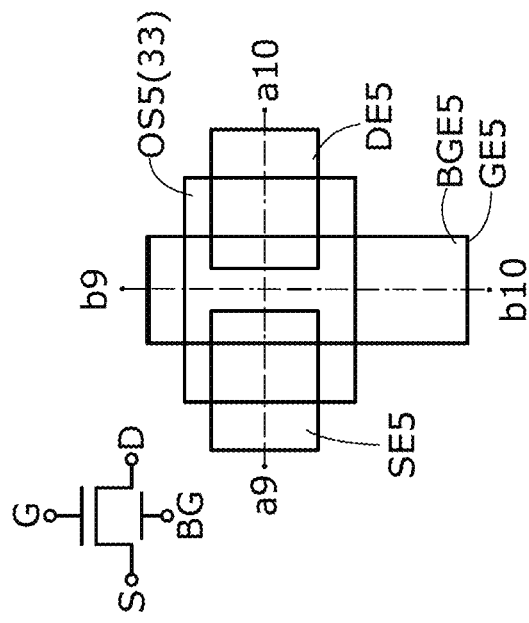
FIGS. 29A and 29B are top views illustrating a transistor.
Figure 29B:
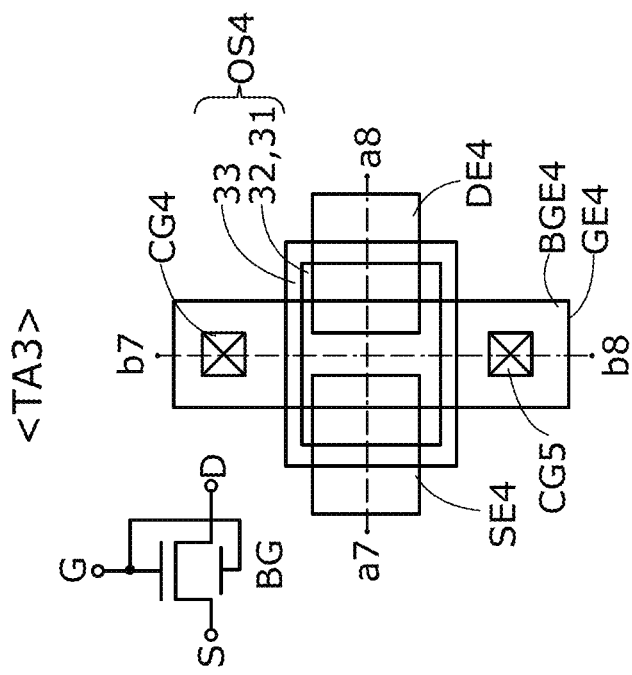
Figure 30A:
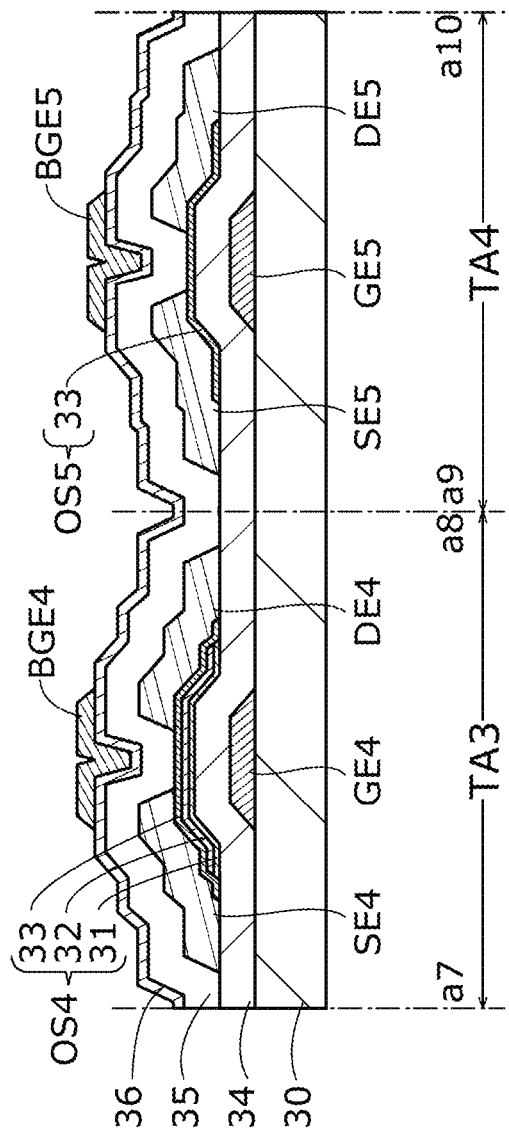
FIGS. 30A and 30B are cross-sectional views of a transistor.
Figure 30B:
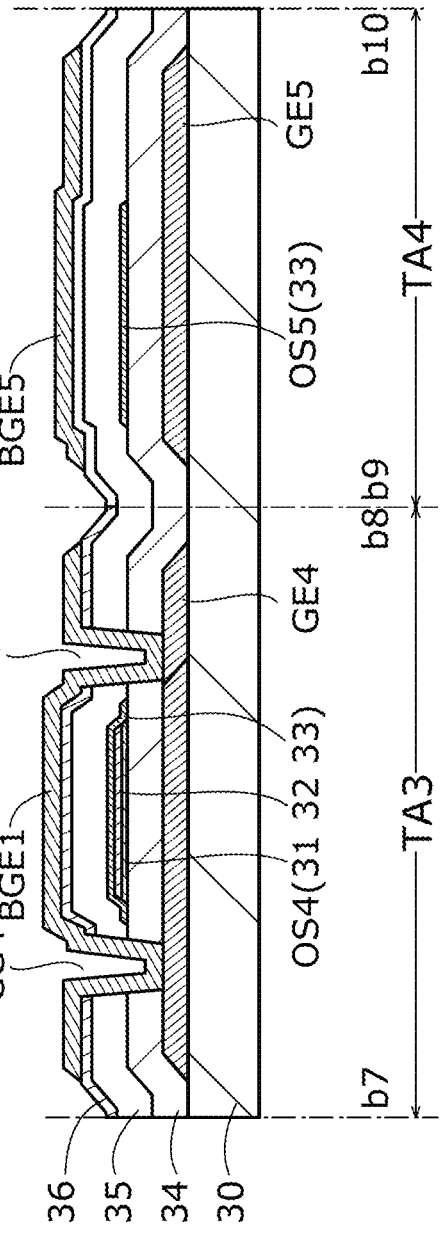

FIGS. 29A and 29B respectively show top views (layouts) and circuit symbols of transistors TA3 and TA4. FIGS. 30A and 30B are cross-sectional views of the transistors TA3 along line a7-a8 and b7-b8 and TA4 along line a9-a10 and b9-b10.

The transistor TA3 includes a gate electrode GE4, an oxide semiconductor film OS4, a source electrode SE4, a drain electrode DE4, and a backgate electrode BGE4. The transistor TA3 is a modification example of the transistor TA1. The transistor TA3 is similar to the transistor TA1 except that the electrode BGE4 is in contact with the electrode GE4 through two openings CG4 and CG5. As shown in FIG. 30B, the film OS4 is surrounded by the electrodes GE4 and BGE4 in the channel width direction, which increases the strength of the transistor TA3.

The transistor TA4 includes a gate electrode GE5, an oxide semiconductor film OS5, a source electrode SE5, a drain electrode DE5, and a backgate electrode BGE5. The transistor TA4 is a modification example of the transistor TA2. Unlike in the transistor TA2, the electrode BGE5 is not connected to the electrode GE5 and thus different signals or potentials can be input to each of the electrode BGE5 and the electrode GE5. For example, a signal for controlling conduction of the transistor TA4 is input to the electrode GE5, whereas a signal or a potential for correcting the threshold voltage of the transistor TA4 is input to the electrode BGE5.

(Transistors TC1, TB2, and TD1)

FIGS. 31A, 31B, and 31C show top views (layouts) and circuit symbols of the transistors TC1, TB2, and TD1, respectively. FIGS. 32A and 32B are cross-sectional views of the transistors TC1 along line a11-a12 and b11-b12, TB2 along line a13-a14 and b13-b14, and TD1 along line a15-a16 and b15-b16.

The transistor TC1 includes a gate electrode GE6, an oxide semiconductor film OS6, a source electrode SE6, a drain electrode DE6, and a backgate electrode BGE6. The electrode BGE6 is in contact with the electrode GE6 through an opening CG6. The transistor TC1 is a modification example of the transistor TA1, in which the film OS6 has a two-layer structure of "32" and "33". A channel formation region of the transistor TC1 is formed in "32", like in the transistor TA1. The field-effect mobility of the transistor TC1 is thus as high as that of the transistor TA1, i.e., for example, greater than 10 cm²/V·s and less than 60 cm²/V·s, preferably greater than or equal to 15 cm²/V·s and less than 50 cm²/V·s. Like the transistor TA1, the transistor TC1 is also suitable as a high-speed transistor in a driver circuit.

The transistor TB2 includes a gate electrode GE7, an oxide semiconductor film OS7, a source electrode SE7, a drain electrode DE7, and a backgate electrode BGE7. The electrode BGE7 is in contact with the electrode GE7 through an opening CG7. The transistor TB2 is a modification example of the transistor TB1 and differs from the transistor TB1 in including the electrode BGE7. Since the transistor TB2 includes the electrode BGE7 connected to the electrode GE7, the transistor TB2 has higher on-state current and higher mechanical strength than the transistor TB1.

The transistor TD1 includes a gate electrode GE8, an oxide semiconductor film OS8, a source electrode SE8, and a drain electrode DE8. The transistor TD1 is a modification example of the transistor TB1 and differs from the transistor TB1 in that the entire film OS8 overlaps the electrode GE8 and the film OS8 does not exist outside the end portion of the electrode GE8. With this structure, the transistor TD1 is suitable for a pixel portion because the film OS8 in the transistor TD1 is less exposed to light than in the transistor TB1.

Films of the transistors TA1, TA2, and TB1 (e.g., an insulating film, an oxide semiconductor film, a metal oxide film, and a conductive film) can be formed by sputtering, chemical vapor deposition (CVD), vacuum vapor deposition, or pulsed laser deposition (PLD). Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetitions of the sequence of the gas introduction; therefore, an ALD method makes it possible to accurately adjust a thickness and thus is suitable for manufacturing a minute FET.

<Specific Structure Example 3 of Pixel>

Figure 17:
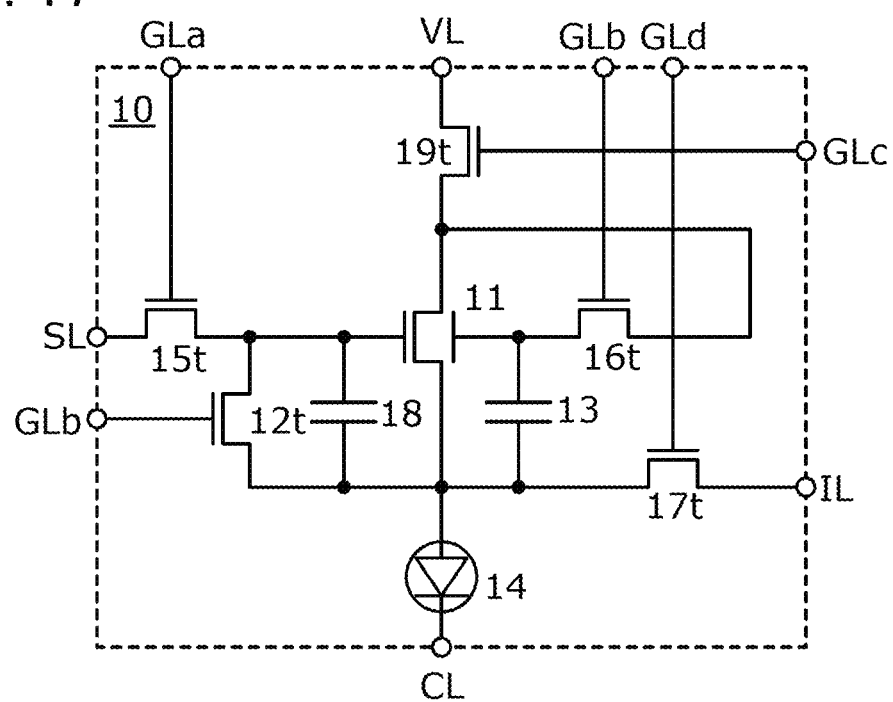
FIG. 17 illustrates a structure of a pixel.

FIG. 17 shows a specific structure example of the pixel 10 shown in FIG. 1. The pixel 10 in FIG. 17 differs from the pixel 10 in FIG. 4A in the position of the transistor 19t. Specifically, the pixel 10 in FIG. 17 differs from the pixel 10 in FIG. 4A in that the transistor 19t is connected to the wiring VL, the other of the source and the drain of the transistor 11, and one of the source and the drain of the transistor 16t.

Figure 18:
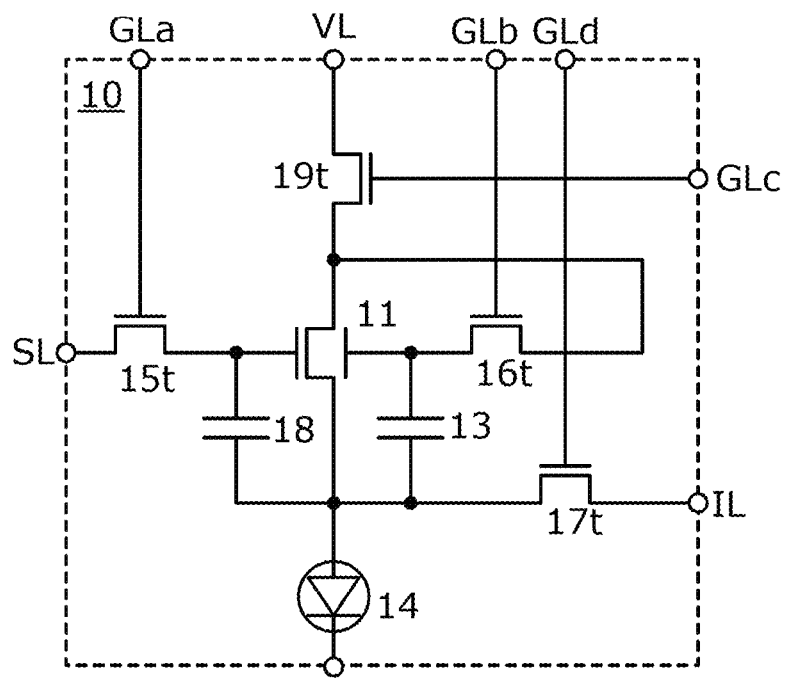
FIG. 18 illustrates a structure of a pixel.

FIG. 18 is a structure example of the pixel 10 shown in FIG. 1. The pixel 10 in FIG. 18 differs from the pixel 10 in FIG. 15A in the position of the transistor 19t. Specifically, the pixel 10 in FIG. 18 differs from the pixel 10 in FIG. 15A in that the transistor 19t is connected to the wiring VL, the other of the source and the drain of the transistor 11, and one of the source and the drain of the transistor 16t.

A transistor other than the transistor 11 in the pixel 10 of the light-emitting device of one embodiment of the present invention includes a gate at least on one side of the semiconductor film, but may further include another gate overlapping the gate with the semiconductor film provided therebetween. When a transistor other than the transistor 11 includes a pair of gates, potentials at the same level may be applied to one of the pair of gates, i.e., normal gate and the other thereof, i.e., backgate, or a fixed potential such as a ground potential may be applied only to the backgate. By adjusting the level of the potential applied to the backgate, the threshold voltage of the transistor can be controlled. By providing the backgate, a channel formation region is enlarged and the drain current can be increased, and a depletion layer is likely to be formed in the semiconductor film, which results in lower subthreshold swing.

<Structure Example 2 of Transistor>

The transistor used in the light-emitting device of one embodiment of the present invention may include a channel formation region in the semiconductor film or a semiconductor substrate of silicon, germanium, or the like in an amorphous, microcrystalline, polycrystalline, or single crystal state. In the case where the transistors are formed using a thin silicon film, any of the following can be used: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Figure 34:
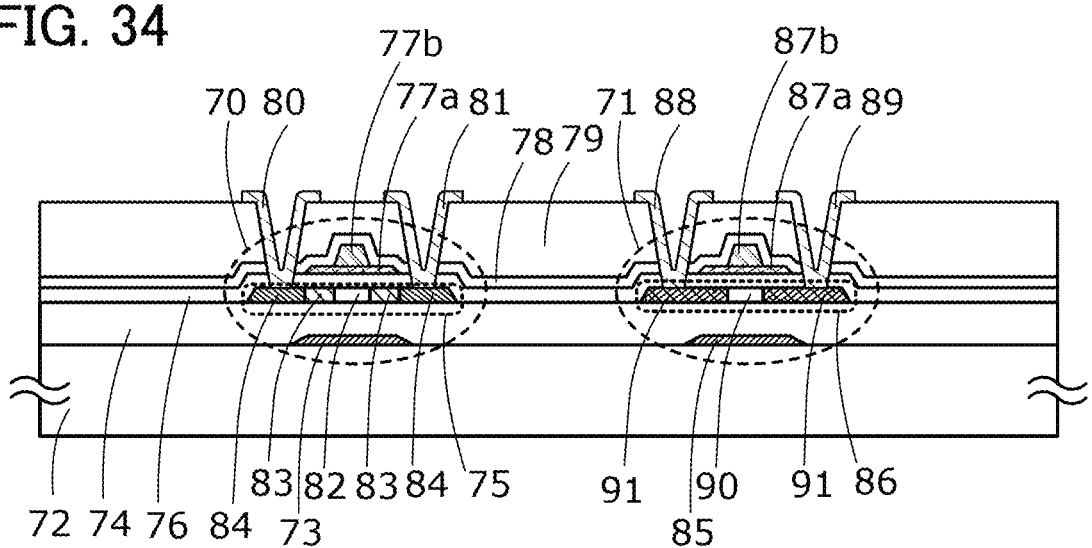
FIG. 34 is a cross-sectional view of a transistor structure.

FIG. 34 is a cross-sectional view of a transistor including a thin silicon film, which can be used in the light-emitting device of one embodiment of the present invention. FIG. 34 shows an n-channel transistor 70 and a p-channel transistor 71.

The transistor 70 includes, over a substrate 72 having an insulating surface, a conductive film 73 functioning as a gate, an insulating film 74 over the conductive film 73, a semiconductor film 75 overlapping the conductive film 73 with the insulating film 74 provided therebetween, an insulating film 76 over the semiconductor film 75, a conductive film 77a and a conductive film 77b overlapping with the semiconductor film 75 with the insulating film 76 provided therebetween and functioning as gates, an insulating film 78 over the conductive films 77a and 77b, an insulating film 79 over the insulating film 78, and a conductive film 80 and a conductive film 81 electrically connected to the semiconductor film 75 through openings in the insulating films 78 and 79 and functioning as a source or a drain.

The width in the channel length direction of the conductive film 77b is shorter than the conductive film 77a. The conductive films 77a and 77b are stacked in this order from the insulating film 76 side. The semiconductor film 75 includes a channel formation region 82 overlapping with the conductive film 77b, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 functions as a source region and a drain region. An impurity element imparting n-type conductivity to the semiconductor film 75, such as boron (B), aluminum (Al), or gallium (Ga), is added to the LDD regions 83 and the impurity regions 84.

The transistor 71 includes, over the substrate 72 having an insulating surface, the conductive film 85 functioning as a gate, the insulating film 74 over the conductive film 85, a semiconductor film 86 overlapping the conductive film 85 with the insulating film 74 provided therebetween, the insulating film 76 over the semiconductor film 86, a conductive film 87a and a conductive film 87b overlapping with the semiconductor film 86 with the insulating film 76 provided therebetween and functioning as gates, the insulating film 78 over the conductive films 87a and 87b, the insulating film 79 over the insulating film 78, and a conductive film 88 and a conductive film 89 electrically connected to the semiconductor film 86 through openings in the insulating films 78 and 79 and functioning as a source or a drain.

The width in the channel length direction of the conductive film 87b is shorter than the conductive film 87a. The conductive films 87a and 87b are stacked in this order from the insulating film 76 side. The semiconductor film 75 includes a channel formation region 90 overlapping with the conductive film 87b, and a pair of impurity regions 91 between which the channel formation region 90 is sandwiched. The pair of impurity regions 91 functions as a source region and a drain region. An impurity element imparting p-type conductivity to the semiconductor film 86, such as phosphorus (P) or arsenic (As), is added to the impurity regions 91.

Note that the semiconductor film 75 or 86 may be crystallized by various techniques. Examples of the various techniques of crystallization are a laser crystallization method using a laser beam and a crystallization method using a catalytic element. Alternatively, a crystallization method using a catalytic element and a laser crystallization method may be used in combination. In the case of using a thermally stable substrate such as quartz for the substrate 72, any of the following crystallization methods can be used in combination: a thermal crystallization method with an electrically-heated oven, a lamp anneal crystallization method with infrared light, a crystallization method with a catalytic element, and high temperature annealing at about 950° C.
<Manufacturing Method 1 of Light-Emitting Device>

Next, a manufacturing method of the light-emitting device 400 of one embodiment of the present invention will be described with reference to FIGS. 19A to 19D and FIGS. 20A and 20B.

Figure 19A:
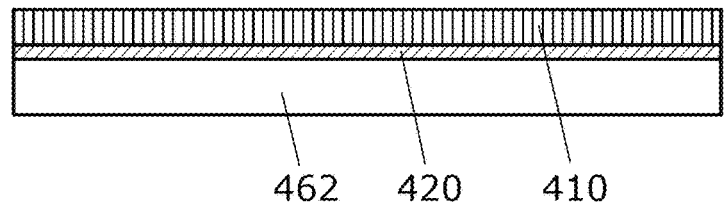
FIGS. 19A to 19D are cross-sectional views illustrating a method for manufacturing a display device.
Figure 19B:
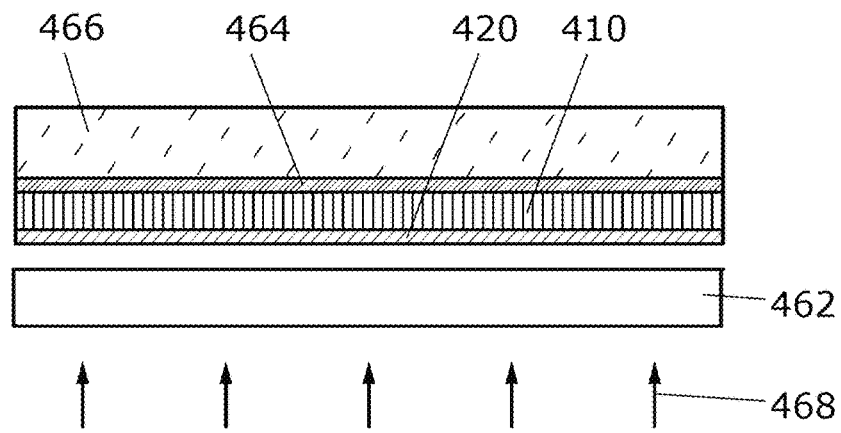

First, an insulating film 420 is formed over a substrate 462, and a first element layer 410 is formed over the insulating film 420 (see FIG. 19A). The first element layer 410 includes a semiconductor element. A display element or part of the display element such as a pixel electrode may also be included in the first element layer 410.

It is necessary that the substrate 462 have at least heat resistance high enough to withstand heat treatment performed later. For example, a glass substrate, a ceramic substrate, a quartz substrate, or a sapphire substrate may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

For the insulating film 420, an organic resin film of an epoxy resin, an aramid resin, an acrylic resin, a polyimide resin, a polyamide resin, a polyamide-imide resin, or the like can be used. Among them, a polyimide resin is preferably used because it has high heat resistance. For example, in the case where a polyimide resin is used for the insulating film 420, the thickness of the polyimide resin is greater than or equal to 3 nm and less than or equal to 20 μm, preferably greater than or equal to 500 nm and less than or equal to 2 μm. In the case where a polyimide resin is used for the insulating film 420, the insulating film 420 can be formed by a spin coating method, a dip coating method, a doctor blade method, or the like. In the case where a polyimide resin is used for the insulating film 420, for example, the insulating film 420 with a desired thickness can be obtained by removing an excess part of the polyimide resin film by a doctor blade method.

Note that formation temperatures of the first element layer 410 are preferably higher than or equal to room temperature and lower than or equal to 300° C. For example, the deposition temperature of an insulating film or a conductive film which is formed in the first element layer 410 using an inorganic material is higher than or equal to 150° C. and lower than or equal to 300° C., preferably higher than or equal to 200° C. and lower than or equal to 270° C. Furthermore, an insulating film or the like formed in the first element layer 410 using an organic resin material is preferably formed at a temperature higher than or equal to room temperature and lower than or equal to 100° C.

The above-described CAAC-OS is preferably used for the oxide semiconductor film of the transistor included in the first element layer 410. In the case where the CAAC-OS is used for the oxide semiconductor film of the transistor, for example, when the light-emitting device 400 is bent, a crack or the like is less likely to be generated in the channel region, resulting in high resistance against bending.

Indium tin oxide to which silicon oxide is added is preferably used for the conductive film included in the first element layer 410 because a crack is less likely to be generated in the conductive film when the light-emitting device 400 is bent.

Next, the first element layer 410 and a temporary supporting substrate 466 are attached with an adhesive 464 for separation, and then the insulating film 420 and the first element layer 410 are separated from the substrate 462. The temporary supporting substrate 466 is thus provided with the insulating film 420 and the first element layer 410 (see FIG. 19B).

As the temporary supporting substrate 466, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used.

An adhesive with which the temporary supporting substrate 466 and the element layer 410 can be chemically or physically separated when necessary, such as an adhesive that is soluble in water or a solvent or an adhesive which is capable of being plasticized upon irradiation of UV light or the like, is used as the adhesive 464 for separation.

Any of various methods can be used as appropriate as the process for transferring the components to the temporary supporting substrate 466. For example, the substrate 462 and the insulating film 420 can be separated from each other in such a manner that the insulating film 420 is irradiated with laser light 468 from a side of the substrate 462 where the insulating film 420 is not formed, i.e., from the bottom side in FIG. 19B to make the insulating film 420 weak. Furthermore, a region where adhesion between the substrate 462 and the insulating film 420 is low and a region where adhesion between the substrate 462 and the insulating film 420 is high may be formed by adjustment of the irradiation energy density of the laser light 468, and then the substrate 462 and the insulating film 420 may be separated.

Although the method in which separation is caused at the interface between the substrate 462 and the insulating film 420 is described, one embodiment of the present invention is not limited thereto. For example, separation may be caused at the interface between the insulating film 420 and the first element layer 410.

The insulating film 420 may be separated from the substrate 462 by filling the interface between the substrate 462 and the insulating film 420 with a liquid. Alternatively, the first element layer 410 may be separated from the insulating film 420 by filling the interface between the insulating film 420 and the first element layer 410 with a liquid. As the liquid, water, a polar solvent, or the like can be used, for example. The interface along which the insulating film 420 is separated, specifically, the interface between the substrate 462 and the insulating film 420 or the interface between the insulating film 420 and the first element layer 410 is filled with a liquid, whereby an influence of static electricity and the like which are generated owing to the separation and applied to the first element layer 410 can be reduced.

Figure 19C:
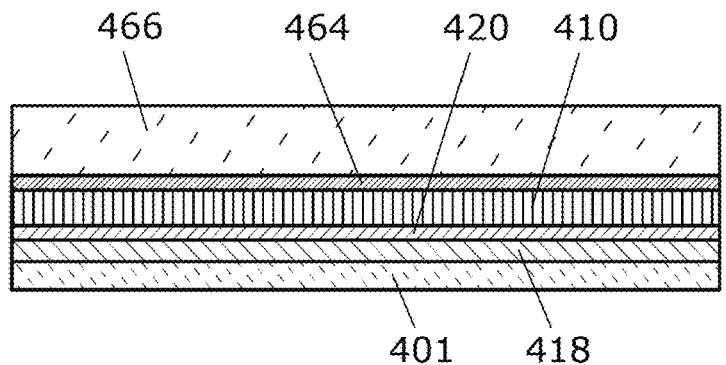

Next, the first substrate 401 is attached to the insulating film 420 using the adhesive layer 418 (see FIG. 19C).

Figure 19D:
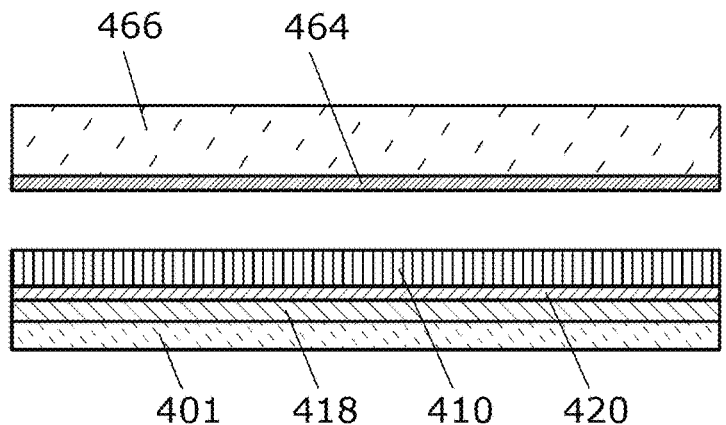

Then, the adhesive 464 for separation and the temporary supporting substrate 466 are removed from the first element layer 410 by dissolving or plasticizing the adhesive 464 for separation (see FIG. 19D).

Note that the adhesive 464 for separation is preferably removed by water, a solvent, or the like to expose the surface of the first element layer 410.

Through the above process, the first element layer 410 can be formed over the first substrate 401.

Figure 20A:
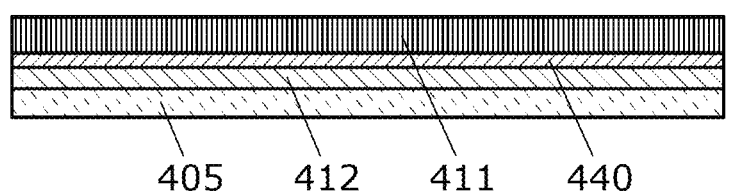
FIGS. 20A and 20B are cross-sectional views illustrating a method for manufacturing a light-emitting device.

Next, the second substrate 405, the adhesive layer 412 over the second substrate 405, the insulating film 440 over the adhesive layer 412, and the second element layer 411 are formed by a process similar to that illustrated in FIGS. 19A to 19D (see FIG. 20A).

The insulating film 440 included in the second element layer 411 can be formed using a material similar to that of the insulating film 420, here, using an organic resin film.

Figure 20B:
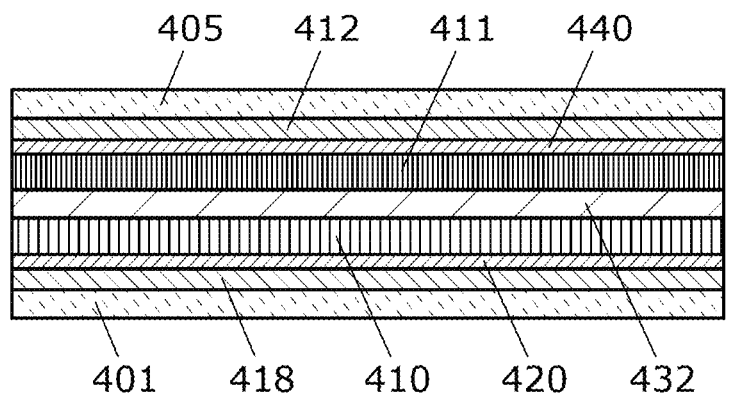

Next, a space between the first element layer 410 and the second element layer 411 is filled with the sealing layer 432 to attach the first element layer 410 and the second element layer 411 (see FIG. 20B).

With the sealing layer 432, for example, solid sealing is possible. Note that the sealing layer 432 preferably has flexibility. For example, a glass material such as a glass frit, or a resin that is curable at room temperature such as a two-component type resin, a light curable resin, a heat-curable resin, and the like can be used for the sealing layer 432.

In the above-described manner, the light-emitting device 400 can be manufactured.

<Manufacturing Method 2 of Light-Emitting Device>

Another method for manufacturing the light-emitting device 400 which is one embodiment of the present invention will be described with reference to FIGS. 21A to 21D. Note that an inorganic insulating film is used as the insulating films 420 and 440 FIGS. 21A to 21D.

First, a separation layer 463 is formed over the substrate 462. Then, the insulating film 420 is formed over the separation layer 463, and the first element layer 410 is formed over the insulating film 420 (see FIG. 21A).

The separation layer 463 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements, for example. In the case of a layer containing silicon, a crystal structure of the layer containing silicon may be amorphous, microcrystal, polycrystal, or single crystal The separation layer 463 can be formed by a sputtering method, a PE-CVD method, a coating method, a printing method, or the like. Note that a coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer 463 has a stacked-layer structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 463 is changed by the plasma treatment or heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film. The inorganic insulating film can be formed by a sputtering method or a PE-CVD method, for example.

Next, the first element layer 410 and a temporary supporting substrate 466 are attached with an adhesive 464 for separation, and then the insulating film 420 and the first element layer 410 are separated from the separation layer 463. Thus, the temporary supporting substrate 466 is provided with the insulating film 420 and the first element layer 410 (see FIG. 21B).

Any of various methods can be used as appropriate as the process for transferring the layer to the temporary supporting substrate 466. For example, in the case where a layer including a metal oxide film is formed at the interface between the separation layer 463 and the insulating film 420, the metal oxide film is made to be weakened by crystallization, so that the insulating film 420 can be separated from the separation layer 463. Alternatively, in the case where the separation layer 463 is formed using a tungsten film, separation is performed in such a manner that the tungsten film is etched using a mixed solution of ammonia water and a hydrogen peroxide solution.

The insulating film 420 may be separated from the separation layer 463 by filling the interface between the separation layer 463 and the insulating film 420 with a liquid. As the liquid, water, a polar solvent, or the like can be used, for example. The interface along which the insulating film 420 is separated, specifically, the interface between the separation layer 463 and the insulating film 420 is filled with a liquid, whereby an influence of static electricity and the like which are generated owing to the separation and applied to the first element layer 410 can be reduced.

Figure 21A:
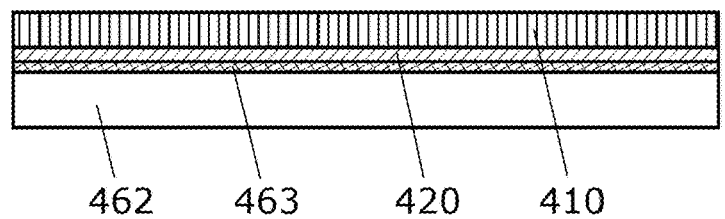
FIGS. 21A to 21D are cross-sectional views illustrating a method for manufacturing a light-emitting device.
Figure 21B:
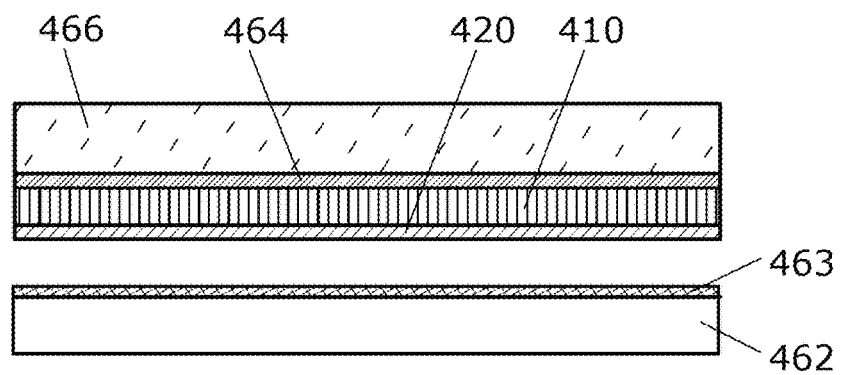
Figure 21C:
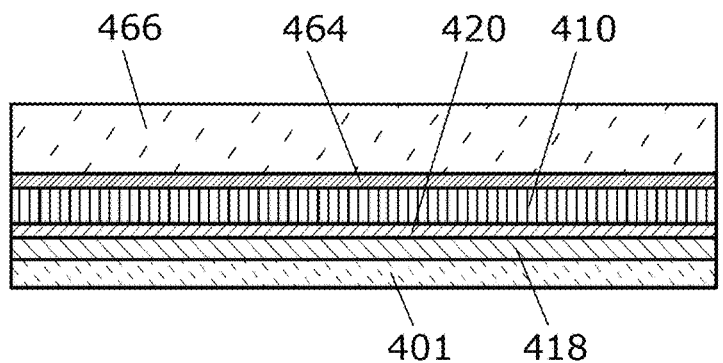

Next, the first substrate 401 is attached to the insulating film 420 using the adhesive layer 418 (see FIG. 21C).

Figure 21D:
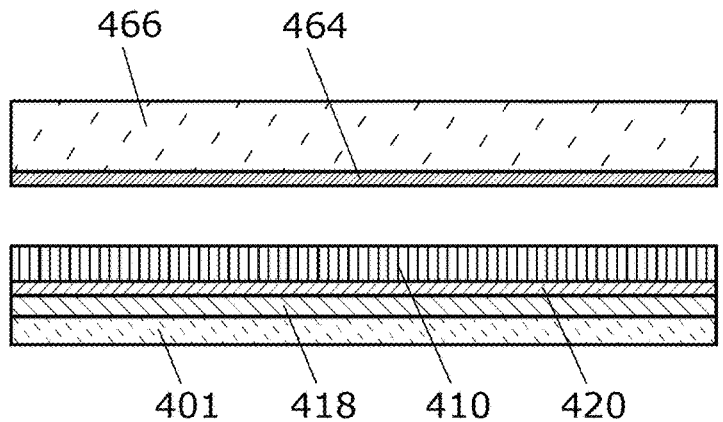

Then, the adhesive 464 for separation and the temporary supporting substrate 466 are removed from the first element layer 410 by dissolving or plasticizing the adhesive 464 for separation (see FIG. 21D).

Note that the adhesive 464 for separation is preferably removed by water, a solvent, or the like to expose the surface of the first element layer 410.

Through the above process, the first element layer 410 can be formed over the first substrate 401.

Next, the second substrate 405, the adhesive layer 412 over the second substrate 405, the insulating film 440 over the adhesive layer 412, and the second element layer 411 are formed by a process similar to that illustrated in FIGS. 21A to 21D. After that, a space between the first element layer 410 and the second element layer 411 is filled with the sealing layer 432, so that the first element layer 410 and the second element layer 411 are attached to each other.

Finally, the anisotropic conductive film 380 and the FPC 408 are attached to the connection electrode 360. An IC chip or the like may be mounted if necessary.

Through to the above process, the light-emitting device 400 can be manufactured.

<Cross-Sectional Structure of Light-Emitting Device>

Figure 22:
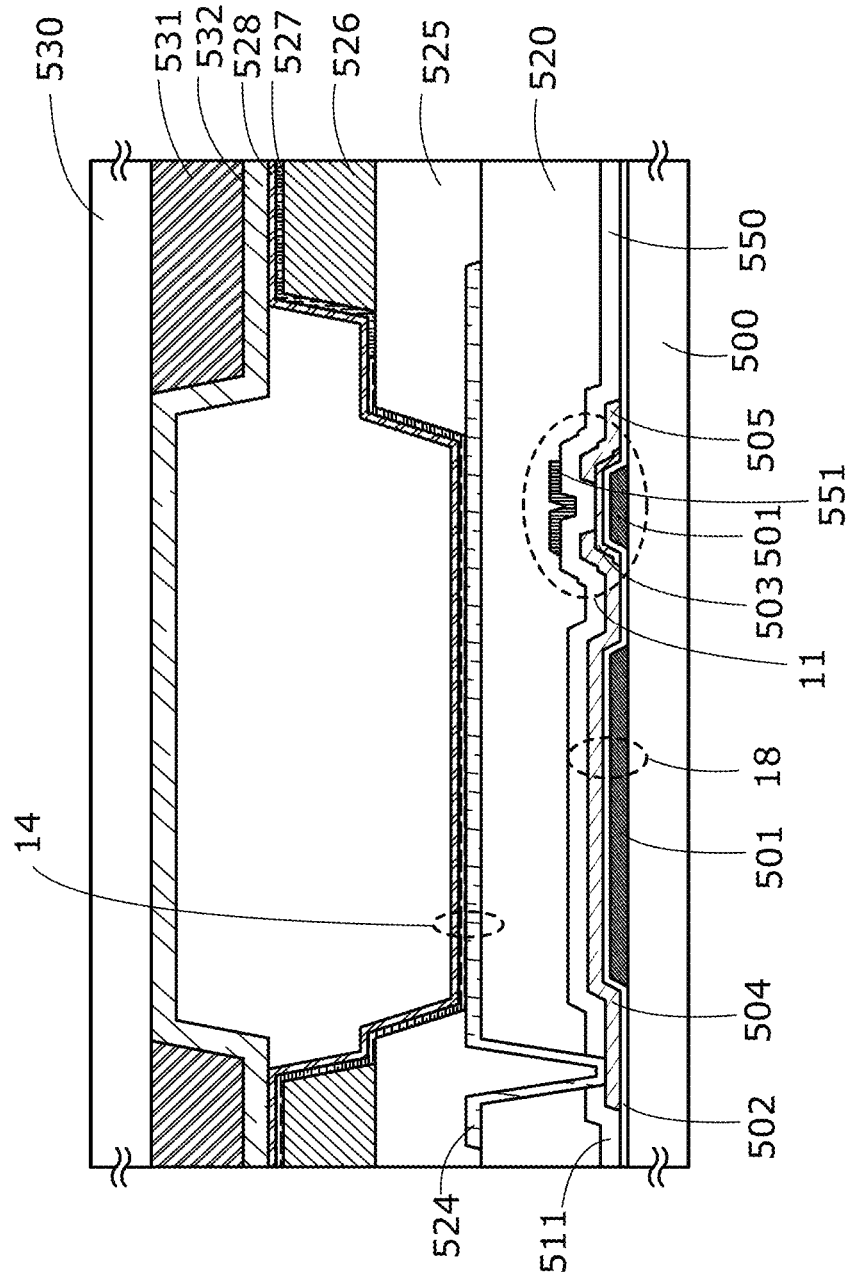
FIG. 22 is a cross-sectional view of a light-emitting device.

FIG. 22 illustrates the cross-sectional structure of a pixel portion in a light-emitting device according to one embodiment of the present invention. Note that FIG. 22 illustrates the cross-sectional structures of the transistor 11, the capacitor 18, and the light-emitting element 14 of the pixel 10 illustrated in FIG. 3A.

Specifically, the light-emitting device in FIG. 22 includes the transistor 11 and the capacitor 18 over a substrate 500. The transistor 11 includes a conductive film 501 functioning as a first gate, an insulating film 502 over the conductive film 501, a semiconductor film 503 overlapping the conductive film 501 with the insulating film 502 provided therebetween, a conductive film 504 and a conductive film 505 electrically connected to the semiconductor film 503 and functioning as a source or a drain, an insulating film 550 over the semiconductor film 503 and the conductive films 504 and 505, and a conductive film 551 overlapping the conductive film 501 with the insulating film 550 provided therebetween and functioning as a second gate.

The capacitor 18 includes the conductive film 501 that functions as an electrode; the insulating film 502 over the conductive film 501; and the conductive film 504 that overlaps with the conductive film 501 with the insulating film 502 positioned therebetween and functions as an electrode.

The insulating film 502 may be formed as a single layer or a multilayer using one or more insulating films containing any of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

An insulating film 511 is provided over the semiconductor film 503 and the conductive films 504 and 505. In the case where an oxide semiconductor is used for the semiconductor film 503, it is preferable to use a material that can supply oxygen to the semiconductor film 503 for the insulating film 511. By using the material for the insulating film 511, oxygen contained in the insulating film 511 can be moved to the semiconductor film 503, and the amount of oxygen vacancy in the semiconductor film 503 can be reduced. Oxygen contained in the insulating film 511 can be moved to the semiconductor film 503 efficiently by heat treatment performed after the insulating film 511 is formed.

An insulating film 520 is provided over the insulating film 511 and a conductive film 524 is provided over the insulating film 520. The conductive film 524 is connected to the conductive film 504 in the opening portion formed in the insulating films 511 and 520.

Over the insulating films 520 and 524, an insulating film 525 including an opening in a region overlapping the conductive film 524. Over the insulating film 525, an insulating film 526 is provided in a position that is different from the positions of the opening of the insulating film 525. An EL layer 527 and a conductive film 528 are sequentially stacked over the insulating films 525 and 526. A portion in which the conductive films 524 and 528 overlap with each other with the EL layer 527 positioned therebetween functions as the light-emitting element 14. One of the conductive films 524 and 528 functions as an anode, and the other functions as a cathode.

The light-emitting device includes a substrate 530 that faces the substrate 500 with the light-emitting element 14 positioned therebetween. A blocking film 531 that has a function of blocking light is provided over the substrate 530, i.e., over a surface of the substrate 530 that is closer to the light-emitting element 14. The blocking film 531 has an opening that overlaps with the light-emitting element 14. In the opening that overlaps with the light-emitting element 14, a coloring layer 532 that transmits visible light in a specific wavelength range is provided over the substrate 530.

<External View of Light-Emitting Device>

Figure 23A:
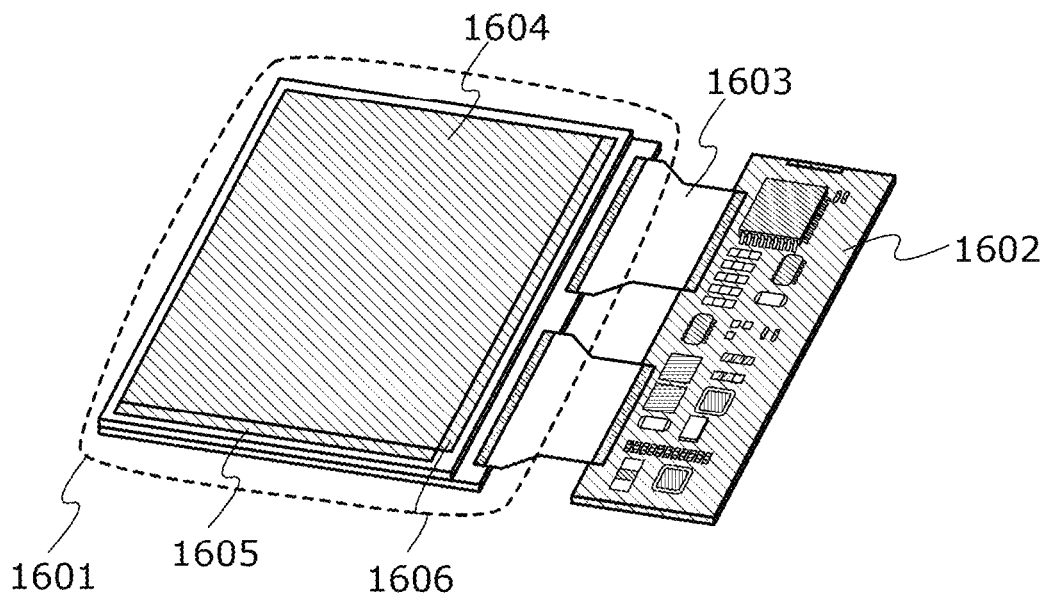
FIGS. 23A and 23B are perspective views of a panel.

FIG. 23A is a perspective view illustrating an example of an external view of a light-emitting device according to one embodiment of the present invention. The light-emitting device illustrated in FIG. 23A includes a panel 1601; a circuit board 1602 including a controller, a power supply circuit, an image processing circuit, an image memory, a CPU, and the like; and a connection portion 1603. The panel 1601 includes a pixel portion 1604 including a plurality of pixels, a driver circuit 1605 that selects pixels row by row, and a driver circuit 1606 that controls input of an image signal Sig to the pixels in a selected row.

A variety of signals and power supply potentials are input from the circuit board 1602 to the panel 1601 through the joints 1603. As the connecting portion 1603, a flexible printed circuit (FPC) or the like can be used. The chip-mounted FPC is referred to as COF tape, which achieves higher-density packaging in a smaller area. In the case where a COF tape is used as the connection portion 1603, part of circuits in the circuit board 1602 or part of the driver circuit 1605 or the driver circuit 1606 included in the panel 1601 may be formed on a chip separately prepared, and the chip may be connected to the COF tape by a chip-on-film (COF) method.

Figure 23B:
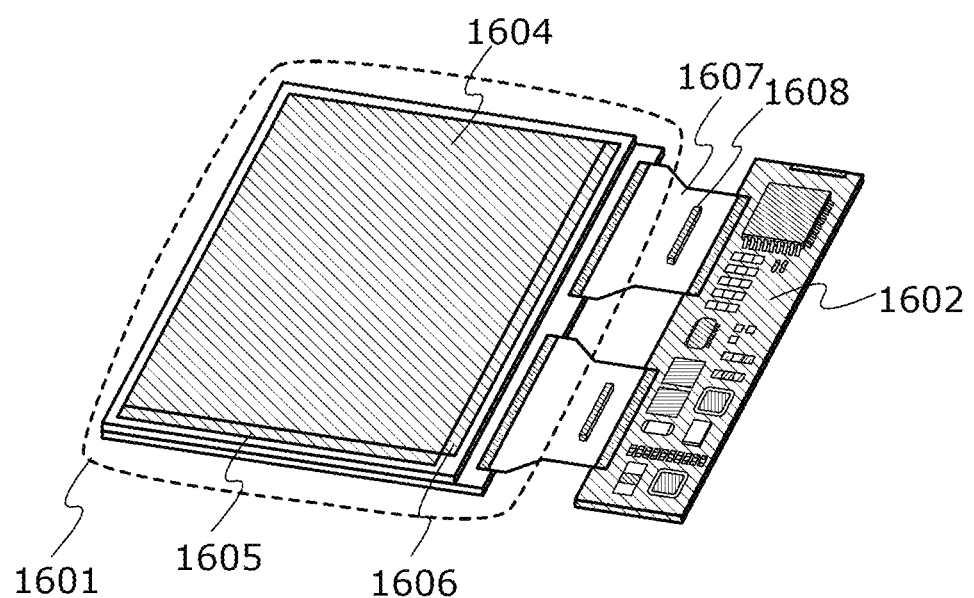

FIG. 23B is a perspective view of an appearance example of a light-emitting device using a COF tape 1607.

A chip 1608 is a semiconductor bare chip including a terminal (e.g., bump) on its surface, i.e., IC or LSI. CR components can also be mounted on the COF tape 1607, so that the area of the circuit board 1602 can be reduced. There is a plurality of wiring patterns of a flexible substrate depending on a terminal of a mounted chip. The chip 1608 is mounted using a bonder apparatus or the like; the position of the chip is determined over the flexible substrate having a wiring pattern and thermocompression bonding is performed.

One embodiment of the present invention is not limited to the example of FIG. 23B in which one COF tape 1607 is mounted on one chip 1608. Chips may be mounted in a plurality of lines on one side or both sides of one COF tape 1607; however, for cost reduction, the number of lines is preferably one in order to reduce the number of mounted chips. It is more preferable that the number of mounted chips is one.

<Structural Example of Circuit Board>

Figure 25:
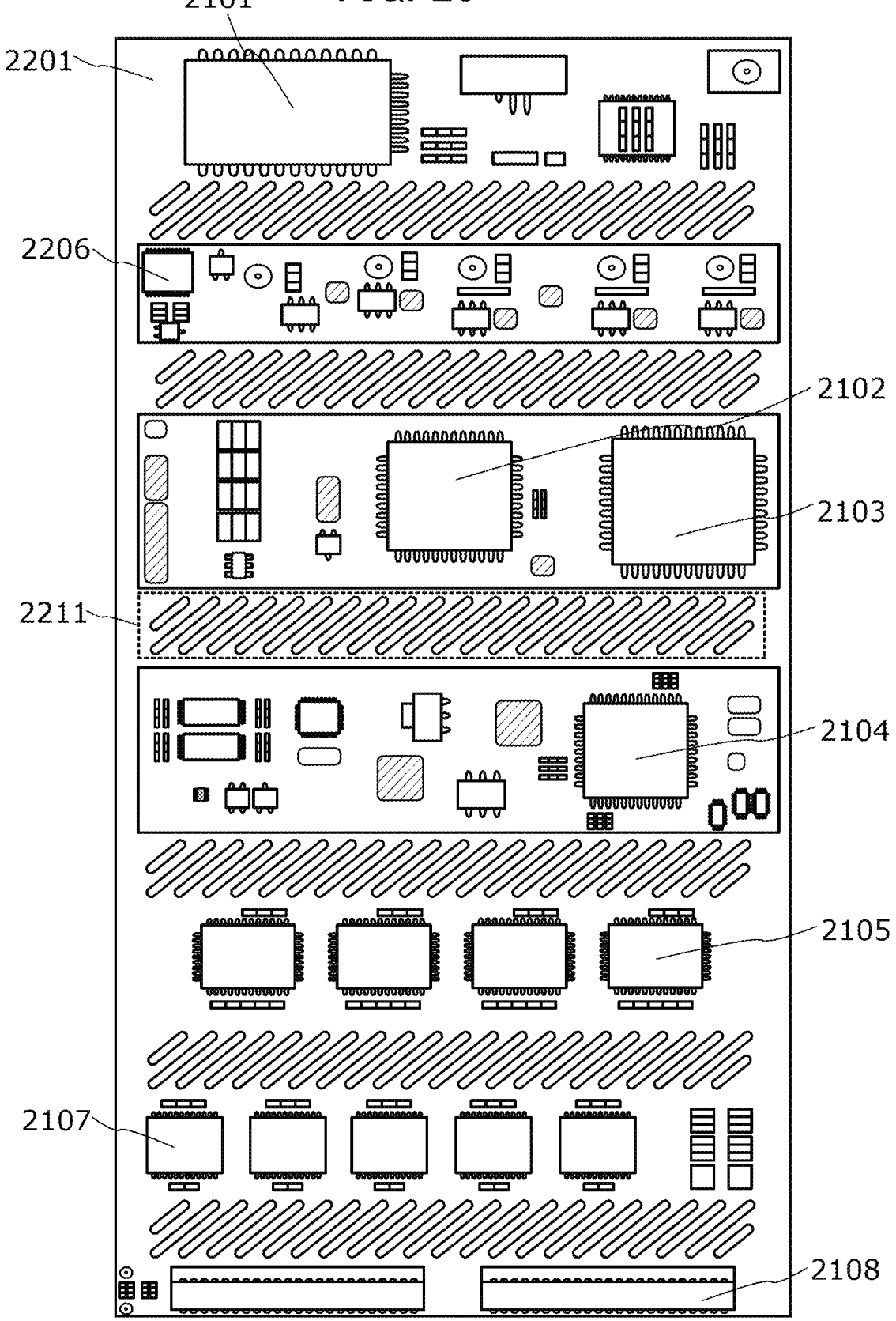
FIG. 25 shows an external view of a circuit board.

FIG. 25 is an external view of the circuit board 2003. The circuit board 2003 includes, on an FPC 2201 having a slit 2211, a communication device 2101 conforming to Bluetooth (registered trademark, the same as IEEE802.15.1) standards, a microcomputer 2012, a storage device 2103, an FPGA 2104, a DA converter 2105, a charge control IC 2106, and a level shifter 2107. The circuit board 2003 is electrically connected to a light-emitting device of one embodiment of the present invention through an input-output connector 2108. The slit 2211 provided for the FPC 2201 enables the flexibility of the circuit board 2003 using the FPC 2201 to be increased.

Since a flexible substrate is used in a light-emitting device of one embodiment of the present invention, the light-emitting device can be bent along the circuit board 2003. The light-emitting device including a flexible substrate and the circuit board 2003 can be bent repeatedly along the shape of part where the light-emitting device is worn. This is why they are suitable for electronic devices that can be worn on arms, legs, and the like.

<Example of Structure of Data Processing Device>

Figure 26A:
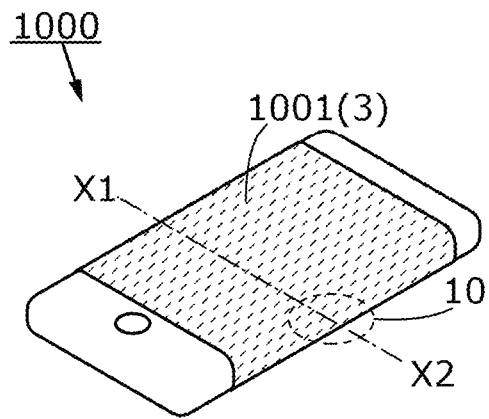
FIGS. 26A to 26E show a structure of a data processing device including a light-emitting device.
Figure 26B:
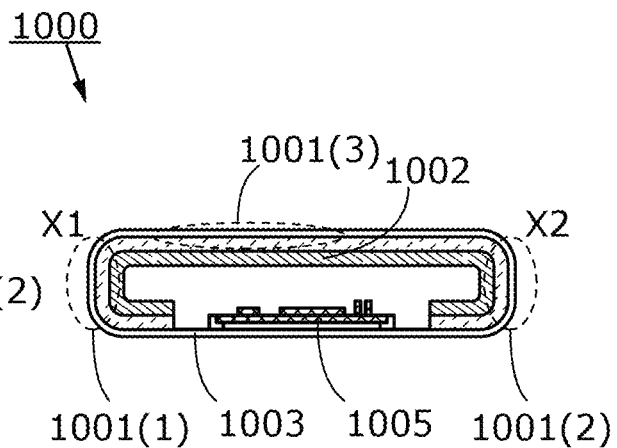
Figure 26C:
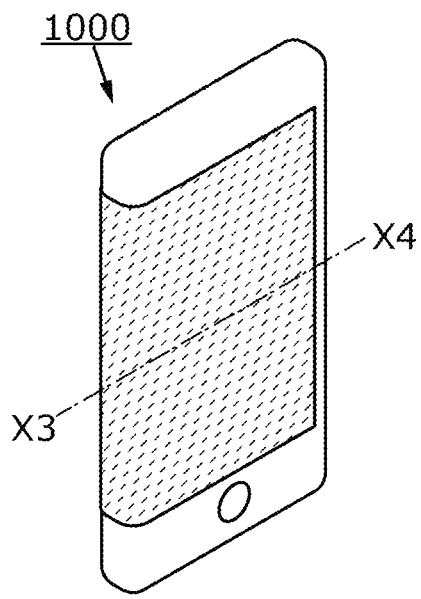
Figure 26D:
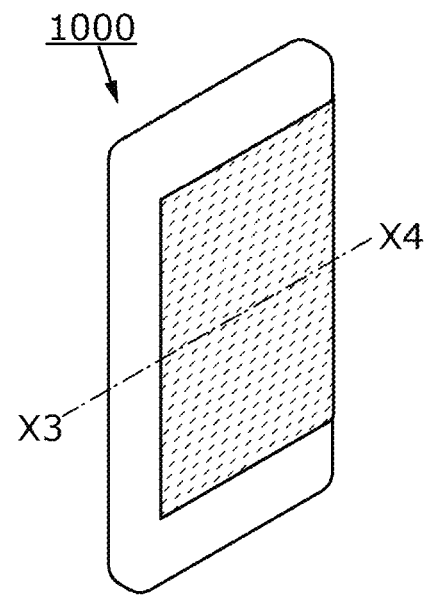
Figure 26E:
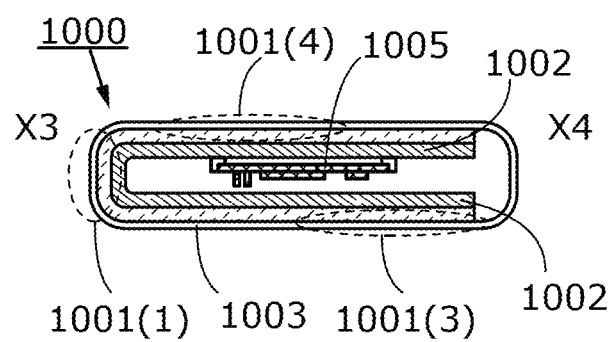

FIG. 26A is a schematic view illustrating the external appearance of a data processing device 1000 of one embodiment of the present invention, and FIG. 26B is a cross-sectional view illustrating a cross-sectional structure along a cutting-plane line X1-X2 in FIG. 26A. FIGS. 26C and 26D are schematic views illustrating the external appearance of the data processing device 1000 of one embodiment of the present invention, and FIG. 26E is a cross-sectional view illustrating a cross-sectional structure along a cutting-plane line X3-X4 in FIGS. 26C and 26D. FIGS. 26C and 26D are schematic views illustrating a front surface and a back surface of the data processing device 1000, respectively.

As shown in FIGS. 26C and 26D, a position input portion 1001 or a display portion 1002 can be provided not only on the front of the data processing device 1000, but also on the side and back of the data processing device 1000. The position input portion 1001 or the display portion 1002 may be provided on the top surface or the bottom surface of the data processing device 1000.

In addition to the position-input portion 1001, a hardware button, an external connection terminal, or the like may be provided on the surface of a housing 1003.

With such a structure, display can be performed not only on a surface parallel to the top surface of the housing 1003, as in conventional data processing devices, but also on a surface parallel to a side surface of the housing 1003. In particular, a display region is preferably provided along two or more side surfaces of the housing 1003 because the variety of display is further increased.

The display region provided along the front surface of the data processing device and the display regions provided along the side surfaces of the data processing device may be independently used as display regions to display different images and the like, or two or more of the display regions may display one image or the like. For example, a continuous image may be displayed on the display region provided along the front surface of the data processing device and the display region provided along the side surface thereof and the like.

An arithmetic device 1005 is inside the housing 1003. In FIG. 26B, the arithmetic device 1005 is apart from the display portion 1002. In FIG. 26E, the arithmetic device 1005 and the display portion 1002 overlap with each other.

The position-input portion 1001 is flexible to be folded such that, for example, a first region 1001(1), a second region 1001(2) facing the first region 1001(1), and a third region 1001(3) between the first region 1001(1) and the second region 1001(2) are formed (see FIG. 26B). As another example, the position-input portion 1001 is flexible to be folded such that, the first region 1001(1), the third region 1001(3), and a fourth region 1001(4) facing the third region 1001(3) are formed (see FIG. 26E).

For another example, the position-input portion 1001 is flexible to be folded, such that the third region 1001(3), a fifth region 1001(5), the fourth region 1001(4) facing the third region 1001(3) are formed.

Note that the second region 1001(2) may face the first region 1001(1) with or without an inclination. Note that the third region 1001(3) may face the fourth region 1001(4) with or without an inclination.

The display portion 1002 overlaps at least part of the first region 1001(1), the second region 1001(2), the third region 1001(3), or the fourth region 1001(4).

The data processing device 1000 described here includes the flexible position-input portion 1001 sensing proximity or touch of an object. The position-input portion 1001 can be bent to provide the first region 1001(1), the second region 1001(2) facing the first region 1001(1), and the third region 1001(3) which is positioned between the first region 1001(1) and the second region 1001(2) and overlaps with the display portion 1002. With this structure, whether or not a palm or a finger is proximate to or touches the first region 1001(1) or the second region 1001(2) can be determined. As a result, a human interface with high operability can be provided. A novel data processing device with high operability can be provided.

For the substrate used in the display portion 1002, a resin that is thin enough to have flexibility can be used. Examples of the resin include polyester, polyolefin, polyamide, polyimide, aramid, epoxy, polycarbonate, and an acrylic resin. Additionally, as a normal non-flexible substrate, a glass substrate, a quartz substrate, a semiconductor substrate, or the like can be used.

<Structural Example of Electronic Device>

The light-emitting device according to one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the light-emitting device according to one embodiment of the present invention, cellular phones, portable game machines, portable information terminals, electronic books, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 24A to 24F illustrate specific examples of these electronic devices.

Figure 24A:
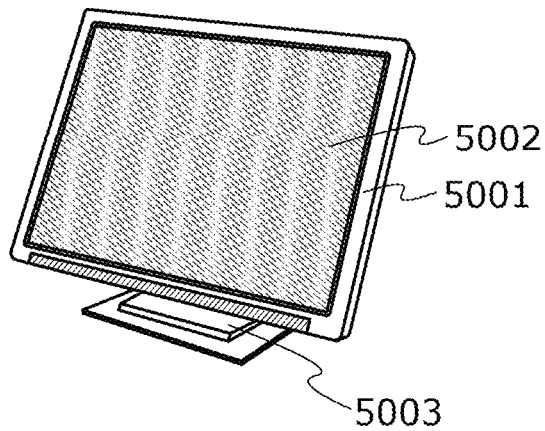
FIGS. 24A to 24F illustrate electronic devices.

FIG. 24A illustrates a display device including a housing 5001, a display portion 5002, a supporting base 5003, and the like. The light-emitting device according to one embodiment of the present invention can be used for the display portion 5002. Note that the category of the display device includes all the display devices for displaying information, such as display devices for a personal computer, TV broadcast reception, advertisement display, and the like.

Figure 24B:
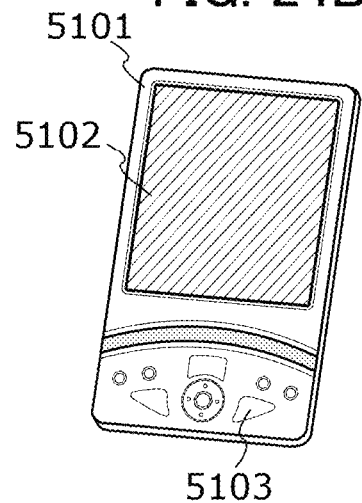

FIG. 24B illustrates a portable information terminal including a housing 5101, a display portion 5102, operation keys 5103, and the like. The light-emitting device according to one embodiment of the present invention can be used for the display portion 5102.

Figure 24C:
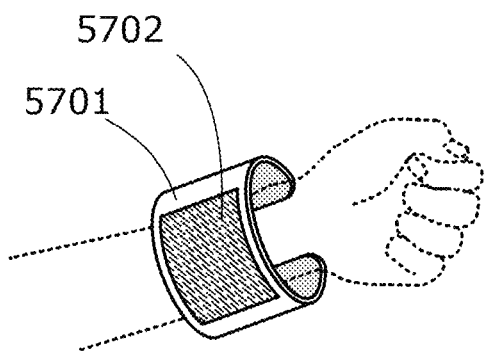

FIG. 24C illustrates a display device, which includes a housing 5701 having a curved surface, a display portion 5702, and the like. When a flexible substrate is used for the light-emitting device according to one embodiment of the present invention, it is possible to use the light-emitting device as the display portion 5702 supported by the housing 5701 having a curved surface. It is thus possible to provide a user-friendly display device that is flexible and lightweight.

Figure 24D:
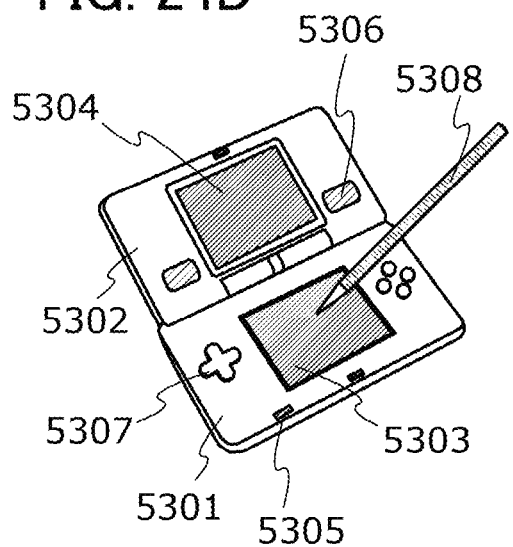

FIG. 24D illustrates a portable game machine that includes a housing 5301, a housing 5302, a display portion 5303, a display portion 5304, a microphone 5305, a speaker 5306, an operation key 5307, a stylus 5308, and the like. The light-emitting device according to one embodiment of the present invention can be used for the display portion 5303 or the display portion 5304. When the light-emitting device according to one embodiment of the present invention is used as the display portion 5303 or 5304, it is possible to provide a user-friendly portable game machine with quality that hardly deteriorates. Although the portable game machine in FIG. 24D has the two display portions 5303 and 5304, the number of display portions included in the portable game machine is not limited to two.

Figure 24E:
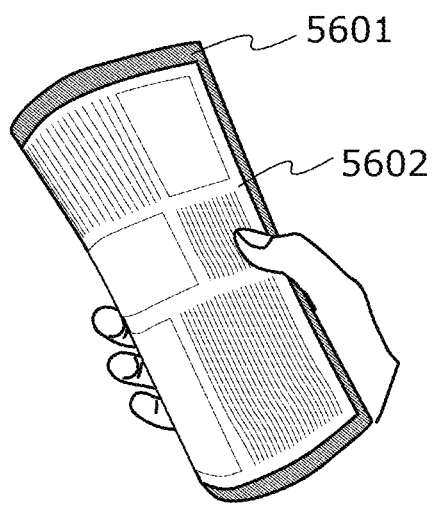

FIG. 24E illustrates an e-book reader, which includes a housing 5601, a display portion 5602, and the like. The light-emitting device according to one embodiment of the present invention can be used as the display portion 5602. When a flexible substrate is used, the light-emitting device can have flexibility, so that it is possible to provide a flexible and lightweight e-book reader.

Figure 24F:
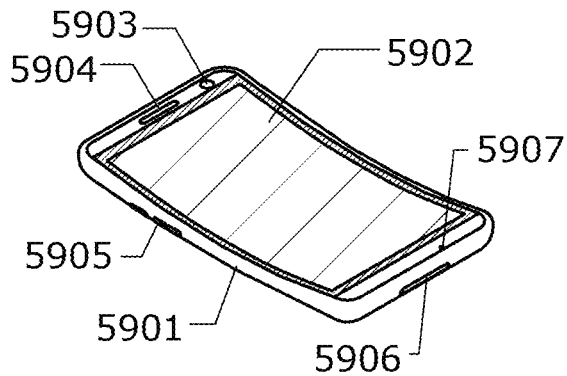

FIG. 24F illustrates a cellular phone, which includes a display portion 5902, a microphone 5907, a speaker 5904, a camera 5903, an external connection port 5906, and an operation button 5905 in a housing 5901. It is possible to use the light-emitting device according to one embodiment of the present invention as the display portion 5902. When the light-emitting device of one embodiment of the present invention is provided over a flexible substrate, the light-emitting device can be used for the display portion 5902 having a curved surface, as illustrated in FIG. 24F.

Example

In this example, a display device fabricated using the pixel of the above embodiment will be described.

First, the characteristics of a transistor used in the pixel were measured. The transistor was an OS transistor including a CAAC-OS film. The CAAC-OS film was formed using an In—Ga—Zn oxide.

Figure 42A:
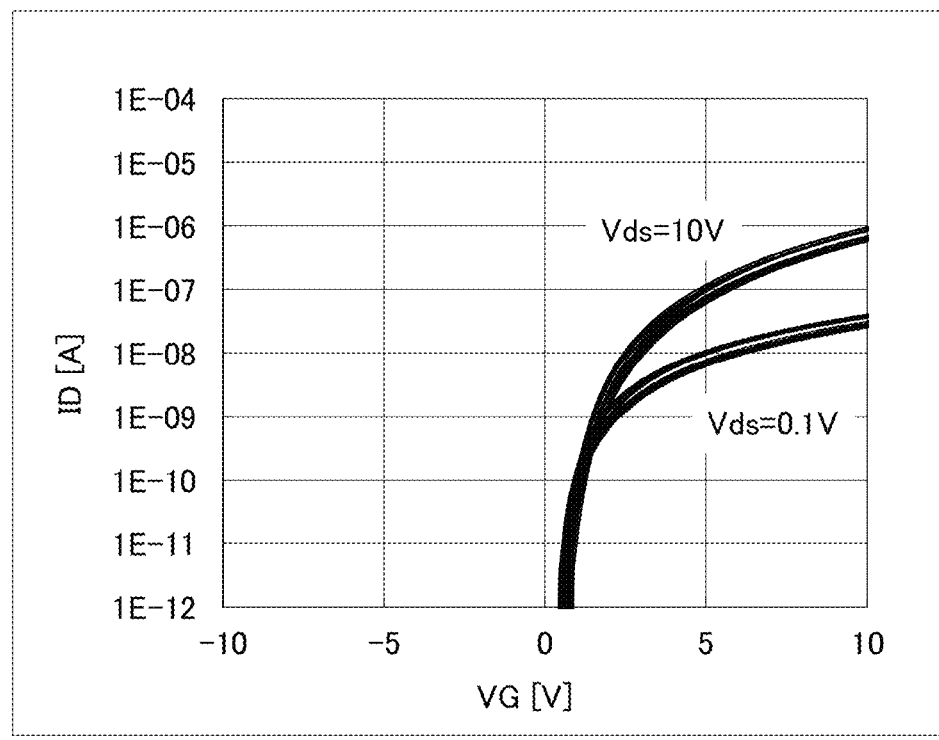
FIGS. 42A and 42B show characteristics of a transistor.

FIG. 42A shows measurement results of I-V characteristics of the OS transistor with source-drain voltages ($V_{ds}$) of 0.1 V and 10 V. Note that a channel length L and a channel width W of the OS transistor were each 6 μm. The OS transistor included a backgate. The measurement was performed in the state where a backgate-source voltage ($V_{bgs}$) was 0 V.

The characteristics were measured in 20 points in a substrate. The median and the variation 3σ of the threshold voltage of the OS transistor were 4.38 V and 0.88 V, respectively.

The backgate reduces the drain induced barrier lowering (DIBL) effect. A channel length modulation coefficient of a single-gate structure without a backgate was approximately 0.05 $V^{-1}$, whereas that of a backgate structure was approximately 0.009 $V^{-1}$; this means that the saturation characteristics was improved.

Figure 42B:
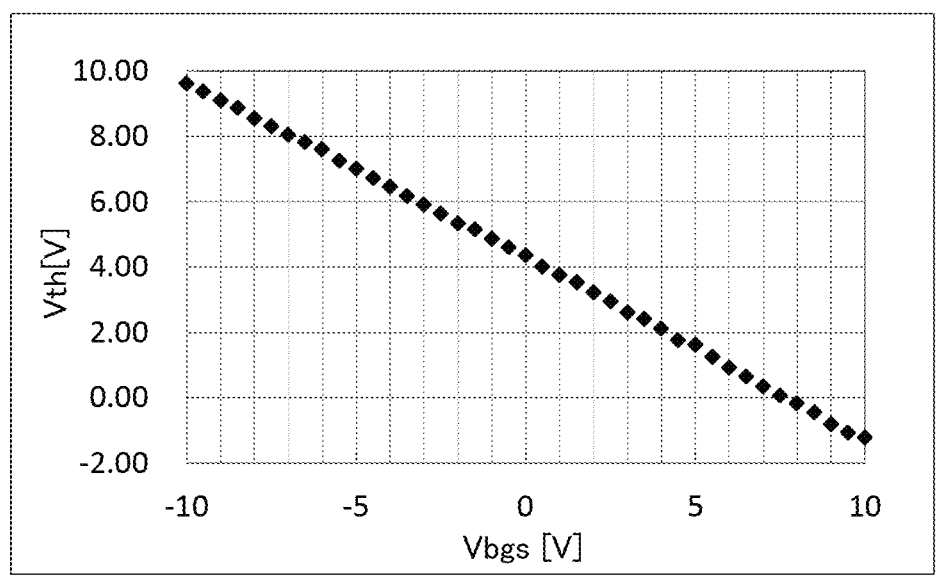

FIG. 42B shows measurement results of dependence of the Vth of the OS transistor on $V_{bgs}$. The I-V characteristics were measured by changing $V_{bgs}$ with the fixture of the source potential of the OS transistor, and the threshold voltages were calculated using the measurement results. Note that $V_{ds}$ was 10 V in FIG. 42B.

As is found from FIG. 42B, the threshold voltage decreases as $V_{bgs}$ increases, whereas the threshold voltage increases as $V_{bgs}$ decreases. The threshold voltage $V_{th}$ shifts linearly with respect to $V_{bgs}$. Note that the shift amount of the threshold voltage depends on the thickness and the dielectric constant of an intermediate layer between a channel portion and a backgate portion. As the thicker the intermediate layer is or as the lower the dielectric constant is, the less influence $V_{bgs}$ has on the threshold voltage.

Figure 43A:
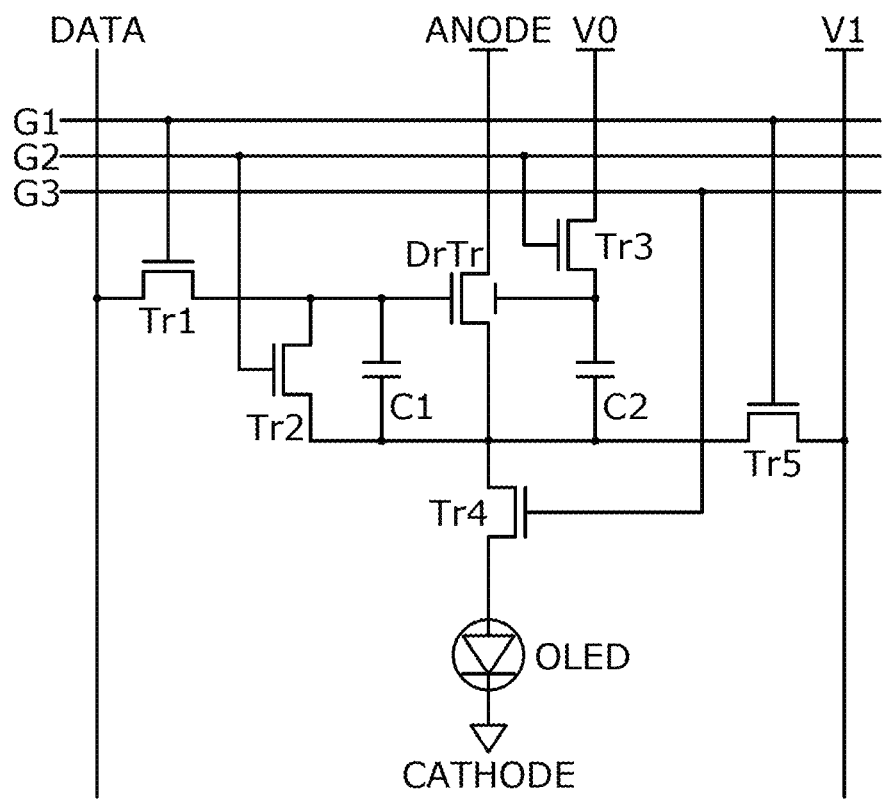
FIGS. 43A and 43B show a structure and operation of a pixel.
Figure 43B:
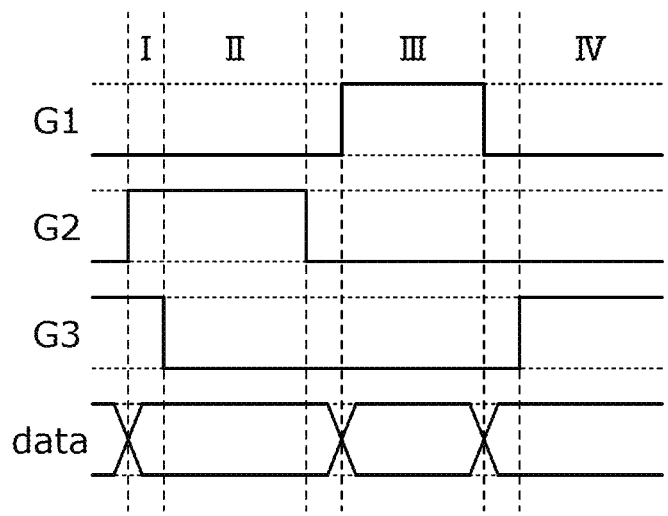

A pixel was configured using the OS transistor. FIG. 43A shows a circuit configuration of the pixel. Note that the pixel in FIG. 43A corresponds to the pixel 10 in FIGS. 3B and 4B. The threshold voltage was compensated by operating the pixel in FIG. 43A in accordance with a timing chart in FIG. 43B. The above embodiments can be referred to for the threshold compensation operation. Note that in Period I, G3 is high and Tr4 is on, and the source potential of the driving transistor DrTr is the sum of a CATHODE potential and a threshold of the OLED ($V_{thOLED}$).

The specifications of a display device including the pixel are listed in Table 1. The pixel density and aperture ratio of the display device were 302 ppi and 61%, respectively. A scan driver was integrated on the glass substrate. A source driver was a chip on film (COF).

TABLE 1

| Specifications | |
| --- | --- |
| Screen diagonal | 5.29 inches |
| Driving method | Active Matrix |
| Number of effective pixels | 960 × RGB × 1280 (Quad-VGA) |
| Pixel density | 302 ppi |

TABLE 1-continued

| Specifications | |
|---|---|
| Pixel pitch | 28 μm × RGB × 84 μm |
| aperture ratio | 61.0% |
| Pixel arrangement | RGB Stripe |
| Pixel circuit | 6Tr + 2C/cell |
| Source driver | COF + DeMUX |
| Scan driver | Integrated |

Figure 44A:
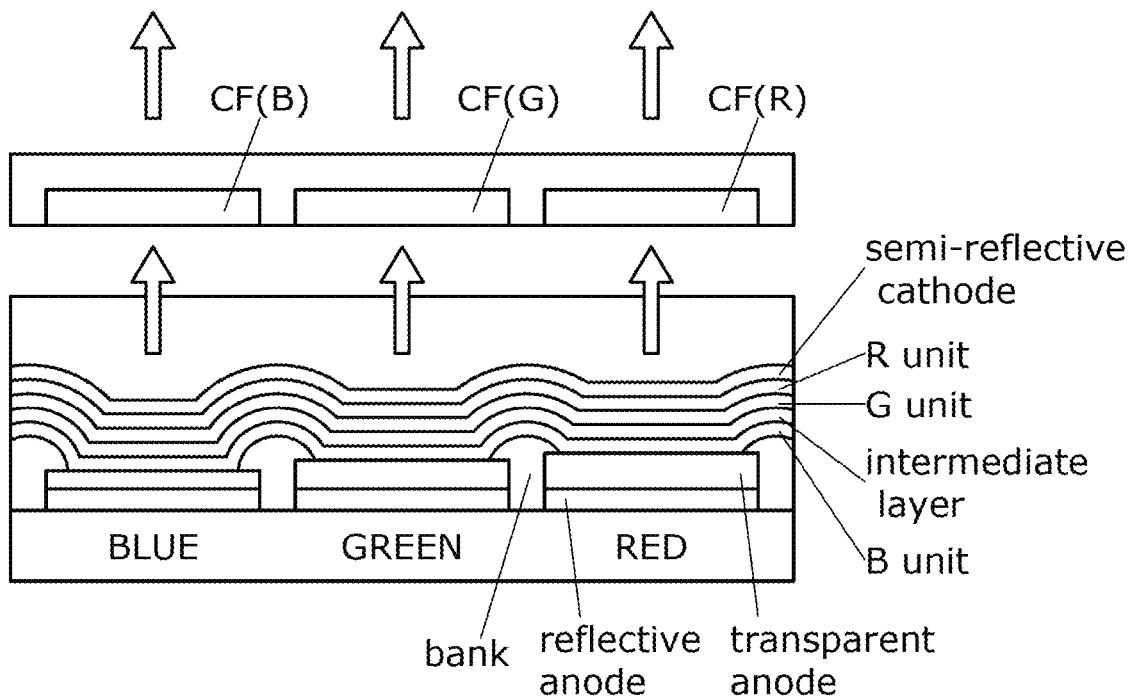
FIGS. 44A and 44B show a structure of a display device.

Top emission white EL elements and color filters (CF) were employed for the display device (see FIG. 44A).

Figure 44B:
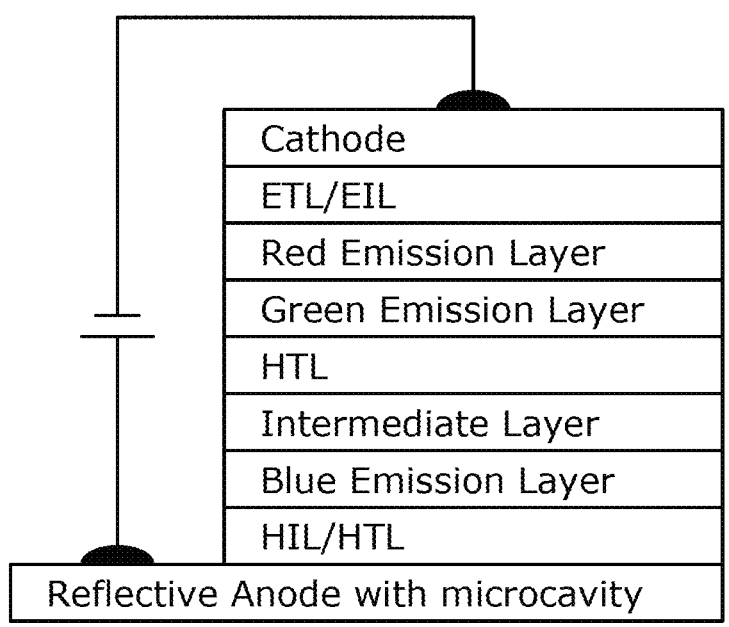

The white EL element has a two-layered tandem structure in which an emission unit containing a blue fluorescent material and an emission unit containing green and red phosphorescent materials are connected in series (see FIG. 44B).

Figure 45:
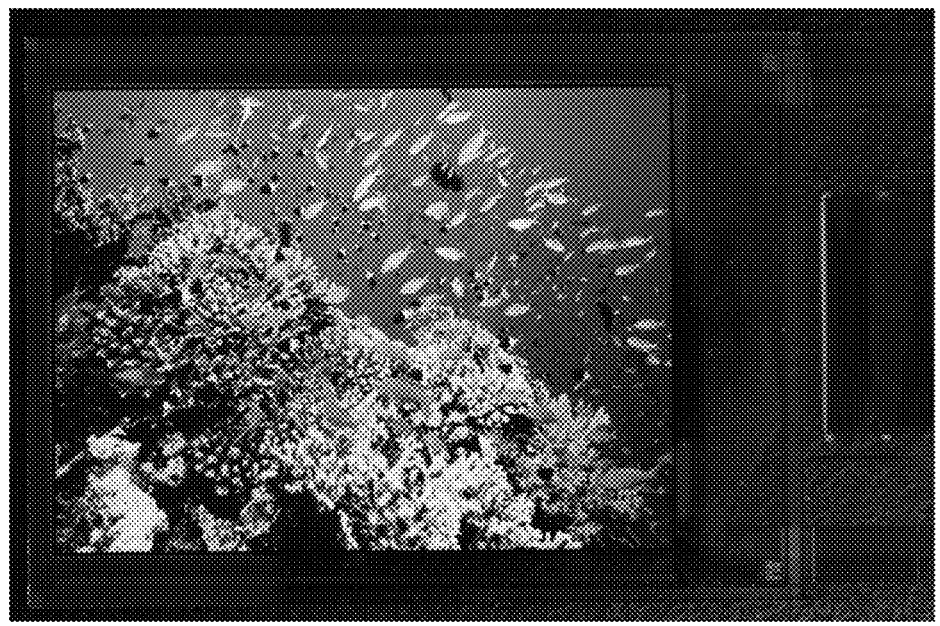
FIG. 45 shows a picture displayed by a display device.

FIG. 45 is a photograph of the display device displaying an image. As seen from the picture, the display device displays an image normally without problems such as display unevenness.

Figure 46:
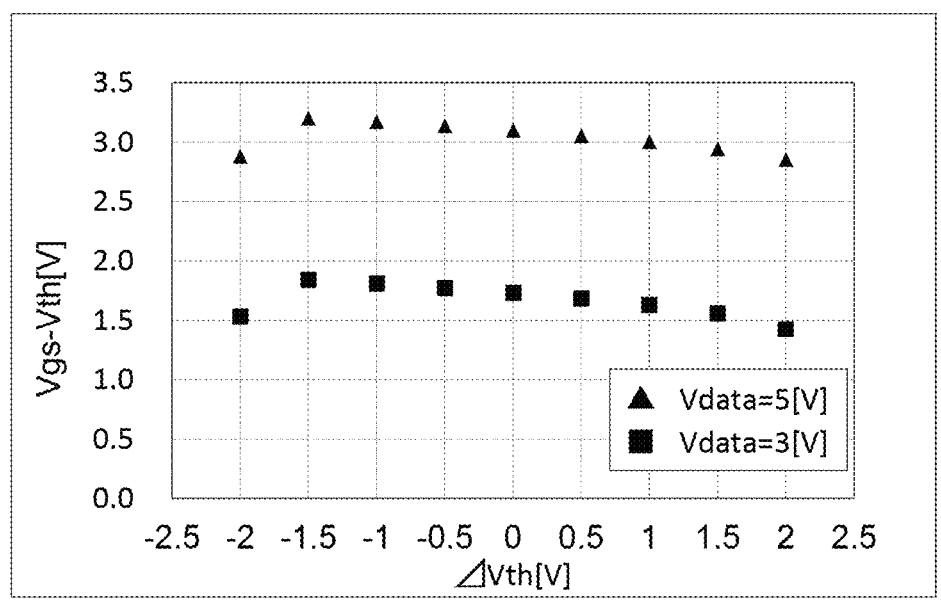
FIG. 46 shows characteristics of a transistor.

FIG. 46 shows calculation results in the case where the threshold voltage of the driving transistor in FIG. 43A is varied. Here, $\Delta V_{th}$ in the horizontal axis is the amount of $V_{th}$ shifted by threshold compensation; $V_{gs}-V_{th}$ in the vertical axis is obtained by subtracting the compensated threshold voltage of the driving transistor DrTr from $V_{gs}$ of the driving transistor DrTr in an emission period, which is Period IV in FIG. 43B. The slope of the graph is 0 when the threshold voltage is compensated normally because $V_{gs}-V_{th}$ is independent of the threshold voltage.

The calculation results in FIG. 46 show that variation in $V_{gs}-V_{th}$ with $\Delta V_{th}-1.5$ V to +1.5 V varies within approximately 10% of that with $\Delta V_{th}$ of 0.

In the pixel in FIG. 43A, when the threshold voltage $V_{th}$ of the driving transistor DrTr is positive, the $V_{th}$ can be compensated in a range of $V_{th}$ from 0 to a value positively shifted by a potential of $V_0$-(Cathode+$V_{thOLED}$), note that $V_{thOLED}$ denotes a threshold of the OLED, and when the threshold voltage of the driving transistor DrTr is negative, the $V_{th}$ can be compensated in a range from 0 to a value negatively shifted by a potential of Anode-$V_0$. When variation in the threshold voltage of the driving transistor DrTr is within the range of positive, the power source of a power supply line $V_0$ can be referred to as Anode, in which case one power supply line $V_0$ in the pixel can be removed.

As described in this example, according to the present invention, a display device for compensating the threshold voltage with display unevenness suppressed can be fabricated.

This application is based on Japanese Patent Application serial no. 2013-257337 filed with Japan Patent Office on Dec. 12, 2013, and Japanese Patent Application serial no. 2014-242835 filed with Japan Patent Office on Dec. 1, 2014, the entire contents of which are hereby incorporated by reference.

What is claimed is:

1. A light emitting device comprising a pixel, the pixel comprising:
   a first transistor;
   a second transistor:
   a third transistor;
   a fourth transistor;
   a fifth transistor;
   a sixth transistor;
   a first capacitor; and
   a light emitting element,
   wherein,
   one of a source and a drain of the first transistor is electrically connected to one of a source and a drain of the sixth transistor,
   the other of the source and the drain of the first transistor is electrically connected to a first wiring,
   a first gate of the first transistor is electrically connected to one of a source and a drain of the second transistor and to an electrode of the first capacitor,
   a second gate of the first transistor is electrically connected to one of a source and a drain of the fourth transistor,
   a gate of the second transistor is electrically connected a second wiring,
   one of a source and a drain of the third transistor is electrically connected to the first gate of the first transistor,
   a gate of the third transistor is electrically connected to a third wiring,
   one of a source and a drain of the fourth transistor is electrically connected to a fourth wiring,
   one of a source and a drain of the fifth transistor is electrically connected to the light emitting element,
   the other of the source and the drain of the fifth transistor is electrically connected to a fifth wiring,
   a gate of the sixth transistor is electrically connected to a sixth wiring,
   the second transistor comprises an oxide semiconductor film, the oxide semiconductor film comprising a channel formation region,
   the second wiring is different from the third wiring,
   the third wiring is different from the sixth wiring,
   the third wiring is configured to be supplied with a potential of a high level, and
   the sixth wiring is configured to be supplied with a potential of a low level.

2. The light emitting device according to claim 1,
   wherein the pixel further comprises a second capacitor,
   wherein an electrode of the second capacitor is electrically connected to the second gate of the first transistor, and
   wherein each of the first transistor, the third transistor, the fourth transistor, the fifth transistor and the sixth transistor comprises an oxide semiconductor film, the oxide semiconductor film comprising a channel formation region.

3. The light emitting device according to claim 1,
   wherein the second wiring, the third wiring and the six wiring are configured to be supplied with potentials, separately.

4. A light emitting device comprising a pixel, the pixel comprising:
   a first transistor;
   a second transistor:
   a third transistor;
   a fourth transistor;
   a fifth transistor;
   a sixth transistor;
   a first capacitor; and
   a light emitting element,
   wherein,
   one of a source and a drain of the first transistor is electrically connected to one of a source and a drain of the sixth transistor,
   the other of the source and the drain of the first transistor is electrically connected to a first wiring, a first gate of the first transistor is electrically connected to one of a source and a drain of the second transistor and to an electrode of the first capacitor, a second gate of the first transistor is electrically connected to one of a source and a drain of the fourth transistor, a gate of the second transistor is electrically connected a second wiring, one of a source and a drain of the third transistor is electrically connected to the first gate of the first transistor, a gate of the third transistor is electrically connected to a third wiring, one of a source and a drain of the fourth transistor is electrically connected to a fourth wiring, one of a source and a drain of the fifth transistor is electrically connected to the light emitting element, the other of the source and the drain of the fifth transistor is electrically connected to a fifth wiring, a gate of the sixth transistor is electrically connected to a sixth wiring, the second transistor comprises an oxide semiconductor film, the oxide semiconductor film comprising a channel formation region, a gate of the fourth transistor and a gate of the fifth transistor are electrically connected to different wirings, respectively, the third wiring is different from the sixth wiring, the third wiring is configured to be supplied with a potential of a high level, and the sixth wiring is configured to be supplied with a potential of a low level.

5. The light emitting device according to claim 4, wherein the pixel further comprises a second capacitor, wherein an electrode of the second capacitor is electrically connected to the second gate of the first transistor, and wherein each of the first transistor, the third transistor, the fourth transistor, the fifth transistor and the sixth transistor comprises an oxide semiconductor film, the oxide semiconductor film comprising a channel formation region.

6. The light emitting device according to claim 4, wherein the second wiring, the third wiring and the six wiring are configured to be supplied with potentials, separately.

7. A light emitting device comprising a pixel, the pixel comprising:

a first transistor;
a second transistor:
a third transistor;
a fourth transistor;
a fifth transistor;
a sixth transistor;
a first capacitor; and
a light emitting element, wherein, one of a source and a drain of the first transistor is electrically connected to one of a source and a drain of the sixth transistor, the other of the source and the drain of the first transistor is electrically connected to a first wiring, a first gate of the first transistor is electrically connected to one of a source and a drain of the second transistor and to an electrode of the first capacitor, a second gate of the first transistor is electrically connected to one of a source and a drain of the fourth transistor, a gate of the second transistor is electrically connected a second wiring, one of a source and a drain of the third transistor is electrically connected to the first gate of the first transistor, a gate of the third transistor is electrically connected to a third wiring, one of a source and a drain of the fourth transistor is electrically connected to a fourth wiring, one of a source and a drain of the fifth transistor is electrically connected to the light emitting element, the other of the source and the drain of the fifth transistor is electrically connected to a fifth wiring, a gate of the sixth transistor is electrically connected to a sixth wiring, the second transistor comprises an oxide semiconductor film, the oxide semiconductor film comprising a channel formation region, a gate of the fourth transistor and a gate of the fifth transistor are electrically connected to different wirings, respectively, the second wiring is different from the third wiring, the third wiring is different from the sixth wiring, the third wiring is configured to be supplied with a potential of a high level, and the sixth wiring is configured to be supplied with a potential of a low level.

8. The light emitting device according to claim 7, wherein the pixel further comprises a second capacitor, wherein an electrode of the second capacitor is electrically connected to the second gate of the first transistor, and wherein each of the first transistor, the third transistor, the fourth transistor, the fifth transistor and the sixth transistor comprises an oxide semiconductor film, the oxide semiconductor film comprising a channel formation region.

9. The light emitting device according to claim 7, wherein the second wiring, the third wiring and the six wiring are configured to be supplied with potentials, separately.

* * * * *